(12) United States Patent
Heydari et al.

(10) Patent No.: US 11,864,359 B2
(45) Date of Patent: Jan. 2, 2024

(54) INTELLIGENT THRESHOLD LEAK REMEDIATON OF DATACENTER COOLING SYSTEMS

(71) Applicant: Nvidia Corporation, Santa Clara, CA (US)

(72) Inventors: Ali Heydari, Albany, CA (US); Mike Sabotta, Cypress, TX (US); Harold Miyamura, San Jose, CA (US)

(73) Assignee: Nvidia Corporation, Santa Clara, CA (US)

( * ) Notice: Subject to any disclaimer, the term of this patent is extended or adjusted under 35 U.S.C. 154(b) by 174 days.

(21) Appl. No.: 17/005,017

(22) Filed: Aug. 27, 2020

(65) Prior Publication Data

US 2022/0071049 A1 Mar. 3, 2022

(51) Int. Cl.
*H05K 7/20* (2006.01)
(52) U.S. Cl.
CPC ....... *H05K 7/2079* (2013.01); *H05K 7/20281* (2013.01); *H05K 7/20836* (2013.01)
(58) Field of Classification Search
None
See application file for complete search history.

(56) References Cited

U.S. PATENT DOCUMENTS

| 9,140,373 | B2 | 9/2015 | Franz et al. |
| 10,638,645 | B1 | 4/2020 | Moen |
| 2012/0197828 | A1 | 8/2012 | Yi |
| 2013/0097128 | A1* | 4/2013 | Suzuki ................ G06F 16/2365 707/693 |
| 2013/0190899 | A1 | 7/2013 | Slessman |
| 2015/0048950 | A1 | 2/2015 | Zeighami |
| 2017/0181328 | A1 | 6/2017 | Shelnutt |
| 2017/0350303 | A1* | 12/2017 | Duan ........................ F01P 3/02 |
| 2019/0373776 | A1* | 12/2019 | Gao ................... H05K 7/20772 |
| 2020/0050178 | A1 | 2/2020 | Gao |
| 2021/0120705 | A1 | 4/2021 | Enright |
| 2021/0216852 | A1* | 7/2021 | Reece ................. G01M 3/2807 |
| 2022/0046828 | A1 | 2/2022 | Miyamura |

FOREIGN PATENT DOCUMENTS

| WO | 2019051077 A1 | 3/2019 |
| WO | 2020033316 A1 | 2/2020 |

OTHER PUBLICATIONS

Combined Search and Examination Report issued in GB Application No. GB2112259.3, dated May 5, 2022.
Businesswire: HPE Tackles AI Ops R&D to Improve Energy Efficiency, Sustainability and Resiliency in Data Centers, dated Nov. 21, 2019.

(Continued)

*Primary Examiner* — Nathan L Laughlin
(74) *Attorney, Agent, or Firm* — Lowenstein Sandler LLP

(57) ABSTRACT

A remediation system for threshold leaks in a datacenter liquid cooling system is disclosed. The system includes a fluid controller and a power controller that are adapted to receive input from a learning subsystem that can determine that a threshold leak has occurred even though a computing component is functioning normally, so that a change in power state to reduce reliance on the coolant and so that a change of flow of the coolant may be effected.

10 Claims, 41 Drawing Sheets

(56) References Cited

OTHER PUBLICATIONS

Bloomberg: HPE Tackles AI Ops R&D to Improve Energy Efficiency, Sustainability and Resiliency in Data Centers, dated Nov. 21, 2019.
Nasdaq: HPE Tackles AI Ops R&D to Improve Energy Efficiency, Sustainability and Resiliency in Data Centers, dated Nov. 21, 2019.
Hewlett Packard Enterprise: Agenda v 1.3, dated Nov. 2019.
Search Report for Application No. GB2112259.3, dated Feb. 22, 2023, 2 pages.
Examination Report for Application No. GB2112259.3, dated Feb. 23, 2023, 4 pages.

* cited by examiner

INTELLIGENT THRESHOLD LEAK REMEDIATON OF DATACENTER COOLING SYSTEMS

FIELD

At least one embodiment pertains to remediation systems for threshold leaks in datacenter cooling systems. In at least one embodiment, a fluid controller and a power controller are adapted to receive input from a learning subsystem that can determine the threshold leak has occurred even though a computing component is functioning normally, so that a change in power state to reduce reliance on the coolant and so that a change of flow of the coolant may be effected.

BACKGROUND

Datacenter cooling systems typically use fans to circulate air through server components. Certain supercomputers or other high capacity computers may use water or other cooling systems than air cooling systems to draw heat away from the server components or racks of the datacenter to an area external to the datacenter. The cooling systems may include a chiller within the datacenter area, including the area external to the datacenter. The area external to the datacenter may be an area including a cooling tower or other external heat exchanger that receives heated coolant from the datacenter and disperses the heat by forced air or other means to the environment (or an external cooling medium) before the cooled coolant is recirculated back into the datacenter. In an example, the chiller and the cooling tower together form a chilling facility with pumps responsive to temperature measured by external devices applied to the datacenter. Air cooling systems alone may not draw enough heat to support effective or efficient cooling in datacenters and liquid cooling systems are susceptible to issues of leakages that may result in shorting and damage to equipment, while addressing the demands of the datacenter.

BRIEF DESCRIPTION OF THE DRAWINGS

Various embodiments in accordance with the present disclosure will be described with reference to the drawings, in which.

DETAILED DESCRIPTION

Figure 1:
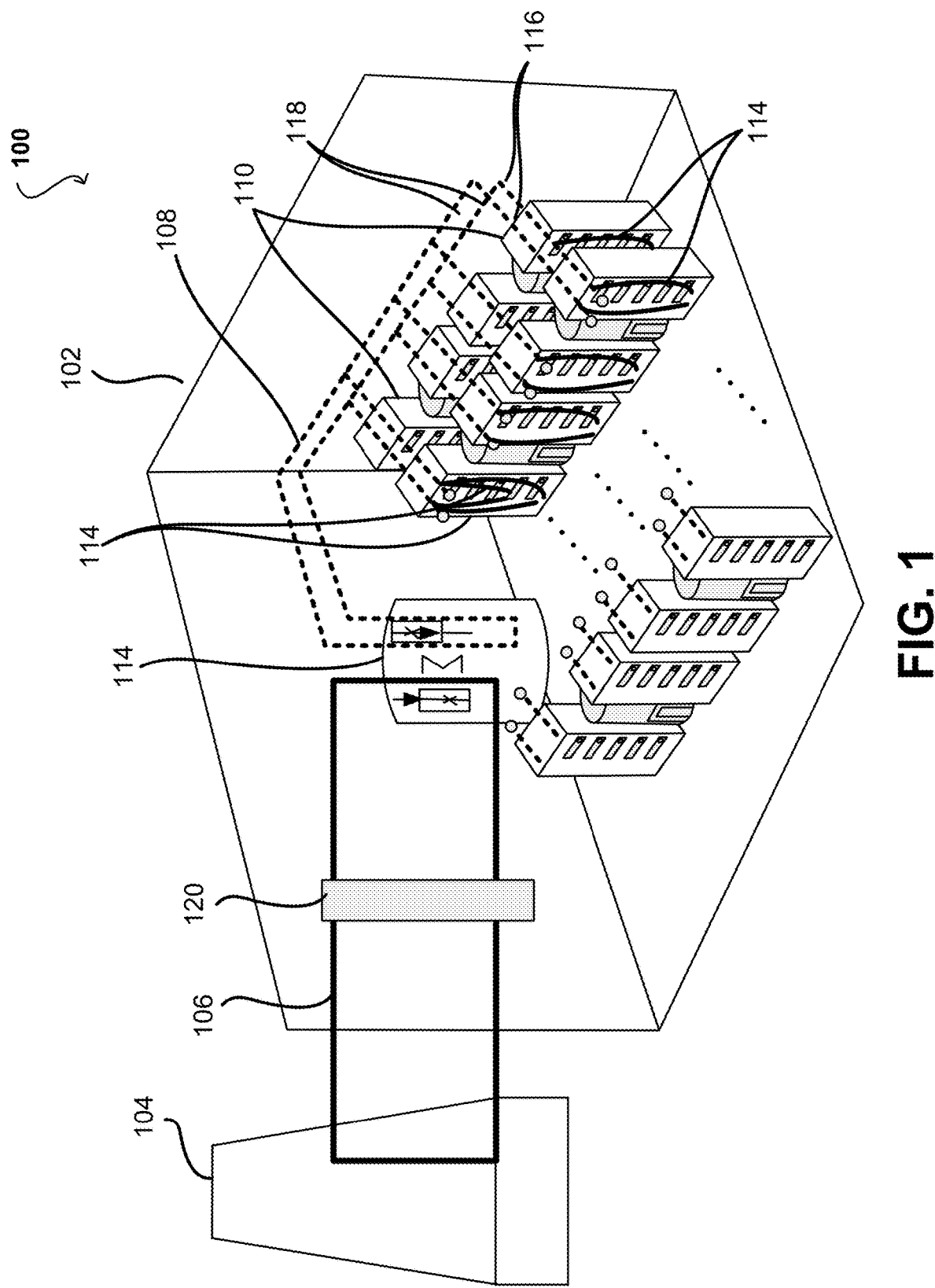
FIG. 1 is a block diagram of an example datacenter having a cooling system subject to improvements described in at least one embodiment.

Air cooling of high-density servers may not be efficient or may be ineffective in view of sudden high heat requirements caused by changing computing-loads in present day computing components. However, as the requirements are subject to change or tend to range from a minimum to a maximum of different cooling requirements, these requirements must be met in an economical manner, using an appropriate cooling system. For moderate to high cooling requirements, liquid cooling system may be used. The different cooling requirements also reflect different heat features of the datacenter. In at least one embodiment, heat generated from the components, servers, and racks are cumulatively referred to as a heat feature or a cooling requirement as the cooling requirement must address the heat feature entirely. In at least one embodiment, the heat feature or the cooling requirement for a cooling system is the heat generated or the cooling requirement of the components, servers, or racks associated with the cooling system and may be of a portion of components, servers, and racks in the datacenter.

In at least one embodiment, a remediation system for threshold leaks in a datacenter liquid cooling system is disclosed. The remediation system is adapted to intelligently detect potential liquid leakage, referred to herein as a threshold leak, in different liquid cooling components, such as a liquid cooled server rack. In at least one embodiment, the threshold leak is a potential leak where no physical leak has occurred. In at least one embodiment, the threshold leak is a limited leak which does not affect normal functioning of at least one computing device, which is also referred to herein as a datacenter device. In at least one embodiment, the normal function is when the at least one computing component is functioning within a normal temperature threshold and receiving coolant from the (or associated with the) datacenter liquid cooling system that is experiencing a threshold leak.

In at least one embodiment, the remediation system includes a rack-mounted power distribution unit (PDU) having with multiple wired or wireless sensors such as temperature, humidity, fluids flow rate, leak sensors and other relevant sensors with an artificial intelligence or machine learning (AI/ML)-based algorithm that is adapted to determine threshold leaks by at least predicting changes is parameters within a range that may be a moving range. The changes may not affect the normal functioning of the at least one computing device, but is informative of a larger leak that may occur and that can potentially damage the at least one computing device. The parameters may be associated with features or aspects of the datacenter liquid cooling system installed to cool multiple datacenter racks. In response to the informative feature of the threshold leak, the AI/ML-based algorithm informs a power controller to cause the at least one computing component to change power state to reduce reliance on the coolant, and informs a flow controller to cause change in a flow of the coolant to the at least one computing component.

In at least one embodiment, the remediation system includes a central or distributed control system that is integrated within or that is associated with a PDU of a single or of multiple racks in the datacenter. The PDU is augmented with one or more of the aforementioned sensors that impart in it an ability to monitor and measure various physical system characteristics or parameters associated with the datacenter liquid cooling system. The characteristics or parameters may include temperature of key components (such as tubing temperature, component temperatures, fluids flow rates, humidity, relative humidity, and one or more water leakage signals). In at least one embodiment, at least one parameter associated with the datacenter liquid cooling system is a cooling response with may be a proportionality parameter that associates a cooling requirement to a power drawn by a system or component being cooled. In at least one embodiment, the more the power drawn, the more is heat generated and the more is the cooling requirement.

In at least one embodiment, the effect of the present disclosure enables the use of one or more of at least the above-referenced parameters to predict a potential for a small or large-scale fluid leakage from a threshold leak that may occur anywhere in a fluid flow path of a liquid cooled component such as a server, a network component, a storage component, or a rack assembly. The disclosed AI/ML-based algorithm is adapted to be trained using one or more of at least the above-referenced parameters to enable an inference and subsequently, a quick response, to the threshold leak. In at least one embodiment, a quick response may be an appropriate signal sent from the PDU to at least one flow controller and at least one power controller for adjusting or closing a flow of coolant or other fluid of the datacenter liquid cooling system to an affected computing device (or other liquid cooling information technology (I.T. or IT) equipment), while simultaneously acting to abruptly or gracefully shut-down both, the computing device. In at least one embodiment, these actions minimize system damage, while preserving the status of the computational state of the IT servers and networking equipment. In at least one embodiment, the datacenter or computing devices may be graphical processing units (GPUs), central processing units (CPUs), and switches.

In at least one embodiment, the present disclosure enables a plug-and-play remediation system for leaks based in part on intelligently determining threshold leaks and preventing deterioration of a datacenter liquid cooling system. AI/ML aspects are provided via one or more processors as described throughout this disclosure. In at least one embodiment, remediation system for threshold leaks in a datacenter liquid cooling system includes a flow controller and a power controller within a power distribution unit (PDU). The flow controller and the power controller are adapted to receive inputs from a learning subsystem adapted to determine that at least one parameter associated with the datacenter liquid cooling system is outside a determined range so that a threshold leak of a coolant has occurred. The threshold leak s associated with at least one computing component functioning within a normal temperature threshold and receiving the coolant. The power controller causes the at least one computing component to change power state to reduce reliance on the coolant, while the flow controller causes change in a flow of the coolant to the at least one computing component. As such, in at least one embodiment, the present disclosure is a simple and ready-to-use system for securing expensive IT infrastructure against simple water damage caused from liquid within the datacenter liquid cooling system.

FIG. 1 is a block diagram of an example datacenter 100 having a cooling system subject to improvements described in at least one embodiment. The datacenter 100 may be one or more rooms 102 having racks 110 and auxiliary equipment to house one or more servers on one or more server trays. The datacenter 100 is supported by a cooling tower 104 located external to the datacenter 100. The cooling tower 104 dissipates heat from within the datacenter 100 by acting on a primary cooling loop 106. Further, a cooling distribution unit (CDU) 112 is used between the primary cooling loop 106 and a second or secondary cooling loop 108 to enable extraction of the heat from the second or secondary cooling loop 108 to the primary cooling loop 106. The secondary cooling loop 108 can access various plumbing all the way into the server tray as required, in an aspect. The loops 106, 108 are illustrated as line drawings, but a person of ordinary skill would recognize that one or more plumbing features may be used. In an instance, flexible polyvinyl chloride (PVC) pipes may be used along with associated plumbing to move the fluid along in each of the loops 106, 108. One or more coolant pumps, in at least one embodiment, may be used to maintain pressure differences within the loops 106, 108 to enable the movement of the coolant according to temperature sensors in various locations, including in the room, in one or more racks 110, and/or in server boxes or server trays within the racks 110.

In at least one embodiment, the coolant in the primary cooling loop 106 and in the secondary cooling loop 108 may be at least water and an additive, for instance, glycol or propylene glycol. In operation, each of the primary and the secondary cooling loops has their own coolant. In an aspect, the coolant in the secondary cooling loops may be proprietary to requirements of the components in the server tray or racks 110. The CDU 112 is capable of sophisticated control of the coolants, independently or concurrently, in the loops 106, 108. For instance, the CDU may be adapted to control the flow rate so that the coolant(s) is appropriately distributed to extract heat generated within the racks 110. Further, more flexible tubing 114 is provided from the secondary cooling loop 108 to enter each server tray and to provide coolant to the electrical and/or computing components. In the present disclosure, the electrical and/or computing components are used interchangeably to refer to the heat-generating components that benefit from the present datacenter cooling system. The tubing 118 that form part of the secondary cooling loop 108 may be referred to as room manifolds. Separately, the tubing 116 extending from tubing 118 may also be part of the secondary cooling loop 108 but may be referred to as row manifolds. The tubing 114 enters the racks as part of the secondary cooling loop 108 but may be referred to as rack cooling manifold. Further, the row manifolds 116 extend to all racks along a row in the datacenter 100. The plumbing of the secondary cooling loop 108, including the manifolds 118, 116, and 114 may be improved by at least one embodiment of the present disclosure. An optional chiller 120 may be provided in the primary cooling loop within datacenter 102 to support cooling before the cooling tower. To the extent additional loops exist in the primary control loop, a person of ordinary skill would recognize reading the present disclosure that the additional loops provide cooling external to the rack and external to the secondary cooling loop; and may be taken together with the primary cooling loop for this disclosure.

In at least one embodiment, in operation, heat generated within server trays of the racks 110 may be transferred to a coolant exiting the racks 110 via flexible tubing of the row manifold 114 of the second cooling loop 108. Pertinently, second coolant (in the secondary cooling loop 108) from the CDU 112, for cooling the racks 110, moves towards the racks 110. The second coolant from the CDU 112 passes from on one side of the room manifold having tubing 118, to one side of the rack 110 via row manifold 116, and through one side of the server tray via tubing 114. Spent second coolant (or exiting second coolant carrying the heat from the computing components) exits out of another side of the server tray (such as enter left side of the rack and exits right side of the rack for the server tray after looping through the server tray or through components on the server tray). The spent second coolant that exits the server tray or the rack 110 comes out of different side (such as exiting side) of tubing 114 and moves to a parallel, but also exiting side of the row manifold 116. From the row manifold 116, the spent second coolant moves in a parallel portion of the room manifold 118 going in the opposite direction than the incoming second coolant (which may also be the renewed second coolant), and towards the CDU 112.

In at least one embodiment, the spent second coolant exchanges its heat with a primary coolant in the primary cooling loop 106 via the CDU 112. The spent second coolant is renewed (such as relatively cooled when compared to the temperature at the spent second coolant stage) and ready to be cycled back to through the second cooling loop 108 to the computing components. Various flow and temperature control features in the CDU 112 enable control of the heat exchanged from the spent second coolant or the flow of the second coolant in and out of the CDU 112. CDU 112 is also able to control a flow of the primary coolant in primary cooling loop 106. As there are many flow lines or pipes and may ports, couplers, and adapters between the flow lines or pipes and other components, such as the CDU and cold plates, there are many opportunities for leaks that may lead to damage of the IT infrastructure.

Figure 2:
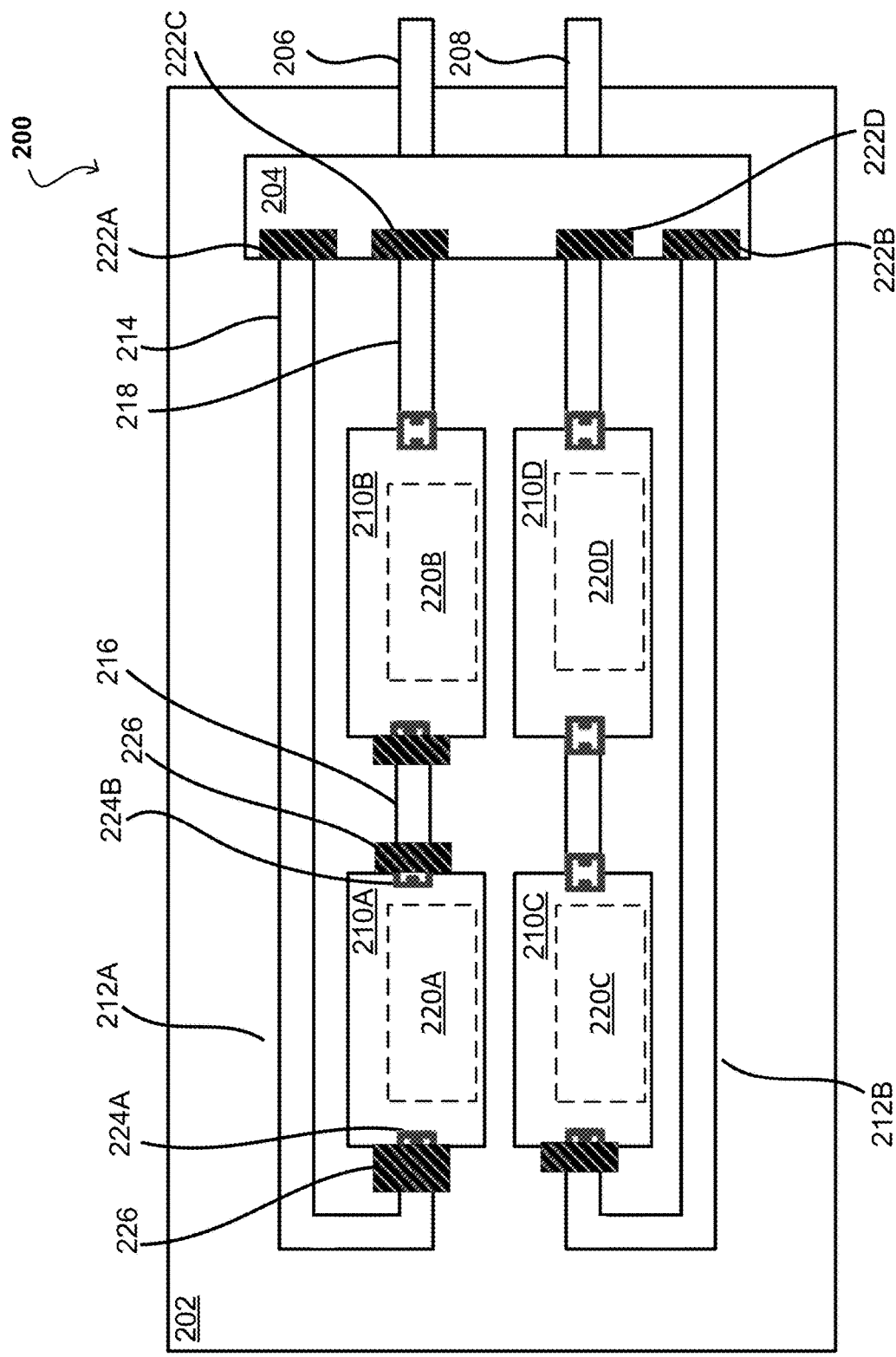
FIG. 2 is a block diagram illustrating server-level features of a remediation system for threshold leaks in a datacenter liquid cooling system, according to at least one embodiment.

FIG. 2 is a block diagram illustrating server-level features 200 of a remediation system for threshold leaks in a datacenter liquid cooling system, according to at least one embodiment. In at least one embodiment, the remediation system is partly or fully within a server box or server tray 202. In at least one embodiment, the remediation system is adapted to determine and address threshold leaks in the datacenter liquid cooling system. The server box or server tray 202 may include a coolant distribution unit (CDU) 204 with associated flow loops 212A, 212B. Each flow loop 212A, 212B has an inlet flow line 214 and an outlet flow line 218. One or more intermediate flow lines 216 enable serial cooling of one or more cooling plates or cold plates 210A, 210B. Similar features described with respect to loop 212A is available for loop 212B, including providing cooling to one or more cold plates 210C, 210D. As such, at least one cooling component 220A, B, C, D, associated with one or more of cold plates 210A-D, may be subject to cooling by the datacenter liquid cooling system.

In at least one embodiment, a flow controller 222A; 222B; 226 is provided for controlling flow at different levels of the datacenter. In at least one embodiment, the one or more flow controllers 222A, 222B may be provided partly or fully within a PDU 204 for controlling coolant or fluid flow from outside the server box or tray 202 to within the server box or tray 202. In at least one embodiment, the one or more flow controllers 222A, 222B may be provided within a PDU 204 for controlling coolant or fluid flow from a rack hosting the server box or tray 202 to the cold plates 210A-D within the server box or tray 202. In at least one embodiment, the cold plates 210A-D may be independently associated with a flow controller, such as the flow controller 226 provided at a fluid port 224A associated with cold plate 210A. Fluid ports 224A-D couple the inlet and the outlet (or intermediate) flow lines to and from the cold plates.

In at least one embodiment, the at least one flow controller 222A; B may be a miniature pump or valves that may be controlled remotely to provide the control or the modulation of the flow of coolant, as described throughout this disclosure. In at least one embodiment, the at least one flow controller 222A; B may be located at the input (or inlet, such as flow controllers 222A, 222B) or the output (or outlet, such as a flow controllers 222C, 222D) of piping or the flow lines. In at least one embodiment, when located at an outlet of the piping or flow line, the action allowed by the at least one flow controller 222C; D is an action of egress of coolant either by a sucking or pulling action asserted on the coolant by the miniature pump, or an open outflow of the coolant using a valve. In at least one embodiment, when located at an inlet of the one or more loop 212A, 212B, the action allowed by the at least one flow controller 222A; B is an action of inflow of coolant either by a pumping action asserted on the coolant the miniature pump, or an open inflow of the coolant using a valve.

In at least one embodiment, the miniature pump or valve includes a wired and wireless control sub-assembly located with the PDU. In at least one embodiment, the pump or valve control is within the PDU while the pump and valve may be within the CDU 204. In at least one embodiment, the pump or valve is only functional from the PDU. In at least one embodiment, reference to a flow controller is therefore to a feature that can cause a change of a flow of the coolant to the at least one computing component. In at least one embodiment, the one or more flow controllers 222A, B is partly within the CDU 204 and partly within a PDU of the rack hosting the server tray or box 202.

In at least one embodiment, the wired and wireless control sub-assembly is an electronic controller part of the flow controller. The electronic controller of the flow controller may be a pump speed controller with a shut-off configuration. The pump speed controller may be adjusted in fuzzy (non-binary) manner, via inputs in a flow regulation circuit, to achieve different and desired flow rates (including complete shutoff of a flow) from the pump, as required by a learning subsystem, in at least one embodiment, based in part on a determined threshold leak. In at least one embodiment, the wired and wireless control sub-assembly is a valve controller with a shut-off configuration, forming the electronic controller part of the flow controller. The valve controller may be adjusted in fuzzy manner to achieve different and desired flow rates (including complete shutoff of a flow) through the valve, as required by a learning subsystem, in at least one embodiment, based in part on the determined threshold leak. In at least one embodiment, the pump or the valve form the mechanical controller part of the flow controller. In at least one embodiment, the flow controller is only the features within the PDU that controls the pump or the valve because the pump or valve within the CDU is unable to act without the action of the flow controller of the PDU.

Figure 3:
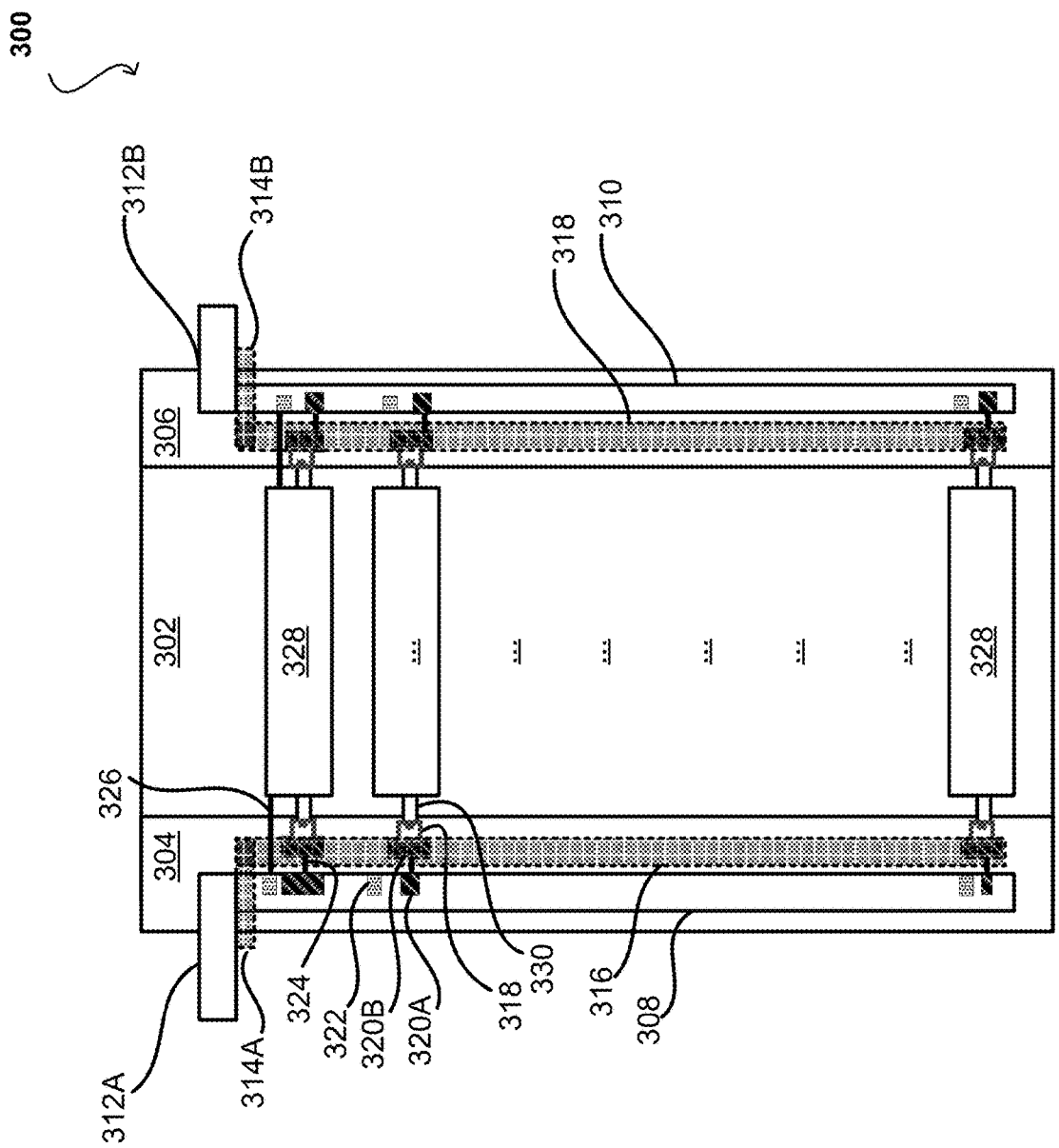
FIG. 3 is a block diagram illustrating rack-level features of a remediation system for threshold leaks in a datacenter liquid cooling system, according to at least one embodiment.

FIG. 3 is a block diagram illustrating rack-level features 300 of a remediation system for threshold leaks in a datacenter liquid cooling system, according to at least one embodiment In at least one embodiment. The rack-level features 300 include one or more brackets 304, 306, to which is associated one or more PDUs 308, 310, having one or more inlet conduits 312A, B. The one or more brackets 304, 306 also support one or more CDUs 316, 318, having one or more inlet pipes or flow lines 314A, B. A flow controller having one or more parts 320A, B is positioned fully or partly in a respective one of the one or more PDUs 308, 310. In at least one embodiment, the electronic controller part (such as at least one processor) is in the PDU, while the mechanical controller part (pump or valve) is in the CDU. In at least one embodiment, the location of the parts of the flow controller is dependent on whether the flow controller is in an egress side, entry side, or on both sides of the server tray or box 328. In at least one embodiment, while the electronic and the mechanical controller parts are coupled via link 324, the electronic controller part 320A may be coupled via multiple such links to multiple mechanical controller parts 320B, which enables a single electronic controller part to concurrently or separately control multiple mechanical controller parts for different server boxes or trays 328.

In at least one embodiment, the link is a high-speed communication or electronics link that, while illustrated as a physical coupling may be a wireless coupling between the electronic controller part and the mechanical controller part. There may be a distributed control system between the electronic controller part and the mechanical controller part. In at least one embodiment, the electronic controller part performs substantive operations to control the mechanical controller part that may be designed with limited circuitry or processing capability. In at least one embodiment, the electronic controller part may be a circuit board having at least one processor and having self-contained or shared portion of an AI/ML algorithm for determining threshold leaks and for acting on the determination of the threshold leaks. In at least one embodiment, the acting feature of the electronic controller part may be caused to change a flow of the coolant to an associated at least one computing component via the mechanical controller part acting on the coolant through port 318 of the rack-level features 300.

In at least one embodiment, one or more power controllers 322 is provided within the PDU 308, 310 that also hosts the electronic controller part 320A of the flow controller. In at least one embodiment, reference to a flow controller may be made by reference to the electronic controller part 320A alone. This enables the PDU 308; 310 to house components to cause both the power to be controller and to cause the flow of coolant to be controlled. The electronic controller part 320A is associated with one or more mechanical controller parts in a rack hosting the server tray or box 328. In at least one embodiment, the one or more power controllers 322 includes at least one processor and is self-sufficient or is part of a distributed control system, along with or independent of the at least one processor of the electronic controller part 320A. In at least one embodiment, the one or more power controllers 322 can communicate directly with at least one computing device in the server tray or box 328 via a separate link 326 that is a high-speed communication or electronics link. In the manner of link 324, the link 326 may be a physical coupling or may be a wireless coupling between the one or more power controllers 322 and the at least one computing device.

In at least one embodiment, the server tray or box 328 receives power and communications via cables of the one or more PDUs 308, 310. The power from the PDUs may be used to power the mechanical controller part of the flow controllers as well as to power the computing devices within the server trays or boxes of the rack. As such, the one or more power controllers 322, being within the one or more PDUs 308, 310, can control power to the at least one computing device by a signal to a power source or transmitter within the PDUs 308, 310. At the same time the one or more power controllers 322 also provide the power to the one or more flow controllers, such as to both, the electronic controller part as well the mechanical controller part. The one or more power controllers 322 can ensure that power continues to the flow controller to enable change of flow of the coolant prior to shutting down the flow controller and then shutting down the computing device(s) and finally, shutting down itself. In at least one embodiment, the shutting down of the one or more power controllers proceeds in a sequence to cause shut down of the flow of coolant, to shut down the computing devices, and then to shut itself down. As such, in at least one embodiment incorporating such a sequence, the flow controllers may be controlled, indirectly, by the power controllers. In at least one embodiment, the link 326 may be from the one or more power controllers 322 to the power source or transmitter within the one or more PDUs 308, 310 and is not visible outside the PDU.

In at least one embodiment, the flow controller and the power controller, being within the PDU, is adapted to receive inputs from a learning subsystem. In at least one embodiment, the electronic controller part 320A and the one or more power controllers 322 are part of a distributed control system that is able to perform part or whole of an AI/ML algorithm of the learning subsystem for remediating leaks based in part on threshold leaks in a datacenter cooling system. As such, however, the learning subsystem includes at least one processor, even if the at least one processor is a shared processor. In at least one embodiment, the electronic controller part of the flow controller, the one or more controllers, and the learning subsystems are distinguished modules of the remediation system because of at least distinguished operations performed by each of the modules.

In at least one embodiment, the learning subsystem is adapted to determine that at least one parameter associated with the datacenter liquid cooling system is outside a determined range so that a threshold leak of a coolant has occurred. In at least one embodiment, the threshold leak is associated with the at least one computing component of the respective server tray or box 328 functioning within a normal temperature threshold and receiving the coolant from the inlet line 330. The power controller 322, based at least in part on input from the learning subsystem, causes the at least one computing component of the respective server tray or box to change power state to reduce reliance on the coolant. Separately, the electronic controller part 320A of the flow controller, along with the mechanical controller part 320B, based at least on part on another input (or the same input) from the learning subsystem, is caused to change a flow of the coolant to the at least one computing component.

In at least one embodiment, the threshold leak is indicative of a first amount of the coolant improperly exiting the datacenter liquid cooling system while the at least one computing component is functioning within the normal temperature threshold and receiving the coolant. In other words, there is at least one parameter that is abnormal, but most of the remaining parameters monitored by the learning subsystem may be normal. Pertinently, however, the at least one computing device does not display signs of being restricted on cooling and functioning. In at least one embodiment, the threshold leak occurs before a normal leak occurs, where the normal leak is distinct from the threshold leak because of at least an indication of a second amount of the coolant, beyond the first amount, that is improperly exiting the datacenter liquid cooling system. In such a conditioning, the leak is also related to the at least one computing component being unable to function within the normal temperature threshold and being unable to receive the coolant to maintain the normal temperature threshold.

Figure 4:
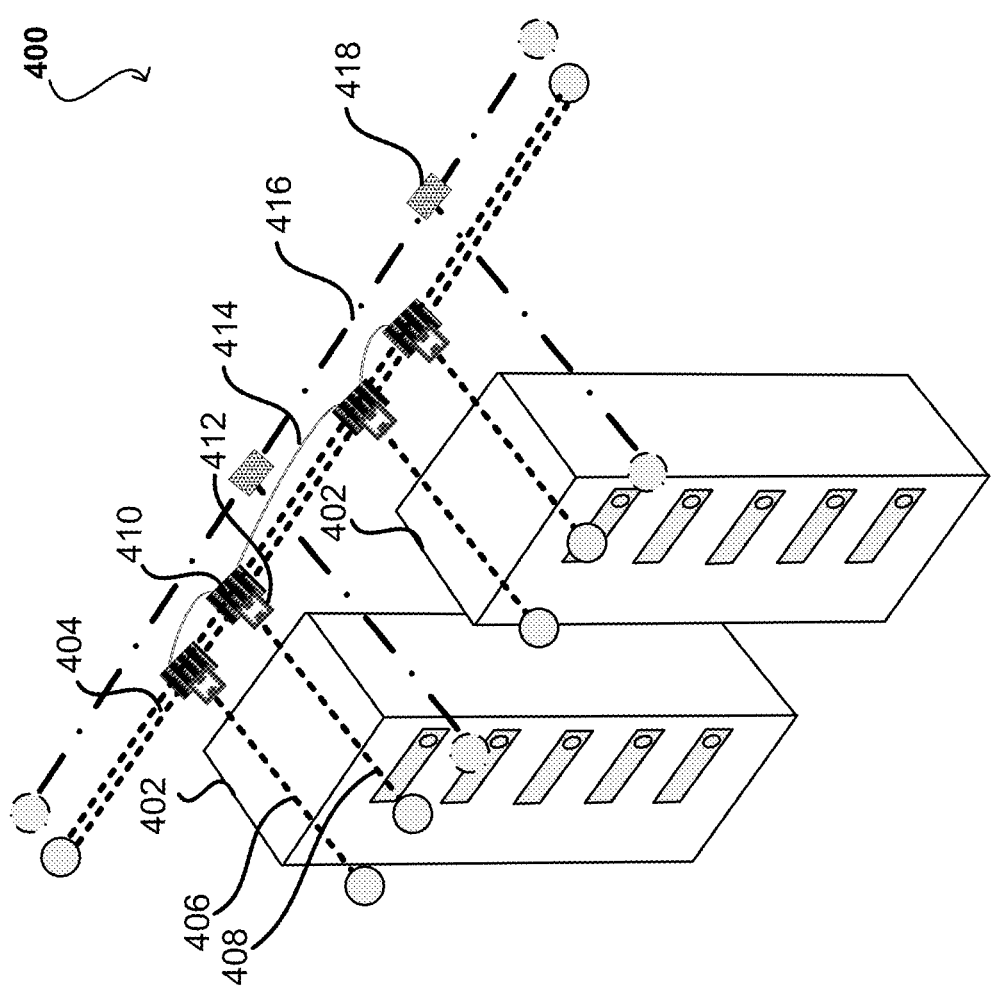
FIG. 4 is a block diagram illustrating datacenter-level features of a remediation system for threshold leaks in a datacenter liquid cooling system, according to at least one embodiment.

FIG. 4 is a block diagram illustrating datacenter-level features 400 of a remediation system for threshold leaks in a datacenter liquid cooling system, according to at least one embodiment. In at least one embodiment, multiple racks 402 are fitted with features described in FIGS. 2 and 3. In at least one embodiment, row manifolds 404 have ports coupling to the rack manifolds 406, 408. In at least one embodiment, each of the manifolds 404-408 is separately designated for inlet cooling fluid and for outlet cooling liquid. In the manifolds 404-408, a set of manifolds perform functions as one or more row manifolds that are coupled to a second set of manifolds performing functions of one or more rack manifolds.

In at least one embodiment, for a remediation system to support datacenter-level features 400, one or more flow controllers 410 have their electronic controller part within a PDU of a respective rack 402, but enable mechanical controller parts associated with the row manifold. The flow controllers 410 act at points of susceptibility, like at ports 412 that are between the row and the rack manifolds. In effect, the one or more flow controllers 410 can address, using control provided form within the PDU of a rack, a threshold leak at the row manifold level. In at least one embodiment, the one or more flow controllers 410 may include the electronic and the mechanical controller parts within a single package and may be part of a distributed control system via links 414. In at least one embodiment, the distributed control system is enabled by at least one processor inside the single package of each of the flow controllers, such as flow controller 410; and by at least one processor inside one or more of the power controllers 418. The at least one processor of the distributed control system is associated with the learning subsystem to control the flow controller 410 and the power controller 418 using the inputs to each controller. In at least one embodiment, a first input of the inputs is to cause shutdown of the at least one computing component and a second input of the inputs is to cause shutoff of the coolant.

In at least one embodiment, the remediation system can use at least one processor of a computing device within a server-box to enable the remediation system. In at least one embodiment, the at least one processor may be processor 1400 in FIG. 14 and may use the neurons 1502 and components thereof implemented using circuitry or logic, including one or more arithmetic logic units (ALUs) as described in FIG. 15 to enable the AI/ML algorithm described throughout this disclosure.

In at least one embodiment, the remediation system can rely on the at least one processor to enable a load transfer subsystem that transfers load associated with at least one computing component, subject to a threshold leak, prior to the shutdown of the at least one computing component. The load may be transferred to at least one second computing component receiving the coolant or a second coolant that is unaffected by the threshold leak, in at least one embodiment. The remediation system can transfer load from a server box of computing components of one rack 402 to a different rack 402, or to a different server box of the same rack.

In at least one embodiment, the remediation system has the at least one processor that is associated with the learning subsystem to enable the learning subsystem to determine that the threshold leak of the coolant has occurred by determining that the a pressure, a flow rate, or a temperature of the coolant to or from the at least one computing component is outside a normal threshold of the determined range. In at least one embodiment, a coolant may be associated with different pressures, flow rates, or temperatures. In at least one embodiment, these different pressures, flow rates, or temperatures may be defined for effective operation of the coolant by a manufacturer. Ranges may be drawn from previously designated ranges for the effective operation of the coolant. A range may be defined as 10% to 2% tolerance to the lower side of the maximum specified pressure, temperature or flow rate for the effective operation. The range is a pre-alarm range. A smaller tolerance, such as a below 2% from the pre-alarm range may be drawn from the ranges for the effective operation. The two percentage points of tolerance (2% and below of the ranges for the effective operation) is defined by at least an alarm threshold (such as at the 1% mark of the maximum point of the ranges of the effective operation) at which the at least one computing component is no longer able to function within the normal temperature threshold and is no longer receiving the coolant to maintain the normal temperature threshold. In effect, the coolant is no long in effective operation as a coolant at the alarm threshold.

In at least one embodiment, the present disclosure at least enables the remediation system to work on different tolerances than specified by the manufacturer. In at least one embodiment, the pre-alarm range is a moving range. In at least one embodiment, as the coolant may be designated to change its flow rate to achieve different levels of cooling, there may be a wide range of operation for the coolant, but the wide range of operation may not track with a range of operation of at least one computing device. The present disclosure can tie in the effective operation parameters for the coolant (extrapolated to the datacenter liquid cooling system) to the functioning of at least one computing device (which may be also extrapolated to an enter server tray or a rack or more). In at least one embodiment, if a coolant is designated for reducing 250 KW of generated heat, the pre-alarm range may be from 225 KW to 245 KW of generated heat of the at least one computing device receiving the coolant. The alarm threshold may be from 245 KW to 250 KW. In at least one embodiment, the at least one computing component may be functional between 225 KW and 240 KW of generated heat. As such, the moving range is a range identified by the learning subsystem to ignore a range of 225 KW to 245 KW in favor of a range of 225 KW to 240 KW for at least one computing component, and is able to act on this range to cause the at least one computing component to change power state to reduce reliance on the coolant and to cause a change a flow of the coolant to the at least one computing component, via a respective flow controller and power controller.

In at least one embodiment, therefore, the remediation system works with the computing devices of the datacenter and with the coolant(s) used to determine best actions to prevent damage to the computing devices. Even if the coolant is designated for higher cooling capabilities, but is unable to achieve this to resolve high generated heat of at least one computing component (as a result of an undetected leak, which may show as a parameter variation, but not as a physical leak, in at least one embodiment), the remediation system is able to react before the at least one computing device is damaged or before a physical leak occurs. In at least one embodiment, however, the threshold leak is a physical leak out of a coolant pipe or coupling (such as a fluid adapter) that is not detectable by leak detectors but is also a leak that does not affect the normal functioning of the at least one computing component. In at least one embodiment, the normal functioning is in reference to heat generated by the at least one computing component being within normal operational thresholds for the at least one computing component and that will not cause any damage to the at least one computing component. In at least one embodiment, the threshold leak may be a result of an inadvertently diverted coolant flow to a computing component not requiring additional coolant, and which may have caused a reduced coolant flow rate or pressure at a different computing component requiring additional coolant.

In at one embodiment, the remediation system includes a distributed control system having one or more of a primary flow controller, a primary power controller, and at least a first part of the learning subsystem within a first PDU; and having one or more of secondary flow controllers, secondary power controllers, and second parts of the learning subsystem located in secondary PDUs. As such, one or more processors located in distinct locations of the datacenter can contribute intelligence to the learning subsystem to make it robust.

In at least one embodiment, the distributed control system communicates the inputs from the learning subsystem with the one or more of the secondary flow controllers and the secondary power controllers. The secondary flow controllers and the secondary power controllers may be associated with a different server tray or box than the primary flow controller and the primary power controller, or may be associated with a different rack entirely than the rack hosting the primary flow controller and the primary power controller. In at least one embodiment, this feature at least enables the one or more of the secondary flow controllers and the secondary power controllers to cause at least one secondary computing component to change a second power state to reduce reliance on the coolant and to cause the change of the flow of the coolant to the at least one secondary computing component. As such, the at least one computing component directly associated with the primary flow controller and the primary power controller is not affected but processing capabilities in these controllers is used to effect changes in power and coolant for at least one secondary computing component in a different server tray or box, or a different rack entirely.

In at least one embodiment, the learning subsystem includes processors associated with one or more of the flow controllers of the PDU, the power controller of the PDU, secondary flow controllers of secondary PDUs, and secondary power controllers of the secondary PDUs. Such a configuration illustrates the distributed nature of the control system, in at least one embodiment. In at least one embodiment, the learning subsystem is associated with at least one processor to evaluate the at least one parameter associated with the datacenter liquid cooling system using the aforementioned moving range that includes the pre-alarm range (referred to as the determined range). The moving range represents parameter values for the at least one parameter, such as a parameter for capability to address heat generated by at least one computing component. The parameter values are within a threshold value (such as 8% to 10% of a manufacturer's maximum rating of heat generated ability to cool by a coolant) for the at least one parameter.

In at least one embodiment, the learning subsystem is trained to recognize that the flow rate of the coolant and the pressure of the coolant is so that a higher cooling must be achieved than indicated by the measured pre-alarm values. At the parameter values within the pre-alarm range, the at least one computing component is still functioning within a normal temperature threshold and is still receiving the coolant, but there is an indication that coolant is being ineffective. The normal temperature threshold may be referred to as a functional parameter that is tied to the at least one computing device. The indication of ineffectiveness using the pre-alarm threshold is even so when it is not otherwise recognized using only the functional parameter of the at least one computing device, which is indicated as normal. In at least one embodiment, this is symbolic of a threshold leak occurring for the coolant.

In at least one embodiment, the remediation system for threshold leaks in a datacenter liquid cooling system enables display and intervention associated with the threshold leaks. In at least one embodiment, an intervention system receives inputs from a learning subsystem adapted to determine that at least one parameter associated with the datacenter liquid cooling system is outside a determined range so that the threshold leak of a coolant has occurred. The intervention system provides a pre-alarm indication to enable intervention to address the threshold leak associated with at least one computing component functioning within a normal temperature threshold and receiving the coolant. In at least one embodiment, the intervention system enables feedback to the learning subsystem if the at least one parameter is determined as a false alarm. The intervention system may be used to enable power controller to continue its operations and to cause the flow controller to continue its operations.

In at least one embodiment, the learning subsystem may compare the flow rate, the pressure, and the cooling achieved for previous heat generated by the at least one computing component with the present heat generated for the same flow rate and the same pressure. When the learning subsystem determines that the cooling is not as previously achieved, everything else being similar or within a reasonable range from prior measures (including power drawn, indicative of no change in workload; or tube temperature, indicative of similar cooling achieved within the tubes having the coolant, but not that the cold plate), then the learning subsystem is able to initiate a power reduction or shutdown and able to initiate a coolant shutdown. The shutdowns may be prior to transferring processing load of the computing device at issue to a different computing device unaffected by the issues experienced by the computing device being shut down.

In at least one embodiment, the learning subsystem provides a first input of the inputs to the power controller to cause the at least one computing component to change the power state to reduce reliance on the coolant and provides a second input of the inputs to the flow controller to change the flow of the coolant to the at least one computing component. In at least one embodiment, the at least one parameter includes one or more of: a temperature of the coolant; a temperature of the at least one computing component or a first area having the at least one computing component; a temperature of tubing carrying the coolant; a humidity or relative humidity of the first area or of a second area that comprises the flow controller; a flow rate of the coolant to the first area; a flow rate of the coolant from the first area; a proportional cooling response to power drawn by the at least one computing component; and a fluid leak rate of the coolant. In at least one embodiment, when the learning subsystem tracks pressure of the coolant caused to address a cooling requirement or to achieve a level of cooling as rated by its cooling capability, the learning subsystem is able to indicate that there may be a fluid leak if the pressure is unable to rise to address the same cooling requirement or achieve the same level of cooling. Over time, a lack of pressure may be translated to a fluid leak rate over the time period that this issue is monitored.

In at least one embodiment, the learning subsystem executes a machine learning model. The machine learning model enables processing of parameter values associated with the at least one parameter using multiple neuron levels of the machine learning model. The machine learning model has the parameter values and has prior associated flow rates for the coolant and prior associated power states for the at least one computing component. The machine learning model provides the inputs to the flow controller and the power controller after an evaluation of the parameter values with the prior associated flow rates for the coolant and the prior associated power states.

In at least one embodiment, the PDU or a datacenter management system (DMS) includes the learning subsystem having at least one processor to perform the machine learning model. In at least one embodiment, coolant volume or the flow rate of coolant provided to initiate cooling or to cause the temperatures to be resolved or changed may be made with reference to the intended cooling for at least one input temperature. In at least one embodiment, the learning subsystem may be implemented via the deep learning application processor, such as processor 1400 in FIG. 14 and may use the neurons 1502 and components thereof implemented using circuitry or logic, including one or more arithmetic logic units (ALUs) as described in FIG. 15.

In at least one embodiment, at least one processor may be used for the remediation system. In at least one embodiment, the at least one processor may be implemented using the deep learning application processor, such as processor 1400 in FIG. 14 and may use the neurons 1502 and components thereof implemented using circuitry or logic, including one or more arithmetic logic units (ALUs) as described in FIG. 15. In at least one embodiment, the at least one processor therefore has at least one logic unit to control at least one flow controller and at least one power controller.

In at least one embodiment, the present disclosure is to at least one processor for remediation of threshold leaks in a liquid cooling system, which may be implemented in existing datacenter liquid cooling systems by minor physical modifications. In at least one embodiment, the at least one processor includes at least one logic unit to control a flow controller and a power controller within a power distribution unit (PDU), as discussed with reference to FIGS. 2-4. The flow controller and the power controller receive inputs from a learning subsystem adapted to determine that at least one parameter associated with the liquid cooling system is outside a normal threshold of a determined range so that a threshold leak of a coolant has occurred.

In at least one embodiment, the threshold leak is associated with at least one computing component functioning within a normal temperature threshold and receiving the coolant. In at least one embodiment, as noted in the aforementioned features, the functional parameter of the at least one computing component may not be indicative of a problem brewing with the at least one liquid cooling system. The indication of a threshold leak is based at least in part on pre-alarm thresholds that may be a moving range. The moving range includes values as learnt by a learning subsystem for flow rates, flow volumes, and power states. The flow rates, flow volumes, temperatures, humidity, and power states may have wide tolerances depending on the operational aspects in the datacenter. As such, what may be considered as a threshold leak because of a change in a temperature (such as an increase) that is not being addressed by an expected increased flow rate of coolant to an affected computing device may not be indicative of a threshold leak. This is because there may be other coolant lines to other computing devices that load the same coolant source. The moving range accounts for these variations in expected flow rates or pressure not being representative of a threshold leak.

In at least one embodiment, the moving range is enabled by correlating the temperature changes across multiple computing devices that are associated with the same coolant lines and at least flow rates, flow pressures, flow volumes of the coolant. The moving range is improved as additional computing devices are loaded so that they perform at their highest allowable performance and require the maximum cooling available. In at least one example, a support vector machine (SVM) may be used to fit different datasets within margins and the fitted data may be used to train a neural network to track parameters according to their moving ranges. In at least one example, the moving ranges, which not being fixed, also inherently include a proportionality that may be betrayed by at least one parameter representing a threshold leak situation.

In at least one embodiment, using the expected increase in flow rate from the above-referenced change in a temperature (such as an increase) that is not being addressed by the expected increased flow rate of coolant to an affected computing device, an SVM-supported machine learning model or one or more neural networks is able to correlate the temperature changes to different flow rates of coolant that can address the temperature changes. Even if coolant is diverted in a different branch of a cooling loop, the learning subsystem is able to account for a variance (by using at least margins of an SVM, in at least one embodiment) prior to raising an indication of a threshold leak if the associated computing device is otherwise functioning within a normal temperature threshold and receiving the coolant. In at least one embodiment, each parameter including its margins represent a moving range for the parameter. In at least one embodiment, the other parameters described throughout this disclosure may be fitted or correlated with margins in a similar manner to enable different parameters to having moving ranges.

In at least one embodiment, the at least one logic unit associated with the learning subsystem enables a load transfer subsystem to transfer load associated with the at least one computing component prior to the shutdown of the at least one computing component. The load is transferred to at least one second computing component receiving the coolant or receiving a second coolant that is unaffected by the threshold leak. In at least one embodiment, the at least one logic unit is associated with the learning subsystem to determine that the threshold leak of the coolant has occurred by determining that the a pressure, a flow rate, or a temperature of the coolant to or from the at least one computing component is outside the normal threshold of the determined range. Instead, the values for these parameters may be within a pre-alarm range. The pre-alarm range is a range that is well within an alarm threshold, and is therefore, defined by at least the alarm threshold at which the at least one computing component is no longer functioning within the normal temperature threshold and is no longer receiving the coolant to maintain the normal temperature threshold.

In at least one embodiment, the at least one processor is adapted to include an instruction output to communicate the inputs to the flow controller and to the power controller form the learning subsystem. In at least one embodiment, the at least one logic unit of the at least one processor is adapted to receive a parameter value from a parameter sensor associated with the datacenter liquid cooling system. The at least one logic unit is further adapted to receive function information from a function sensor of the at least one computing device. The functional information is also referred to throughout this disclosure as a functional parameter. The at least one logic unit is adapted to facilitate the change of the power state and the change of the flow of the coolant.

In at least one embodiment, the present disclosure is to at least one processor for a liquid cooling system that is used for training or that can be trained. The at least one processor has at least one logic unit to train one or more neural networks having hidden layers of neurons to evaluate parameter values associated with the at least one parameter of the liquid cooling system. In at least one embodiment, the at least one logic unit must have these parameter values loaded under a training scheme to be able to evaluate them. In at least one embodiment, the one or more neural networks perform the evaluation using the parameter valves and using prior associated flow rates for a coolant and prior associated power states for at least one computing component. In at least one embodiment, the evaluation is to determine a moving range for the at least one parameter that is outside a normal threshold and that is indicative of a threshold leak of the coolant has occurred.

In at least one embodiment, as described throughout in this disclosure, the threshold leak is associated with the at least one computing component functioning within a normal temperature threshold and receiving the coolant. In at least one embodiment, the one or more neural networks to provide outputs associated with a first change in a power state for the at least one computing component to reduce reliance on the coolant and associated with a second change to a flow of the coolant to the at least one computing component.

In at least one embodiment, the at least one processor capable of the training described above has a learning subsystem within at least one logic unit for executing a machine learning model. The machine learning model can process parameter values associated with the at least one parameter using the prior associated flow rates for the coolant and the prior associated power states for the at least one computing component. The machine learning model can provide the inputs after an evaluation of the parameter values with the prior associated flow rates for the coolant and the prior associated power states. The inputs are to the flow controller and the power controller associated with the learning subsystem.

In at least one embodiment, the at least one processor also include the at least one logic unit to output at least one instruction associated with the first change and the second change of the power state and of the flow of the coolant, respectively. In at least one embodiment, the at least one processor also includes an instruction output to communicate the outputs from a learning subsystem executing the one or more neural networks to cause the first change in the power state for the at least one computing component and to cause the second change to the flow of the coolant to the at least one computing component.

In at least one embodiment, the at least one processor includes the at least one logic unit adapted to receive a parameter value from a parameter sensor associated with the datacenter liquid cooling system. The at least one logic unit is also adapted to receive function information from a function sensor of the at least one computing device. This information may be that the computing device is functioning within normal temperature values of its core(s) or is outside the normal temperature values of the core(s). When the parameter values is inconsistent and the computing device is functioning normally, there may still be an undetected issue, and the learning subsystem of the present disclosure is adapted to facilitate the first change and the second change to the power state and the flow of the coolant, respectively.

At least one embodiment of the present disclosure is to a remediation system for threshold leaks in a liquid cooling system having the at least one processor adapted to be trained and to provide inputs for outputs associated with a first change in a power state for the at least one computing component to reduce reliance on the coolant and associated with a second change to a flow of the coolant to the at least one computing component. In at least one embodiment, the remediation system uses the at least one processor for a learning subsystem that executes a machine learning model as described with respect with the descriptions in FIGS. 2-4.

Figure 5:
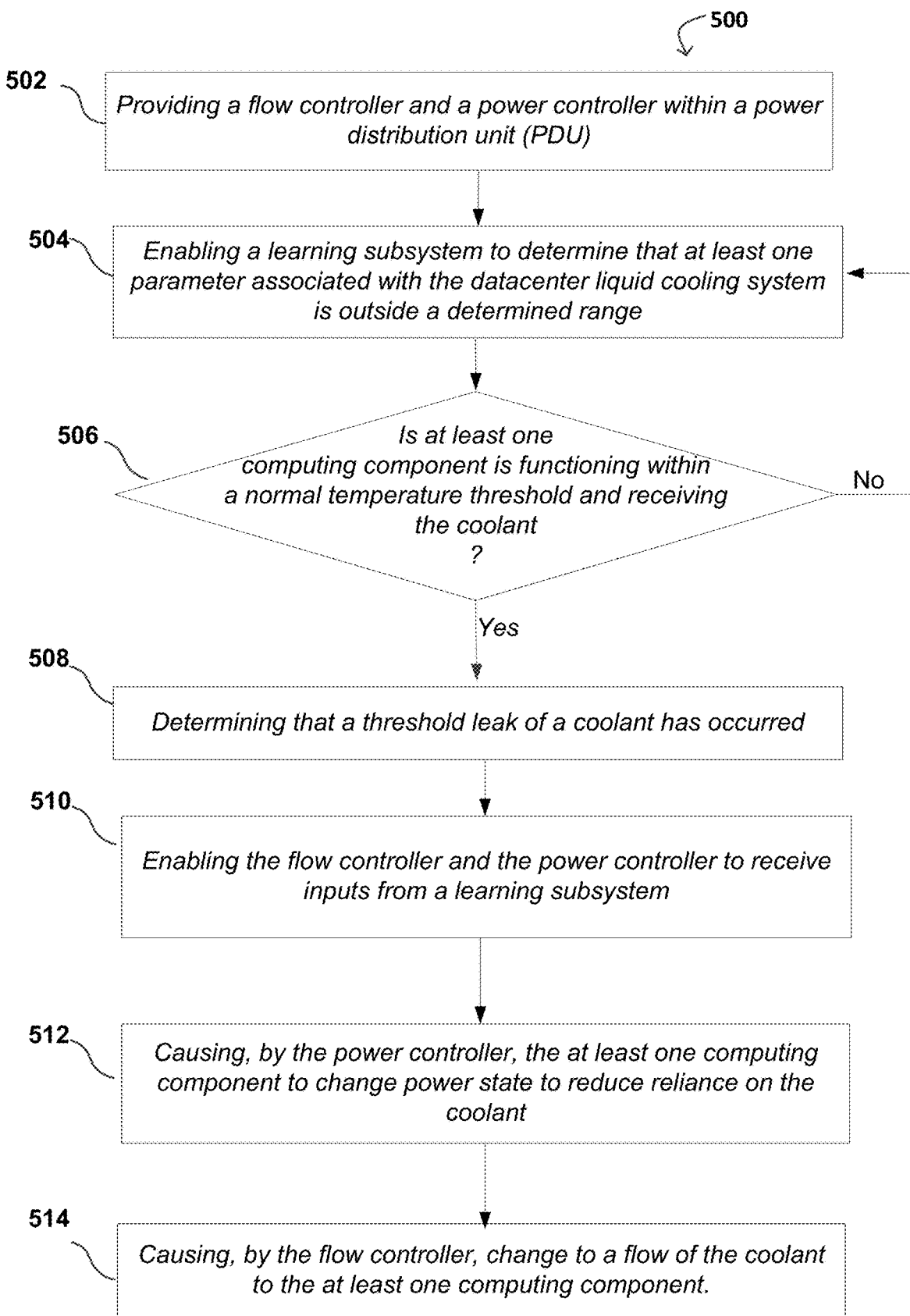
FIG. 5 is a process flow of steps available for a method of using or making the cooling system of FIGS. 2-4 and 6A-17D, according to at least one embodiment.

FIG. 5 is a process flow of steps available for a method 500 of using or making the cooling system of FIGS. 2-4 and 6A-17D, according to at least one embodiment. Step 502 provides a flow controller and a power controller within a power distribution unit (PDU). Step 504 enables a learning subsystem to determine that at least one parameter associated with the datacenter liquid cooling system is outside a determined range. Step 506 may be part of the learning subsystem and performs a determination that a threshold leak of a coolant has occurred. Step 508 is performed based in part on the outcome of step 506. Step 508 determines that the threshold leak has occurred when at least one computing component associated with the cooling system is functioning within a normal temperature threshold and receiving the coolant. Step 504 otherwise continues monitoring parameter values via the learning subsystem.

Step 510 enables the flow controller and the power controller to receive inputs from a learning subsystem. Step 512 causes, by the power controller, the at least one computing component to change power state to reduce reliance on the coolant. Further, step 514 causes, by the flow controller, a change to a flow of the coolant to the at least one computing component. In at least one embodiment, the remediation method 500 enables a sub-step of steps 504-508 by enabling the learning subsystem to determine the threshold leak by at least two monitored actions. In a first monitored action, the learning subsystem has an indication of a first amount of the coolant improperly exiting the datacenter liquid cooling system using the parameters previously noted.

In at least one embodiment, the learning subsystem tracks one or more of a temperature of the coolant; a temperature of the at least one computing component or a first area having the at least one computing component; a temperature of tubing carrying the coolant; humidity or relative humidity of the first area or of a second area that comprises the flow controller; a flow rate of the coolant to the first area; a flow rate of the coolant from the first area; a proportional cooling response to power drawn by the at least one computing component; and a fluid leak rate of the coolant. In at least one embodiment, as power drawn by the at least one computing component increases, the heat generated from the at least one computing component also increases and the cooling requirement increases. Knowledge of the power drawn informs an AI/ML learning subsystem of cooling requirement changes that are to be addressed by the datacenter liquid cooling system.

In at least one embodiment of use of the parameters, the learning subsystem can determine that the temperature of the coolant is too high even when the cooling system is attempting to a cool a computing device that is typically cooled by the same coolant. In at least one embodiment, the learning subsystem can determine that a temperature of the at least one computing component or a first area having the at least one computing component is too high when previously controlled by the same coolant. In at least one embodiment, the learning subsystem can determine that a temperature of tubing carrying the coolant is high when previously this was not the case for a previously established heat feature or cooling requirement.

In at least one embodiment, the learning subsystem can determine that a humidity or a relative humidity of the first area or of a second area that has the flow controller is outside normal range even though coolant is normally flowing. In at least one embodiment, the learning subsystem can determine that a flow rate of the coolant to the first area is outside normal range even though pressure is maintained or has in-tolerance changes. In at least one embodiment, the learning subsystem can determine that a flow rate of the coolant from the first area is outside a range even when applied pressure is maintained or has in-tolerance changes. In at least one embodiment, the learning subsystem can determine that a fluid leak rate of the coolant is detected even with other parameters being within tolerance or being maintained. In each of these examples, only one parameter may be outside tolerance for a threshold leak to be determined.

In at least one embodiment, the threshold leak is therefore informed by at least a second monitored action where the learning subsystem has an indication that the at least one computing component is functioning within the normal temperature threshold and receiving the coolant. This is distinct from a normal leak having a second amount of the coolant, beyond the first amount, that is improperly exiting the datacenter liquid cooling system so that the at least one computing component is unable to function within the normal temperature threshold and unable to receive the coolant to maintain the normal temperature threshold.

In at least one embodiment, the remediation method 500 also includes a feature within step 510 for controlling, using at least one processor associated with the learning subsystem, the flow controller and the power controller using the inputs. In at least one embodiment, a first input of the inputs causes shutdown of the at least one computing component and a second input of the inputs causes shutoff of the coolant.

In at least one embodiment, the remediation method 500 also includes a feature within step 512 for enabling, using the at least one processor, a load transfer subsystem to transfer load associated with the at least one computing component prior to the shutdown of the at least one computing component. In at least one embodiment, the load is transferred to at least one second computing component receiving the coolant or receiving a second coolant that is unaffected by the threshold leak.

Figure 14:
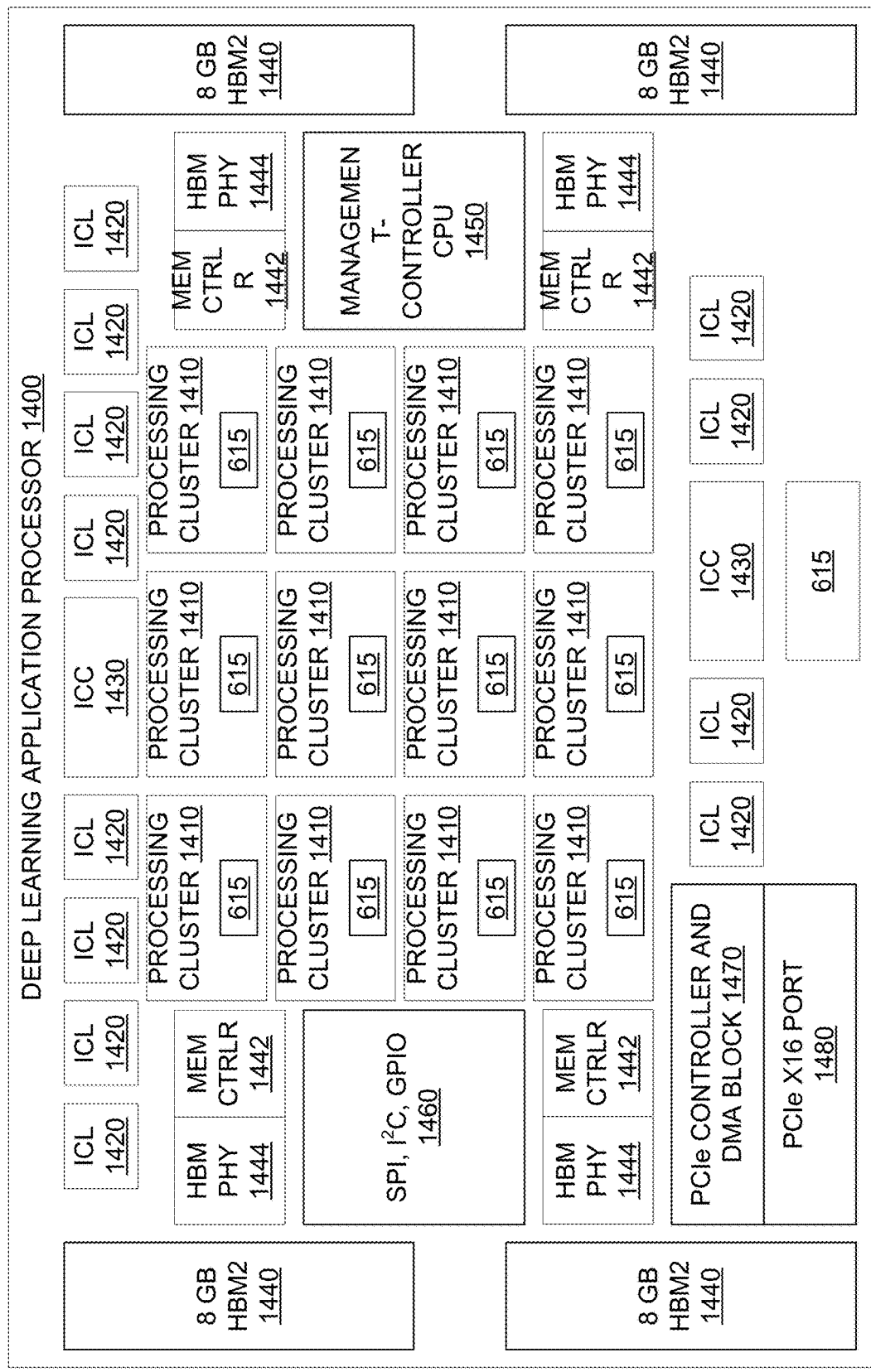
FIG. 14 illustrates a deep learning application processor, according to at least one embodiment.
Figure 15:
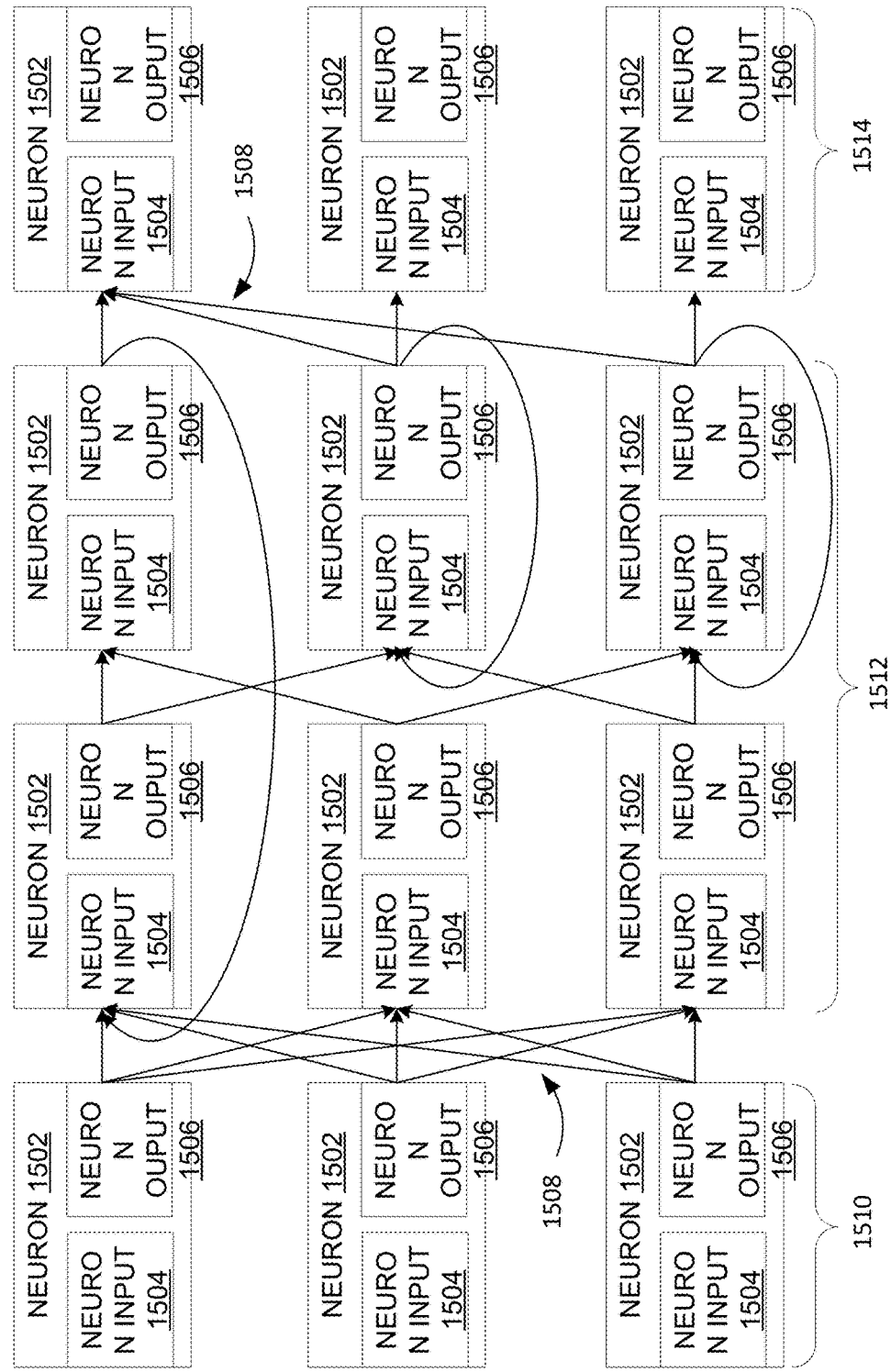
FIG. 15 is a block diagram of a neuromorphic processor, according to at least one embodiment.

In at least one embodiment, the learning subsystem may be implemented via the deep learning application processor, such as processor 1400 in FIG. 14 and may use the neurons 1502 and components thereof implemented using circuitry or logic, including one or more arithmetic logic units (ALUs) as described in FIG. 15. As such, the learning subsystem includes at least one processor for evaluating parameters from the cooling system and functional parameters within components, servers, or racks of the datacenter. In at least one embodiment, aspects of the processing for the deep learning subsystem may use the collected information processed in line with the features discussed with reference to FIGS. 14, 15. In at least one embodiment, the processing of the parameters uses multiple neuron levels of the machine learning model that are loaded with one or more of the collected parameter values noted above, of the cooling system, and the corresponding power states of at least one computing component. In at least one embodiment, testing or training may be performed using different coolants. The learning subsystem performs a training that may be represented as an evaluation of changes in parameter values associated with prior flow rates or flow volumes as per adjustments made to the one or more flow controllers and associated with prior power states as per adjustments made to the power controllers. The neuron levels may store values associated with the evaluation process and may represent an association or correlation between the parameter changes, even within a moving range, and the power states.

In at least one embodiment, a processor and a flow controller may function in unison. The processor (also referred to as a centralized or distributed control system) is at least one processor having at least one logic unit to control flow controllers and power controllers associated with one or more cooling loops. In at least one embodiment, the at least one processor is within the datacenter, such as a processor 702 of FIG. 7A. The controller facilitates movement of a respective coolant and facilitates power adjustments for respective computing component. In at least one embodiment, the at least one processor is a processor core of a multi-core processor, such as multi-core processors 905, 906 in FIG. 9A. In at least one embodiment, the at least one logic unit may be adapted to receive parameter values from parameter sensors associated with servers or the one or more racks and is adapted to facilitate movement of the coolant and is adapted to facilitate reduction in power to at least one computing device. In at least one embodiment, the flow or power controller has a microprocessor to perform its communication and control roles with its respective features.

Figure 9A:
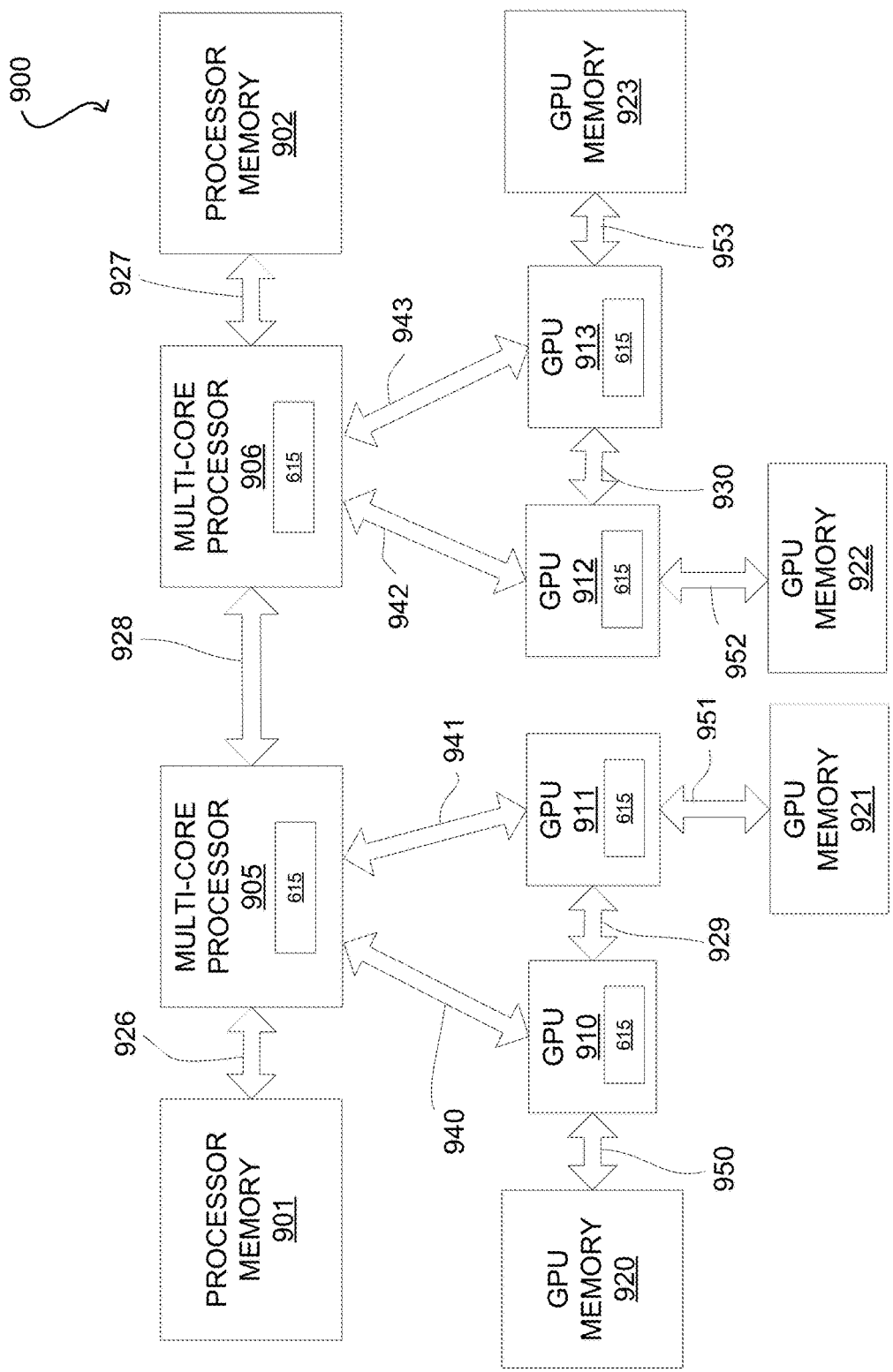
FIG. 9A illustrates an exemplary architecture in which GPUs are communicatively coupled to multi-core processors over high-speed links for enabling and/or supporting a remediation system for threshold leaks in a datacenter liquid cooling system, according to at least one embodiment of the disclosure herein.

In at least one embodiment, a processor, such as the processor cores of multi-core processors 905, 906 in FIG. 9A may include a learning subsystem for evaluating parameters from sensors in different locations in the datacenter, such as in different locations associated with the servers or the racks, or even a component within the server. The learning subsystem provides an output, such as an instruction that is associated with at least changes to be asserted to a flow controller and to a power controller for at least one computing device.

Datacenter

Figure 6A:
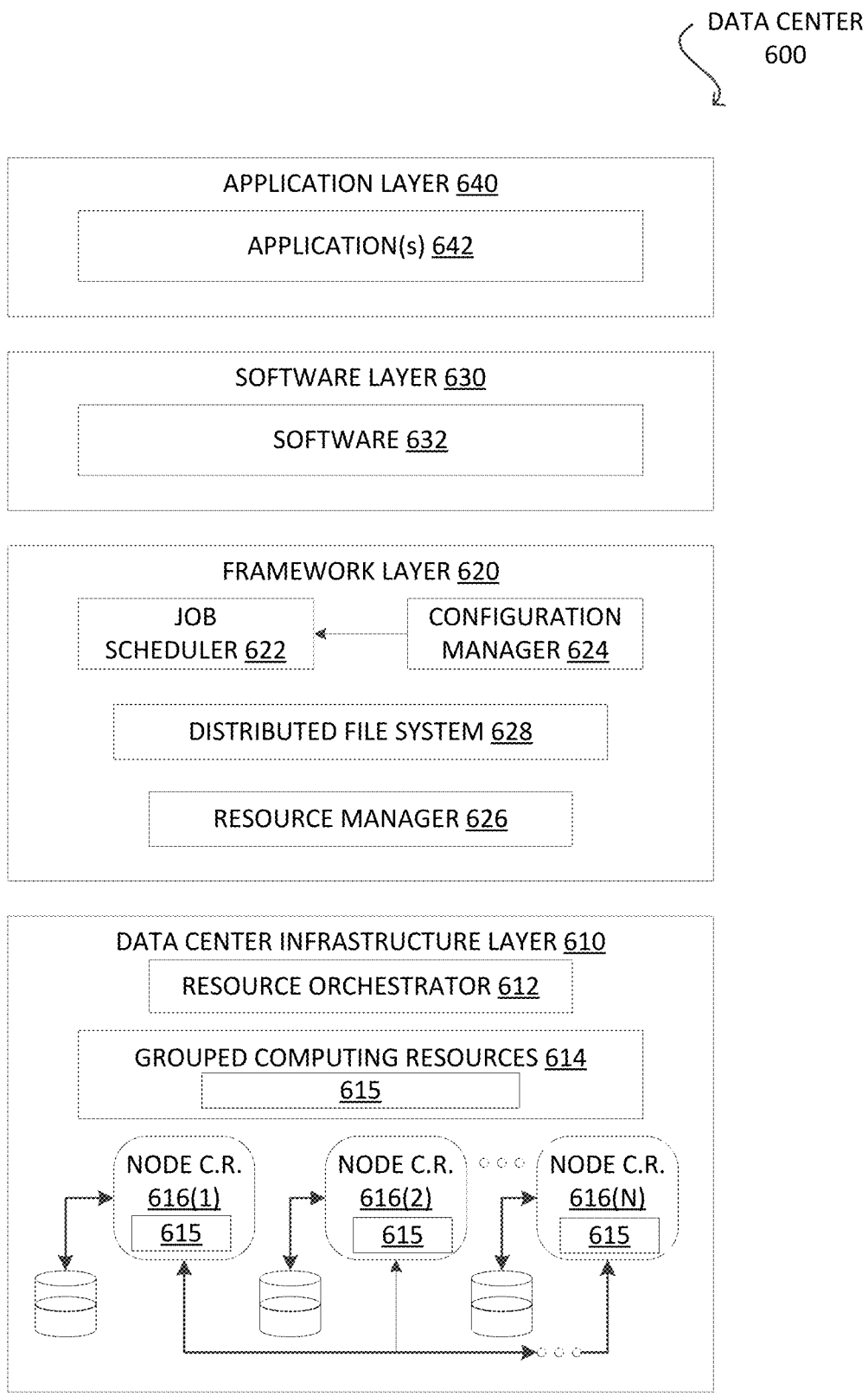
FIG. 6A illustrates an example datacenter, in which at least one embodiment from FIGS. 2-5 may be used.

FIG. 6A illustrates an example datacenter 600, in which at least one embodiment from FIGS. 2-5 may be used. In at least one embodiment, datacenter 600 includes a datacenter infrastructure layer 610, a framework layer 620, a software layer 630, and an application layer 640. In at least one embodiment, such as described in respect to FIGS. 2-5, features in the components of a remediation system for threshold leaks in a datacenter liquid cooling system may be performed inside or in collaboration with the example datacenter 600. In at least one embodiment, the infrastructure layer 610, the framework layer 620, the software layer 630, and the application layer 640 may be partly or fully provided via computing components on server trays located in racks 210 of the datacenter 200. This enables cooling systems of the present disclosure to direct cooling to certain ones of the computing components in an efficient and effective manner. Further, aspects of the datacenter, including the datacenter infrastructure layer 610, the framework layer 620, the software layer 630, and the application layer 640 may be used to support intelligent control of the controllers in a remediation systems for threshold leaks herein discussed with at least reference to FIGS. 2-5 above. As such, the discussion in reference to FIGS. 6A-17D may be understood to apply to the hardware and software features required to enable or support a remediation system for threshold leaks in a datacenter liquid cooling system for the datacenter of FIGS. 2-5, for instance.

In at least one embodiment, as in FIG. 6A, datacenter infrastructure layer 610 may include a resource orchestrator 612, grouped computing resources 614, and node computing resources ("node C.R.s") 616(1)-616(N), where "N" represents any whole, positive integer. In at least one embodiment, node C.R.s 616(1)-616(N) may include, but are not limited to, any number of central processing units ("CPUs") or other processors (including accelerators, field programmable gate arrays (FPGAs), graphics processors, etc.), memory devices (such as dynamic read-only memory), storage devices (such as solid state or disk drives), network input/output ("NW I/O") devices, network switches, virtual machines ("VMs"), power modules, and cooling modules, etc. In at least one embodiment, one or more node C.R.s from among node C.R.s 616(1)-616(N) may be a server having one or more of above-mentioned computing resources.

In at least one embodiment, grouped computing resources 614 may include separate groupings of node C.R.s housed within one or more racks (not shown), or many racks housed in datacenters at various geographical locations (also not shown). Separate groupings of node C.R.s within grouped computing resources 614 may include grouped compute, network, memory or storage resources that may be configured or allocated to support one or more workloads. In at least one embodiment, several node C.R.s including CPUs or processors may grouped within one or more racks to provide compute resources to support one or more workloads. In at least one embodiment, one or more racks may also include any number of power modules, cooling modules, and network switches, in any combination.

In at least one embodiment, resource orchestrator 612 may configure or otherwise control one or more node C.R.s 616(1)-616(N) and/or grouped computing resources 614. In at least one embodiment, resource orchestrator 612 may include a software design infrastructure ("SDI") management entity for datacenter 600. In at least one embodiment, resource orchestrator may include hardware, software or some combination thereof.

In at least one embodiment, as shown in FIG. 6A, framework layer 620 includes a job scheduler 622, a configuration manager 624, a resource manager 626 and a distributed file system 628. In at least one embodiment, framework layer 620 may include a framework to support software 632 of software layer 630 and/or one or more application(s) 642 of application layer 640. In at least one embodiment, software 632 or application(s) 642 may respectively include web-based service software or applications, such as those provided by Amazon Web Services, Google Cloud and Microsoft Azure. In at least one embodiment, framework layer 620 may be, but is not limited to, a type of free and open-source software web application framework such as Apache Spark™ (hereinafter "Spark") that may utilize distributed file system 628 for large-scale data processing (such as "big data"). In at least one embodiment, job scheduler 622 may include a Spark driver to facilitate scheduling of workloads supported by various layers of datacenter 600. In at least one embodiment, configuration manager 624 may be capable of configuring different layers such as software layer 630 and framework layer 620 including Spark and distributed file system 628 for supporting large-scale data processing. In at least one embodiment, resource manager 626 may be capable of managing clustered or grouped computing resources mapped to or allocated for support of distributed file system 628 and job scheduler 622. In at least one embodiment, clustered or grouped computing resources may include grouped computing resource 614 at datacenter infrastructure layer 610. In at least one embodiment, resource manager 626 may coordinate with resource orchestrator 612 to manage these mapped or allocated computing resources.

In at least one embodiment, software 632 included in software layer 630 may include software used by at least portions of node C.R.s 616(1)-616(N), grouped computing resources 614, and/or distributed file system 628 of framework layer 620. One or more types of software may include, but are not limited to, Internet web page search software, e-mail virus scan software, database software, and streaming video content software.

In at least one embodiment, application(s) 642 included in application layer 640 may include one or more types of applications used by at least portions of node C.R.s 616(1)-616(N), grouped computing resources 614, and/or distributed file system 628 of framework layer 620. One or more types of applications may include, but are not limited to, any number of a genomics application, a cognitive compute, and a machine learning application, including training or inferencing software, machine learning framework software (such as PyTorch, TensorFlow, Caffe, etc.) or other machine learning applications used in conjunction with one or more embodiments.

In at least one embodiment, any of configuration manager 624, resource manager 626, and resource orchestrator 612 may implement any number and type of self-modifying actions based on any amount and type of data acquired in any technically feasible fashion. In at least one embodiment, self-modifying actions may relieve a datacenter operator of datacenter 600 from making possibly bad configuration decisions and possibly avoiding underutilized and/or poor performing portions of a datacenter.

In at least one embodiment, datacenter 600 may include tools, services, software or other resources to train one or more machine learning models or predict or infer information using one or more machine learning models according to one or more embodiments described herein. In at least one embodiment, in at least one embodiment, a machine learning model may be trained by calculating weight parameters according to a neural network architecture using software and computing resources described above with respect to datacenter 600. In at least one embodiment, trained machine learning models corresponding to one or more neural networks may be used to infer or predict information using resources described above with respect to datacenter 600 by using weight parameters calculated through one or more training techniques described herein. As previously discussed, deep learning techniques may be used to support intelligent control of the controllers in a remediation system for threshold leaks in a datacenter liquid cooling system herein by monitoring area temperatures of the datacenter. Deep learning may be advanced using any appropriate learning network and the computing capabilities of the datacenter 600. As such, a deep neural network (DNN), a recurrent neural network (RNN) or a convolutional neural network (CNN) may be supported either simultaneously or concurrently using the hardware in the datacenter. Once a network is trained and successfully evaluated to recognize data within a subset or a slice, for instance, the trained network can provide similar representative data for using with the collected data.

In at least one embodiment, datacenter 600 may use CPUs, application-specific integrated circuits (ASICs), GPUs, FPGAs, or other hardware to perform training and/or inferencing using above-described resources. Moreover, one or more software and/or hardware resources described above may be configured as a service to allow users to train or performing inferencing of information, such as pressure, flow rates, temperature, and location information, or other artificial intelligence services.

Inference and Training Logic

Inference and/or training logic 615 may be used to perform inferencing and/or training operations associated with one or more embodiments. In at least one embodiment, inference and/or training logic 615 may be used in system FIG. 6A for inferencing or predicting operations based, at least in part, on weight parameters calculated using neural network training operations, neural network functions and/or architectures, or neural network use cases described herein. In at least one embodiment, inference and/or training logic 615 may include, without limitation, hardware logic in which computational resources are dedicated or otherwise exclusively used in conjunction with weight values or other information corresponding to one or more layers of neurons within a neural network. In at least one embodiment, inference and/or training logic 615 may be used in conjunction with an application-specific integrated circuit (ASIC), such as Tensorflow® Processing Unit from Google, an inference processing unit (IPU) from Graphcore™, or a Nervana® (such as "Lake Crest") processor from Intel Corp.

In at least one embodiment, inference and/or training logic 615 may be used in conjunction with central processing unit (CPU) hardware, graphics processing unit (GPU) hardware or other hardware, such as field programmable gate arrays (FPGAs). In at least one embodiment, inference and/or training logic 615 includes, without limitation, code and/or data storage modules which may be used to store code (such as graph code), weight values and/or other information, including bias values, gradient information, momentum values, and/or other parameter or hyperparameter information. In at least one embodiment, each of the code and/or data storage modules is associated with a dedicated computational resource. In at least one embodiment, the dedicated computational resource includes computational hardware that further include one or more ALUs that perform mathematical functions, such as linear algebraic functions, only on information stored in code and/or data storage modules, and results from which are stored in an activation storage module of the inference and/or training logic 615.

Figure 6B:
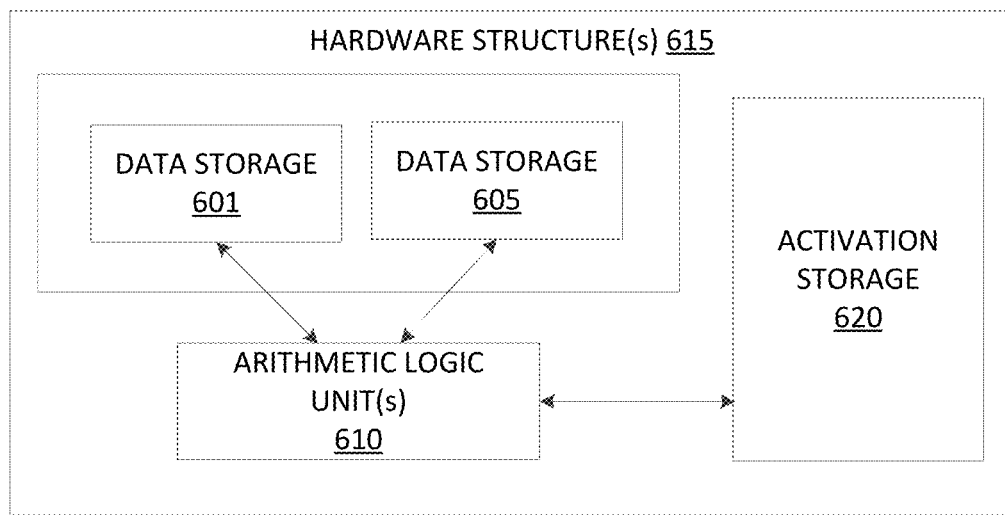
FIGS. 6B, 6C illustrate inference and/or training logic, such as used in FIG. 6A and in at least one embodiment of the present disclosure, for enabling and/or supporting a remediation system for threshold leaks in a datacenter liquid cooling system, according to various embodiments.
Figure 6C:
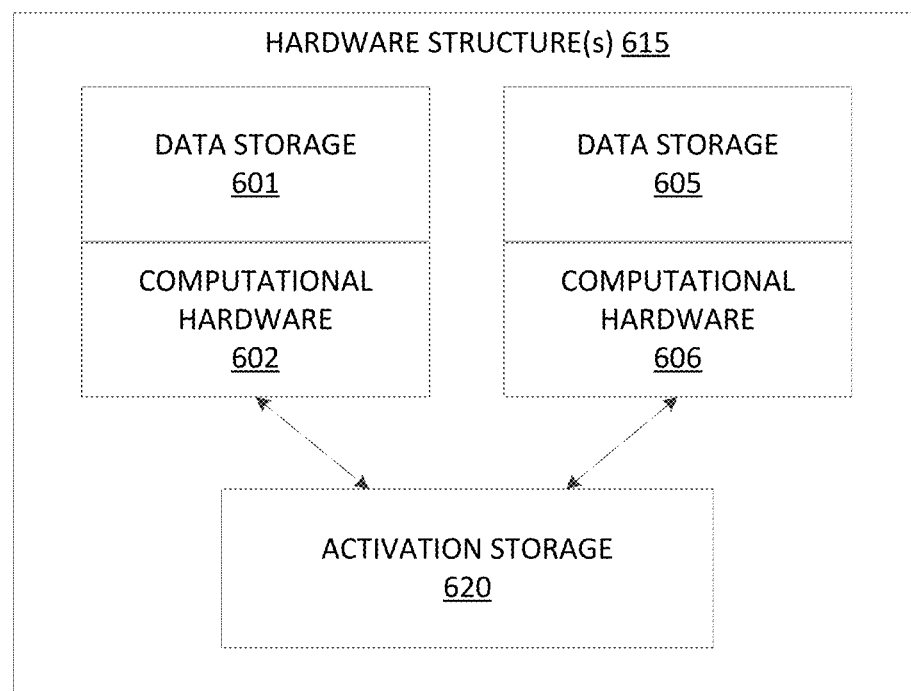

FIGS. 6B, 6C illustrates inference and/or training logic, such as used in FIG. 6A and in at least one embodiment of the present disclosure, according to at least one embodiment. The inference and/or training logic 615 are used to perform inferencing and/or training operations associated with at least one embodiment. Details regarding inference and/or training logic 615 are provided below in conjunction with FIGS. 6B and/or 6C. The inference and/or training logic 615 of FIGS. 6B and 6C are distinguished by the use of the arithmetic logic units (ALUs) 610 versus the computational hardware 602, 606. In at least one embodiment, each of computational hardware 602 and computational hardware 606 includes one or more ALUs that perform mathematical functions, such as linear algebraic functions, only on information stored in code and/or data storage 601 and code and/or data storage 605, respectively, result of which is stored in activation storage 620. As such, FIGS. 6B and 6C may be alternatives and may be used interchangeably unless stated otherwise.

In at least one embodiment, inference and/or training logic 615 may include, without limitation, code and/or data storage 601 to store forward and/or output weight and/or input/output data, and/or other parameters to configure neurons or layers of a neural network trained and/or used for inferencing in at least one embodiment. In at least one embodiment, training logic 615 may include, or be coupled to code and/or data storage 601 to store graph code or other software to control timing and/or order, in which weight and/or other parameter information is to be loaded to configure, logic, including integer and/or floating point units (collectively, arithmetic logic units (ALUs). In at least one embodiment, code, such as graph code, loads weight or other parameter information into processor ALUs based on an architecture of a neural network to which the code corresponds. In at least one embodiment, code and/or data storage 601 stores weight parameters and/or input/output data of each layer of a neural network trained or used in conjunction with at least one embodiment during forward propagation of input/output data and/or weight parameters during training and/or inferencing using at least one embodiment. In at least one embodiment, any portion of code and/or data storage 601 may be included with other on-chip or off-chip data storage, including a processor's L1, L2, or L3 cache or system memory.

In at least one embodiment, any portion of code and/or data storage 601 may be internal or external to one or more processors or other hardware logic devices or circuits. In at least one embodiment, code and/or code and/or data storage 601 may be cache memory, dynamic randomly addressable memory ("DRAM"), static randomly addressable memory ("SRAM"), non-volatile memory (such as Flash memory), or other storage. In at least one embodiment, choice of whether code and/or code and/or data storage 601 is internal or external to a processor, for example, or included of DRAM, SRAM, Flash or some other storage type may depend on available storage on-chip versus off-chip, latency requirements of training and/or inferencing functions being performed, batch size of data used in inferencing and/or training of a neural network, or some combination of these factors.

In at least one embodiment, inference and/or training logic 615 may include, without limitation, a code and/or data storage 605 to store backward and/or output weight and/or input/output data corresponding to neurons or layers of a neural network trained and/or used for inferencing in at least one embodiment. In at least one embodiment, code and/or data storage 605 stores weight parameters and/or input/output data of each layer of a neural network trained or used in conjunction with at least one embodiment during backward propagation of input/output data and/or weight parameters during training and/or inferencing using at least one embodiment. In at least one embodiment, training logic 615 may include, or be coupled to code and/or data storage 605 to store graph code or other software to control timing and/or order, in which weight and/or other parameter information is to be loaded to configure, logic, including integer and/or floating point units (collectively, arithmetic logic units (ALUs).

In at least one embodiment, code, such as graph code, loads weight or other parameter information into processor ALUs based on an architecture of a neural network to which the code corresponds. In at least one embodiment, any portion of code and/or data storage 605 may be included with other on-chip or off-chip data storage, including a processor's L1, L2, or L3 cache or system memory. In at least one embodiment, any portion of code and/or data storage 605 may be internal or external to on one or more processors or other hardware logic devices or circuits. In at least one embodiment, code and/or data storage 605 may be cache memory, DRAM, SRAM, non-volatile memory (such as Flash memory), or other storage. In at least one embodiment, choice of whether code and/or data storage 605 is internal or external to a processor, for example, or included of DRAM, SRAM, Flash or some other storage type may depend on available storage on-chip versus off-chip, latency requirements of training and/or inferencing functions being performed, batch size of data used in inferencing and/or training of a neural network, or some combination of these factors.

In at least one embodiment, code and/or data storage 601 and code and/or data storage 605 may be separate storage structures. In at least one embodiment, code and/or data storage 601 and code and/or data storage 605 may be same storage structure. In at least one embodiment, code and/or data storage 601 and code and/or data storage 605 may be partially same storage structure and partially separate storage structures. In at least one embodiment, any portion of code and/or data storage 601 and code and/or data storage 605 may be included with other on-chip or off-chip data storage, including a processor's L1, L2, or L3 cache or system memory.

In at least one embodiment, inference and/or training logic 615 may include, without limitation, one or more arithmetic logic unit(s) ("ALU(s)") 610, including integer and/or floating point units, to perform logical and/or mathematical operations based, at least in part on, or indicated by, training and/or inference code (such as graph code), a result of which may produce activations (such as output values from layers or neurons within a neural network) stored in an activation storage 620 that are functions of input/output and/or weight parameter data stored in code and/or data storage 601 and/or code and/or data storage 605. In at least one embodiment, activations stored in activation storage 620 are generated according to linear algebraic and or matrix-based mathematics performed by ALU(s) 610 in response to performing instructions or other code, wherein weight values stored in code and/or data storage 605 and/or code and/or data storage 601 are used as operands along with other values, such as bias values, gradient information, momentum values, or other parameters or hyperparameters, any or all of which may be stored in code and/or data storage 605 or code and/or data storage 601 or another storage on or off-chip.

In at least one embodiment, ALU(s) 610 are included within one or more processors or other hardware logic devices or circuits, whereas in another embodiment, ALU(s) 610 may be external to a processor or other hardware logic device or circuit that uses them (such as a co-processor). In at least one embodiment, ALUs 610 may be included within a processor's execution units or otherwise within a bank of ALUs accessible by a processor's execution units either within same processor or distributed between different processors of different types (such as central processing units, graphics processing units, fixed function units, etc.). In at least one embodiment, code and/or data storage 601, code and/or data storage 605, and activation storage 620 may be on same processor or other hardware logic device or circuit, whereas in another embodiment, they may be in different processors or other hardware logic devices or circuits, or some combination of same and different processors or other hardware logic devices or circuits. In at least one embodiment, any portion of activation storage 620 may be included with other on-chip or off-chip data storage, including a processor's L1, L2, or L3 cache or system memory. Furthermore, inferencing and/or training code may be stored with other code accessible to a processor or other hardware logic or circuit and fetched and/or processed using a processor's fetch, decode, scheduling, execution, retirement and/or other logical circuits.

In at least one embodiment, activation storage 620 may be cache memory, DRAM, SRAM, non-volatile memory (such as Flash memory), or other storage. In at least one embodiment, activation storage 620 may be completely or partially within or external to one or more processors or other logical circuits. In at least one embodiment, choice of whether activation storage 620 is internal or external to a processor, for example, or included of DRAM, SRAM, Flash or some other storage type may depend on available storage on-chip versus off-chip, latency requirements of training and/or inferencing functions being performed, batch size of data used in inferencing and/or training of a neural network, or some combination of these factors. In at least one embodiment, inference and/or training logic 615 illustrated in FIG. 6B may be used in conjunction with an application-specific integrated circuit ("ASIC"), such as Tensorflow® Processing Unit from Google, an inference processing unit (IPU) from Graphcore™, or a Nervana® (such as "Lake Crest") processor from Intel Corp. In at least one embodiment, inference and/or training logic 615 illustrated in FIG. 6B may be used in conjunction with central processing unit ("CPU") hardware, graphics processing unit ("GPU") hardware or other hardware, such as field programmable gate arrays ("FPGAs").

In at least one embodiment, as illustrated in FIG. 6C, inference and/or training logic 615 may include, without limitation, hardware logic in which computational resources are dedicated or otherwise exclusively used in conjunction with weight values or other information corresponding to one or more layers of neurons within a neural network. In at least one embodiment, inference and/or training logic 615 illustrated in FIG. 6C may be used in conjunction with an application-specific integrated circuit (ASIC), such as Tensorflow® Processing Unit from Google, an inference processing unit (IPU) from Graphcore™, or a Nervana® (such as "Lake Crest") processor from Intel Corp. In at least one embodiment, inference and/or training logic 615 illustrated in FIG. 6C may be used in conjunction with central processing unit (CPU) hardware, graphics processing unit (GPU) hardware or other hardware, such as field programmable gate arrays (FPGAs). In at least one embodiment, inference and/or training logic 615 includes, without limitation, code and/or data storage 601 and code and/or data storage 605, which may be used to store code (such as graph code), weight values and/or other information, including bias values, gradient information, momentum values, and/or other parameter or hyperparameter information. In at least one embodiment illustrated in FIG. 6C, each of code and/or data storage 601 and code and/or data storage 605 is associated with a dedicated computational resource, such as computational hardware 602 and computational hardware 606, respectively.

In at least one embodiment, each of code and/or data storage 601 and 605 and corresponding computational hardware 602 and 606, respectively, correspond to different layers of a neural network, such that resulting activation from one "storage/computational pair 601/602" of code and/or data storage 601 and computational hardware 602 is provided as an input to "storage/computational pair 605/606" of code and/or data storage 605 and computational hardware 606, in order to mirror conceptual organization of a neural network. In at least one embodiment, each of storage/computational pairs 601/602 and 605/606 may correspond to more than one neural network layer. In at least one embodiment, additional storage/computation pairs (not shown) subsequent to or in parallel with storage computation pairs 601/602 and 605/606 may be included in inference and/or training logic 615.

Computer Systems

Figure 7A:
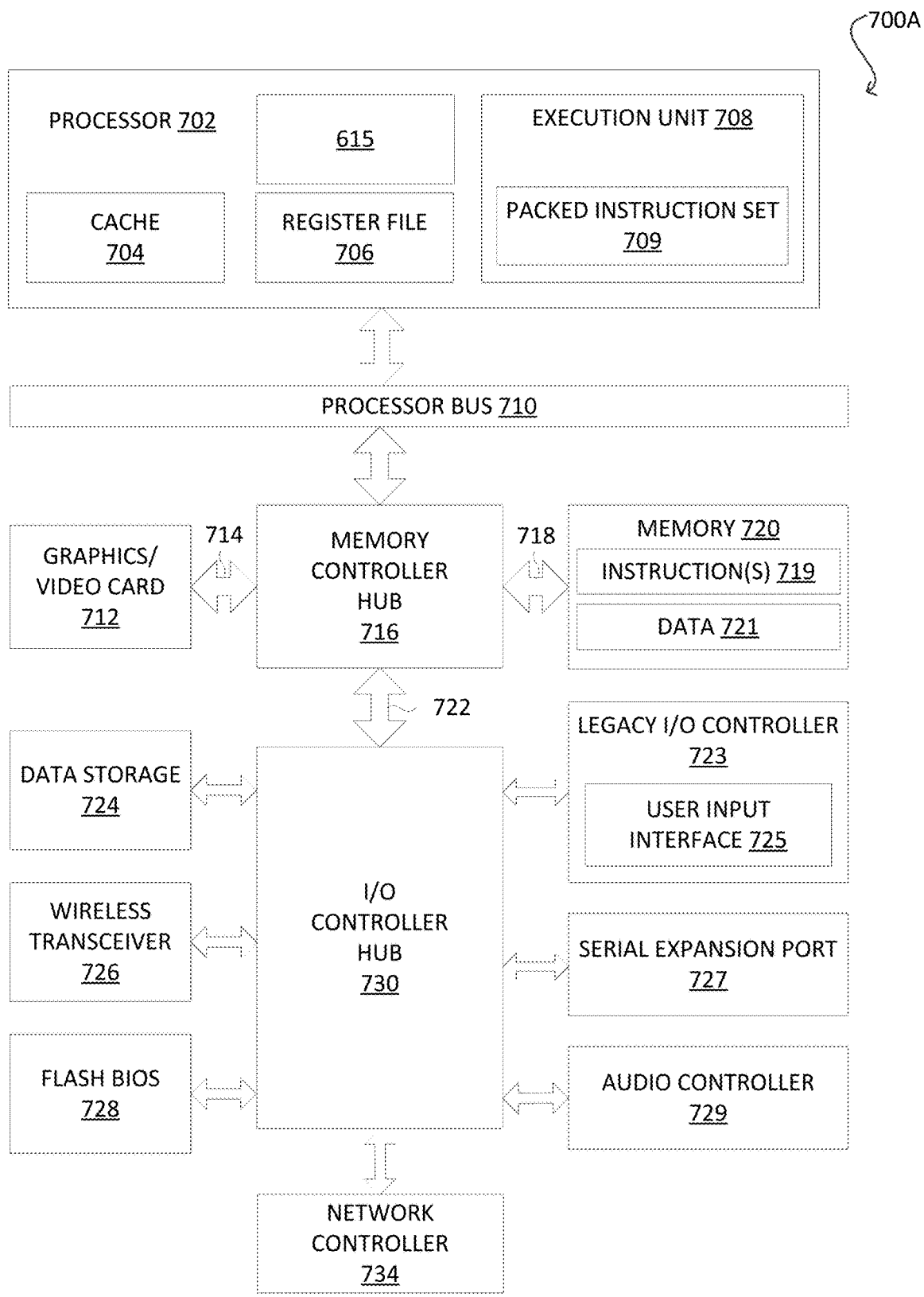
FIG. 7A is a block diagram illustrating an exemplary computer system, which may be a system with interconnected devices and components, a system-on-a-chip (SOC) or some combination thereof formed with a processor that may include execution units to execute an instruction to support and/or to enable a remediation system for threshold leaks in a datacenter liquid cooling system as described herein, according to at least one embodiment.

FIG. 7A is a block diagram illustrating an exemplary computer system 700A, which may be a system with interconnected devices and components, a system-on-a-chip (SOC) or some combination thereof formed with a processor that may include execution units to execute an instruction to support and/or to enable the intelligent control of a remediation system for threshold leaks in a datacenter liquid cooling system as described herein, according to at least one embodiment. In at least one embodiment, computer system 700A may include, without limitation, a component, such as a processor 702 to employ execution units including logic to perform algorithms for process data, in accordance with present disclosure, such as in embodiment described herein. In at least one embodiment, computer system 700A may include processors, such as PENTIUM® Processor family, Xeon™, Itanium®, XScale™ and/or StrongARM™, Intel® Core™, or Intel® Nervana™ microprocessors available from Intel Corporation of Santa Clara, Calif., although other systems (including PCs having other microprocessors, engineering workstations, set-top boxes and like) may also be used. In at least one embodiment, computer system 700B may execute a version of WINDOWS' operating system available from Microsoft Corporation of Redmond, Wash., although other operating systems (UNIX and Linux for example), embedded software, and/or graphical user interfaces, may also be used.

In at least one embodiment, the exemplary computer system 700A may incorporate one or more of components 110-116 (from FIG. 1) to support processing aspects for the intelligent control for a remediation system for threshold leaks in a datacenter liquid cooling system. For at least this reason, in one embodiment, FIG. 7A illustrates a system, which includes interconnected hardware devices or "chips", whereas in other embodiments, FIG. 7A may illustrate an exemplary System on a Chip ("SoC"). In at least one embodiment, devices may be interconnected with proprietary interconnects, standardized interconnects (such as PCIe) or some combination thereof. In at least one embodiment, one or more components of computer system 700B are interconnected using compute express link (CXL) interconnects. Inference and/or training logic 615 are used to perform inferencing and/or training operations associated with one or more embodiments, as previously discussed with respect to FIGS. 6A-C, for instance. Details regarding inference and/or training logic 615 are provided below in conjunction with FIGS. 6A-C. In at least one embodiment, inference and/or training logic 615 may be used in system FIG. 7A for inferencing or predicting operations based, at least in part, on weight parameters calculated using neural network training operations, neural network functions and/or architectures, or neural network use cases described herein.

Embodiments may be used in other devices such as handheld devices and embedded applications. Some examples of handheld devices include cellular phones, Internet Protocol devices, digital cameras, personal digital assistants ("PDAs"), and handheld PCs. In at least one embodiment, embedded applications may include a microcontroller, a digital signal processor ("DSP"), system on a chip, network computers ("NetPCs"), set-top boxes, network hubs, wide area network ("WAN") switches, or any other system that may perform one or more instructions in accordance with at least one embodiment.

In at least one embodiment, computer system 700A may include, without limitation, processor 702 that may include, without limitation, one or more execution units 708 to perform machine learning model training and/or inferencing according to techniques described herein. In at least one embodiment, computer system 700A is a single processor desktop or server system, but in another embodiment computer system 700A may be a multiprocessor system. In at least one embodiment, processor 702 may include, without limitation, a complex instruction set computer ("CISC") microprocessor, a reduced instruction set computing ("RISC") microprocessor, a very long instruction word ("VLIW") microprocessor, a processor implementing a combination of instruction sets, or any other processor device, such as a digital signal processor, for example. In at least one embodiment, processor 702 may be coupled to a processor bus 710 that may transmit data signals between processor 702 and other components in computer system 700A.

In at least one embodiment, processor 702 may include, without limitation, a Level 1 ("L1") internal cache memory ("cache") 704. In at least one embodiment, processor 702 may have a single internal cache or multiple levels of internal cache. In at least one embodiment, cache memory may reside external to processor 702. Other embodiments may also include a combination of both internal and external caches depending on particular implementation and needs. In at least one embodiment, register file 706 may store different types of data in various registers including, without limitation, integer registers, floating point registers, status registers, and instruction pointer register.

In at least one embodiment, execution unit 708, including, without limitation, logic to perform integer and floating point operations, also resides in processor 702. In at least one embodiment, processor 702 may also include a microcode ("ucode") read only memory ("ROM") that stores microcode for certain macro instructions. In at least one embodiment, execution unit 708 may include logic to handle a packed instruction set 709. In at least one embodiment, by including packed instruction set 709 in an instruction set of a general-purpose processor 702, along with associated circuitry to execute instructions, operations used by many multimedia applications may be performed using packed data in a general-purpose processor 702. In one or more embodiments, many multimedia applications may be accelerated and executed more efficiently by using full width of a processor's data bus for performing operations on packed data, which may eliminate need to transfer smaller units of data across processor's data bus to perform one or more operations one data element at a time.

In at least one embodiment, execution unit 708 may also be used in microcontrollers, embedded processors, graphics devices, DSPs, and other types of logic circuits. In at least one embodiment, computer system 700A may include, without limitation, a memory 720. In at least one embodiment, memory 720 may be implemented as a Dynamic Random Access Memory ("DRAM") device, a Static Random Access Memory ("SRAM") device, flash memory device, or other memory device. In at least one embodiment, memory 720 may store instruction(s) 719 and/or data 721 represented by data signals that may be executed by processor 702.

In at least one embodiment, system logic chip may be coupled to processor bus 710 and memory 720. In at least one embodiment, system logic chip may include, without limitation, a memory controller hub ("MCH") 716, and processor 702 may communicate with MCH 716 via processor bus 710. In at least one embodiment, MCH 716 may provide a high bandwidth memory path 718 to memory 720 for instruction and data storage and for storage of graphics commands, data and textures. In at least one embodiment, MCH 716 may direct data signals between processor 702, memory 720, and other components in computer system 700A and to bridge data signals between processor bus 710, memory 720, and a system I/O 722. In at least one embodiment, system logic chip may provide a graphics port for coupling to a graphics controller. In at least one embodiment, MCH 716 may be coupled to memory 720 through a high bandwidth memory path 718 and graphics/video card 712 may be coupled to MCH 716 through an Accelerated Graphics Port ("AGP") interconnect 714.

In at least one embodiment, computer system 700A may use system I/O 722 that is a proprietary hub interface bus to couple MCH 716 to I/O controller hub ("ICH") 730. In at least one embodiment, ICH 730 may provide direct connections to some I/O devices via a local I/O bus. In at least one embodiment, local I/O bus may include, without limitation, a high-speed I/O bus for connecting peripherals to memory 720, chipset, and processor 702. Examples may include, without limitation, an audio controller 729, a firmware hub ("flash BIOS") 728, a wireless transceiver 726, a data storage 724, a legacy I/O controller 723 containing user input and keyboard interfaces 725, a serial expansion port 727, such as Universal Serial Bus ("USB"), and a network controller 734. Data storage 724 may include a hard disk drive, a floppy disk drive, a CD-ROM device, a flash memory device, or other mass storage device.

Figure 7B:
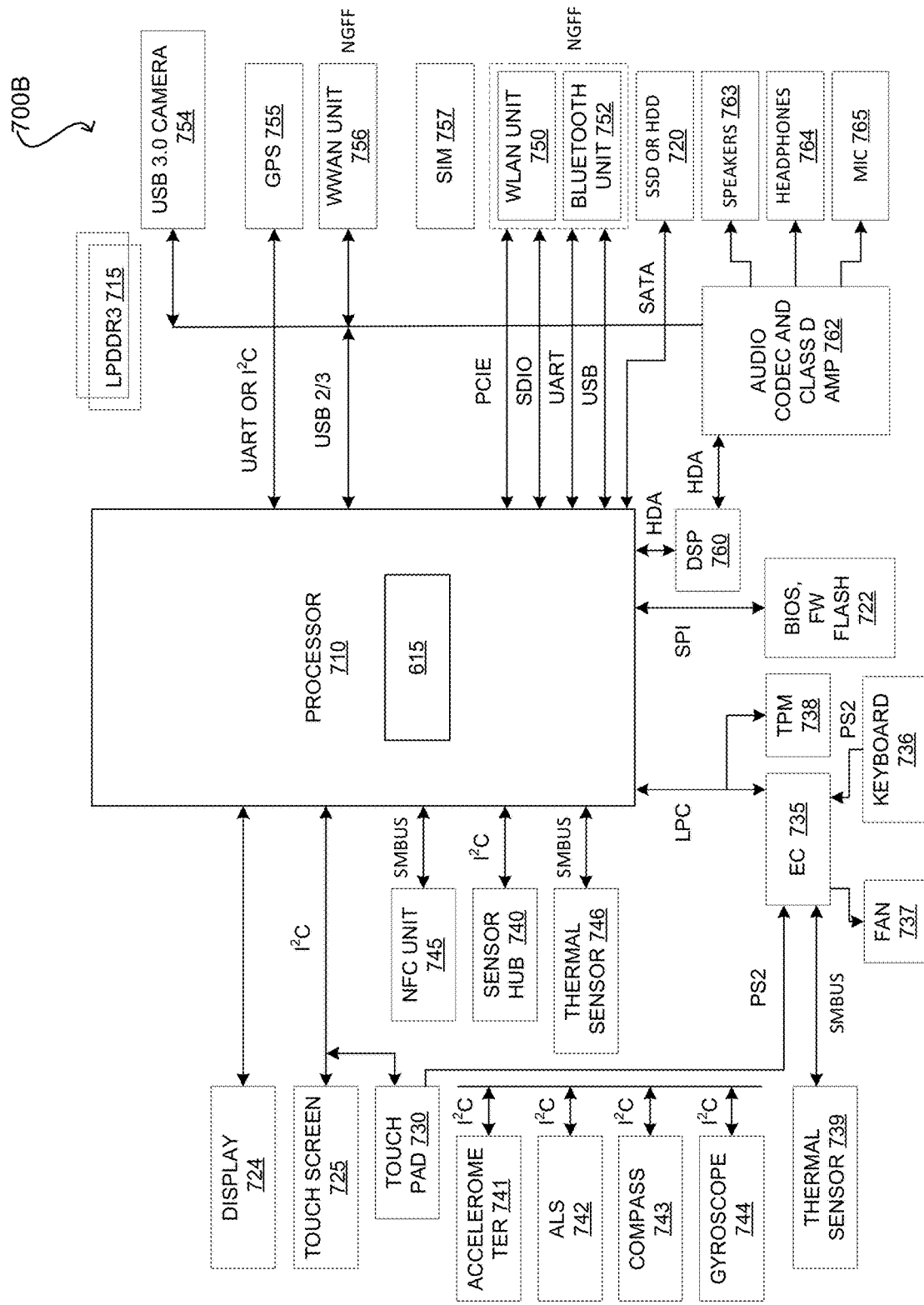
FIG. 7B is a block diagram illustrating an electronic device for utilizing a processor to support and/or to enable a remediation system for threshold leaks in a datacenter liquid cooling system, according to at least one embodiment.

FIG. 7B is a block diagram illustrating an electronic device 700B for utilizing a processor 710 to support and/or to enable intelligent control of a remediation system for threshold leaks in a datacenter liquid cooling system as described herein, according to at least one embodiment. In at least one embodiment, electronic device 700B may be, for example and without limitation, a notebook, a tower server, a rack server, a blade server, a laptop, a desktop, a tablet, a mobile device, a phone, an embedded computer, or any other suitable electronic device. In at least one embodiment, the exemplary electronic device 700B may incorporate one or more of components that support processing aspects for the remediation system for threshold leaks in a datacenter liquid cooling system.

In at least one embodiment, system 700B may include, without limitation, processor 710 communicatively coupled to any suitable number or kind of components, peripherals, modules, or devices. In at least one embodiment, processor 710 coupled using a bus or interface, such as a 1° C. bus, a System Management Bus ("SMBus"), a Low Pin Count (LPC) bus, a Serial Peripheral Interface ("SPI"), a High Definition Audio ("HDA") bus, a Serial Advance Technology Attachment ("SATA") bus, a Universal Serial Bus ("USB") (versions 1, 2, 3), or a Universal Asynchronous Receiver/Transmitter ("UART") bus. In at least one embodiment, FIG. 7B illustrates a system, which includes interconnected hardware devices or "chips", whereas in other embodiments, FIG. 7B may illustrate an exemplary System on a Chip ("SoC"). In at least one embodiment, devices illustrated in FIG. 7B may be interconnected with proprietary interconnects, standardized interconnects (such as PCIe) or some combination thereof. In at least one embodiment, one or more components of FIG. 7B are interconnected using compute express link (CXL) interconnects.

In at least one embodiment, FIG. 7B may include a display 724, a touch screen 725, a touch pad 730, a Near Field Communications unit ("NFC") 745, a sensor hub 740, a thermal sensor 746, an Express Chipset ("EC") 735, a Trusted Platform Module ("TPM") 738, BIOS/firmware/flash memory ("BIOS, FW Flash") 722, a DSP 760, a drive 720 such as a Solid State Disk ("SSD") or a Hard Disk Drive ("HDD"), a wireless local area network unit ("WLAN") 750, a Bluetooth unit 752, a Wireless Wide Area Network unit ("WWAN") 756, a Global Positioning System (GPS) 755, a camera ("USB 3.0 camera") 754 such as a USB 3.0 camera, and/or a Low Power Double Data Rate ("LPDDR") memory unit ("LPDDR3") 715 implemented in, for example, LPDDR3 standard. These components may each be implemented in any suitable manner.

In at least one embodiment, other components may be communicatively coupled to processor 710 through components discussed above. In at least one embodiment, an accelerometer 741, Ambient Light Sensor ("ALS") 742, compass 743, and a gyroscope 744 may be communicatively coupled to sensor hub 740. In at least one embodiment, thermal sensor 739, a fan 737, a keyboard 746, and a touch pad 730 may be communicatively coupled to EC 735. In at least one embodiment, speaker 763, headphones 764, and microphone ("mic") 765 may be communicatively coupled to an audio unit ("audio codec and class d amp") 762, which may in turn be communicatively coupled to DSP 760. In at least one embodiment, audio unit 764 may include, for example and without limitation, an audio coder/decoder ("codec") and a class D amplifier. In at least one embodiment, SIM card ("SIM") 757 may be communicatively coupled to WWAN unit 756. In at least one embodiment, components such as WLAN unit 750 and Bluetooth unit 752, as well as WWAN unit 756 may be implemented in a Next Generation Form Factor ("NGFF").

Inference and/or training logic 615 are used to perform inferencing and/or training operations associated with one or more embodiments. Details regarding inference and/or training logic 615 are provided below in conjunction with FIGS. 6B and/or 6C. In at least one embodiment, inference and/or training logic x615 may be used in system FIG. 7B for inferencing or predicting operations based, at least in part, on weight parameters calculated using neural network training operations, neural network functions and/or architectures, or neural network use cases described herein.

Figure 7C:
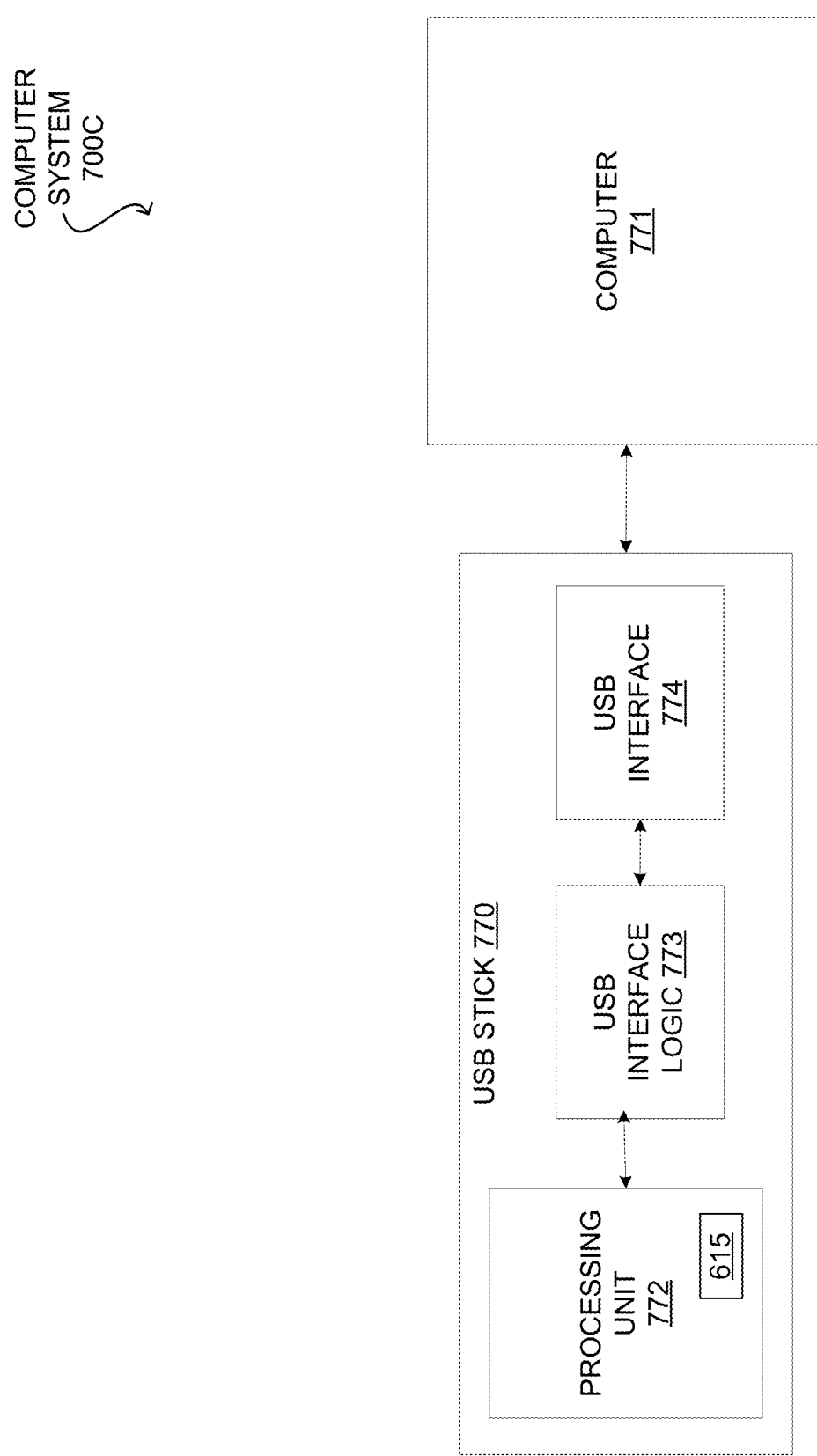
FIG. 7C is a block diagram illustrating an electronic device for utilizing a processor to support and/or to enable a remediation system for threshold leaks in a datacenter liquid cooling system, according to at least one embodiment.

FIG. 7C illustrates a computer system 700C, according to at least one embodiment, to support and/or to enable the intelligent control of a remediation system for threshold leaks in a datacenter liquid cooling system as described herein. In at least one embodiment, computer system 700C includes, without limitation, a computer 771 and a USB stick 770. In at least one embodiment, computer 771 may include, without limitation, any number and type of processor(s) (not shown) and a memory (not shown). In at least one embodiment, computer 771 includes, without limitation, a server, a cloud instance, a laptop, and a desktop computer.

In at least one embodiment, USB stick 770 includes, without limitation, a processing unit 772, a USB interface 774, and USB interface logic 773. In at least one embodiment, processing unit 772 may be any instruction execution system, apparatus, or device capable of executing instructions. In at least one embodiment, processing unit 772 may include, without limitation, any number and type of processing cores (not shown). In at least one embodiment, processing unit or core 772 comprises an application specific integrated circuit ("ASIC") that is optimized to perform any amount and type of operations associated with machine learning. For instance, in at least one embodiment, processing core 772 is a tensor processing unit ("TPC") that is optimized to perform machine learning inference operations. In at least one embodiment, processing core 772 is a vision processing unit ("VPU") that is optimized to perform machine vision and machine learning inference operations.

In at least one embodiment, USB interface 774 may be any type of USB connector or USB socket. For instance, in at least one embodiment, USB interface 774 is a USB 3.0 Type-C socket for data and power. In at least one embodiment, USB interface 774 is a USB 3.0 Type-A connector. In at least one embodiment, USB interface logic 773 may include any amount and type of logic that enables processing unit 772 to interface with or devices (such as computer 771) via USB connector 774.

Inference and/or training logic 615, as described with respect to FIGS. 6B and 6C, are used to perform inferencing and/or training operations associated with one or more embodiments. Details regarding inference and/or training logic 615 are provided below in conjunction with FIGS. 6B and/or 6C. In at least one embodiment, inference and/or training logic 615 may be used in system FIG. 7C for inferencing or predicting operations based, at least in part, on weight parameters calculated using neural network training operations, neural network functions and/or architectures, or neural network use cases described herein.

Figure 8:
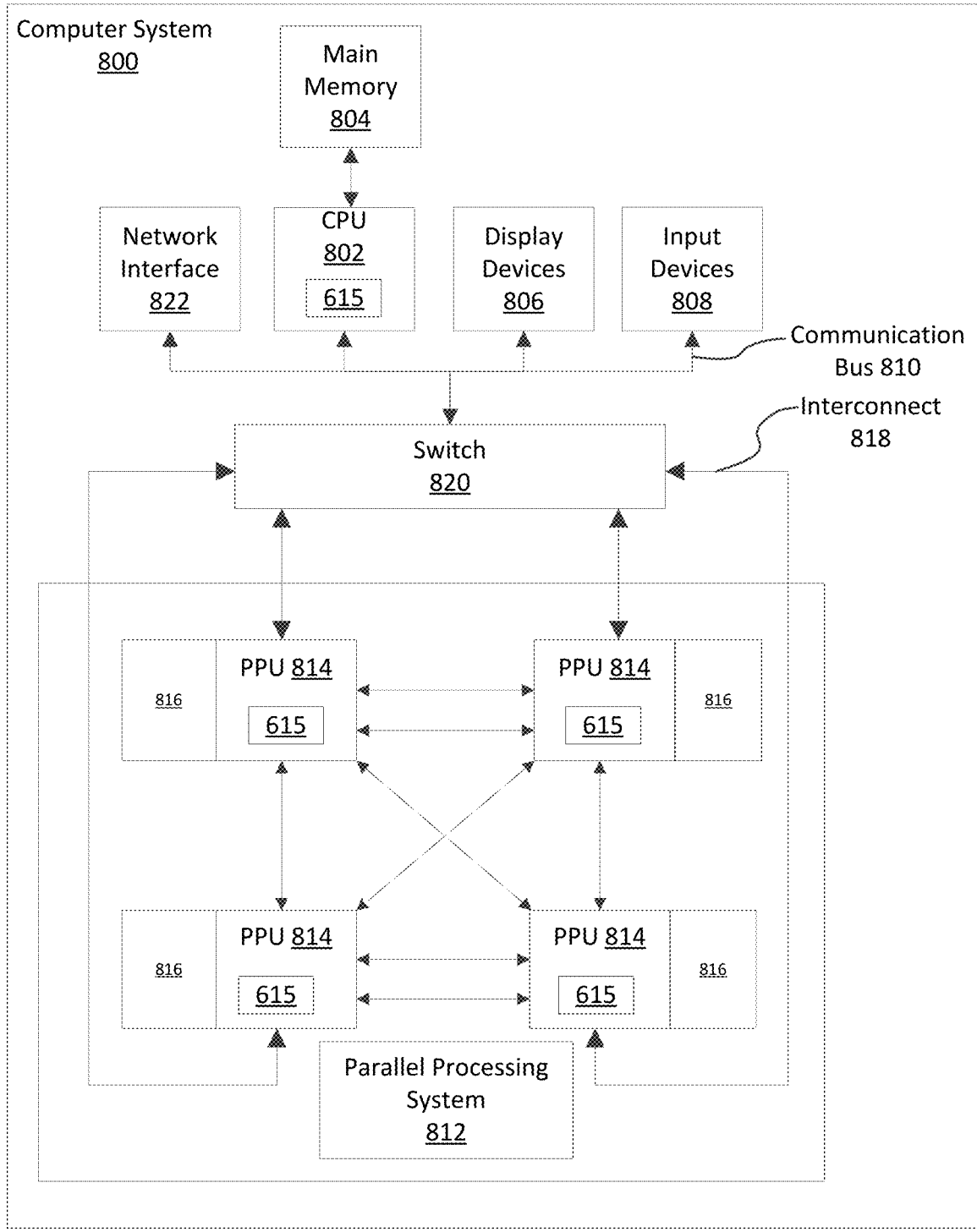
FIG. 8 illustrates a further example computer system, according to at least one embodiment, to implement various processes and methods for a remediation system for threshold leaks in a datacenter liquid cooling system as described throughout this disclosure.

FIG. 8 illustrates a further example computer system 800, according to at least one embodiment, to implement various processes and methods for a remediation system for threshold leaks in a datacenter liquid cooling system described throughout this disclosure. In at least one embodiment, computer system 800 includes, without limitation, at least one central processing unit ("CPU") 802 that is connected to a communication bus 810 implemented using any suitable protocol, such as PCI ("Peripheral Component Interconnect"), peripheral component interconnect express ("PCI-Express"), AGP ("Accelerated Graphics Port"), Hyper-Transport, or any other bus or point-to-point communication protocol(s). In at least one embodiment, computer system 800 includes, without limitation, a main memory 804 and control logic (such as implemented as hardware, software, or a combination thereof) and data are stored in main memory 804 which may take form of random access memory ("RAM"). In at least one embodiment, a network interface subsystem ("network interface") 822 provides an interface to other computing devices and networks for receiving data from and transmitting data to other systems from computer system 800.

In at least one embodiment, computer system 800, in at least one embodiment, includes, without limitation, input devices 808, parallel processing system 812, and display devices 806 which can be implemented using a cathode ray tube ("CRT"), liquid crystal display ("LCD"), light emitting diode ("LED"), plasma display, or other suitable display technologies. In at least one embodiment, user input is received from input devices 808 such as keyboard, mouse, touchpad, microphone, and more. In at least one embodiment, each of foregoing modules can be situated on a single semiconductor platform to form a processing system.

Inference and/or training logic 615 are used to perform inferencing and/or training operations associated with one or more embodiments, as previously discussed with respect to FIGS. 6A-C, for instance. Details regarding inference and/or training logic 615 are provided below in conjunction with FIGS. 6A-C. In at least one embodiment, inference and/or training logic 615 may be used in system FIG. 8 for inferencing or predicting operations based, at least in part, on weight parameters calculated using neural network training operations, neural network functions and/or architectures, or neural network use cases described herein. In at least one embodiment, inference and/or training logic 615 may be used in system FIG. 8 for inferencing or predicting operations based, at least in part, on weight parameters calculated using neural network training operations, neural network functions and/or architectures, or neural network use cases described herein.

FIG. 9A illustrates an exemplary architecture in which a plurality of GPUs 910-913 is communicatively coupled to a plurality of multi-core processors 905-906 over high-speed links 940-943 (such as buses, point-to-point interconnects, etc.). In one embodiment, high-speed links 940-943 support a communication throughput of 4 GB/s, 30 GB/s, 80 GB/s or higher. Various interconnect protocols may be used including, but not limited to, PCIe 4.0 or 5.0 and NVLink 2.0.

In addition, and in one embodiment, two or more of GPUs 910-913 are interconnected over high-speed links 929-930, which may be implemented using same or different protocols/links than those used for high-speed links 940-943. Similarly, two or more of multi-core processors 905-906 may be connected over high speed link 928 which may be symmetric multi-processor (SMP) buses operating at 20 GB/s, 30 GB/s, 120 GB/s or higher. Alternatively, all communication between various system components shown in FIG. 9A may be accomplished using same protocols/links (such as over a common interconnection fabric).

In one embodiment, each multi-core processor 905-906 is communicatively coupled to a processor memory 901-902, via memory interconnects 926-927, respectively, and each GPU 910-913 is communicatively coupled to GPU memory 920-923 over GPU memory interconnects 950-953, respectively. Memory interconnects 926-927 and 950-953 may utilize same or different memory access technologies. By way of example, and not limitation, processor memories 901-902 and GPU memories 920-923 may be volatile memories such as dynamic random access memories (DRAMs) (including stacked DRAMs), Graphics DDR SDRAM (GDDR) (such as GDDR5, GDDR6), or High Bandwidth Memory (HBM) and/or may be non-volatile memories such as 3D XPoint or Nano-Ram. In one embodiment, some portion of processor memories 901-902 may be volatile memory and another portion may be non-volatile memory (such as using a two-level memory (2LM) hierarchy).

As described below, although various processors 905-906 and GPUs 910-913 may be physically coupled to a particular memory 901-902, 920-923, respectively, a unified memory architecture may be implemented in which a same virtual system address space (also referred to as "effective address" space) is distributed among various physical memories. In at least one embodiment, processor memories 901-902 may each include 64 GB of system memory address space and GPU memories 920-923 may each include 32 GB of system memory address space (resulting in a total of 256 GB addressable memory in this example).

As discussed elsewhere in this disclosure, at least flow rates and associated temperatures may be established for a first level of an intelligent learning system, such as a neural network system. As the first level represents the prior data, it also represents a smaller subset of the data that may be available to improve the system by retraining the system. The testing and training may be performed in parallel using the multiple processor units so that the intelligent learning system is robust. An architecture, such as in FIG. 9A, may be used. When convergence is achieved for the intelligent learning system, an amount of data points and the data in the data points used to cause the convergence is noted. The data and data points may be used to control a remediation system for threshold leaks in a datacenter liquid cooling system, entirely, as discussed in reference, for instance, to FIGS. 2-5.

Figure 9B:
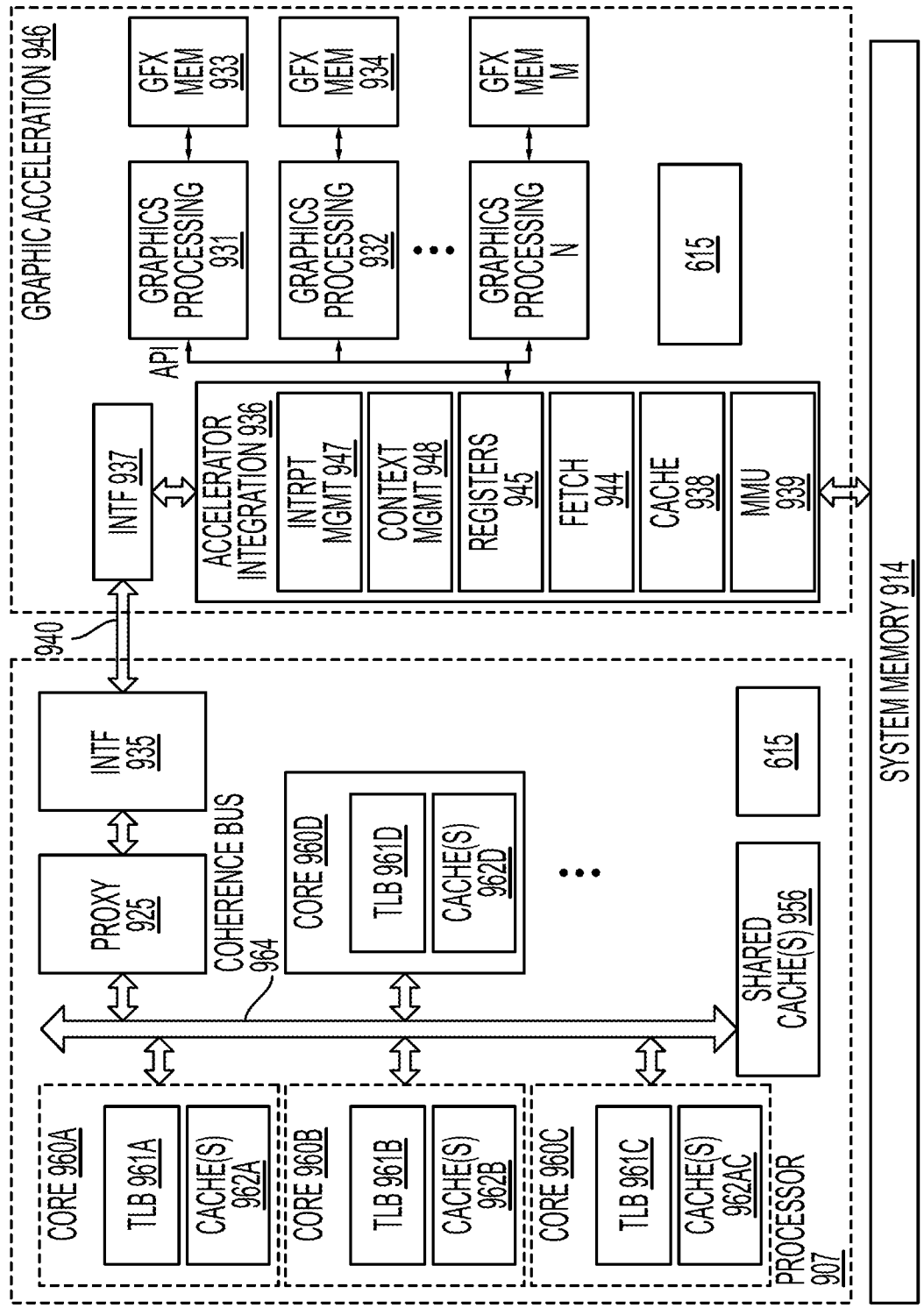
FIG. 9B illustrates additional details for an interconnection between a multi-core processor and a graphics acceleration module in accordance with one exemplary embodiment.

FIG. 9B illustrates additional details for an interconnection between a multi-core processor 907 and a graphics acceleration module 946 in accordance with one exemplary embodiment. Graphics acceleration module 946 may include one or more GPU chips integrated on a line card which is coupled to processor 907 via high-speed link 940. Alternatively, graphics acceleration module 946 may be integrated on a same package or chip as processor 907.

In at least one embodiment, illustrated processor 907 includes a plurality of cores 960A-960D, each with a translation lookaside buffer 961A-961D and one or more caches 962A-962D. In at least one embodiment, cores 960A-960D may include various other components for executing instructions and processing data which are not illustrated. Caches 962A-962D may include level 1 (L1) and level 2 (L2) caches. In addition, one or more shared caches 956 may be included in caches 962A-962D and shared by sets of cores 960A-960D. In at least one embodiment, one embodiment of processor 907 includes 24 cores, each with its own L1 cache, twelve shared L2 caches, and twelve shared L3 caches. In this embodiment, one or more L2 and L3 caches are shared by two adjacent cores. Processor 907 and graphics acceleration module 946 connect with system memory 914, which may include processor memories 901-902 of FIG. 9A.

Coherency is maintained for data and instructions stored in various caches 962A-962D, 956 and system memory 914 via inter-core communication over a coherence bus 964. In at least one embodiment, each cache may have cache coherency logic/circuitry associated therewith to communicate to over coherence bus 964 in response to detected reads or writes to particular cache lines. In one implementation, a cache snooping protocol is implemented over coherence bus 964 to snoop cache accesses.

In one embodiment, a proxy circuit 925 communicatively couples graphics acceleration module 946 to coherence bus 964, allowing graphics acceleration module 946 to participate in a cache coherence protocol as a peer of cores 960A-960D. In particular, an interface 935 provides connectivity to proxy circuit 925 over high-speed link 940 (such as a PCIe bus, NVLink, etc.) and an interface 937 connects graphics acceleration module 946 to link 940.

In one implementation, an accelerator integration circuit 936 provides cache management, memory access, context management, and interrupt management services on behalf of a plurality of graphics processing engines 931, 932, N of graphics acceleration module 946. Graphics processing engines 931, 932, N may each include a separate graphics processing unit (GPU). Alternatively, graphics processing engines 931, 932, N may include different types of graphics processing engines within a GPU such as graphics execution units, media processing engines (such as video encoders/decoders), samplers, and blit engines. In at least one embodiment, graphics acceleration module 946 may be a GPU with a plurality of graphics processing engines 931-932, N or graphics processing engines 931-932, N may be individual GPUs integrated on a common package, line card, or chip. As is the case, the above determination for the reconstruction parameter and the reconstruction algorithm may be performed in GPUs 931-N of FIG. 9B.

In one embodiment, accelerator integration circuit 936 includes a memory management unit (MMU) 939 for performing various memory management functions such as virtual-to-physical memory translations (also referred to as effective-to-real memory translations) and memory access protocols for accessing system memory 914. MMU 939 may also include a translation lookaside buffer (TLB) (not shown) for caching virtual/effective to physical/real address translations. In one implementation, a cache 938 stores commands and data for efficient access by graphics processing engines 931-932, N. In one embodiment, data stored in cache 938 and graphics memories 933-934, M is kept coherent with core caches 962A-962D, 956, and system memory 914. As mentioned above, this may be accomplished via proxy circuit 925 on behalf of cache 938 and memories 933-934, M (such as sending updates to cache 938 related to modifications/accesses of cache lines on processor caches 962A-962D, 956, and receiving updates from cache 938).

A set of registers 945 store context data for threads executed by graphics processing engines 931-932, N and a context management circuit 948 manages thread contexts. In at least one embodiment, context management circuit 948 may perform save and restore operations to save and restore contexts of various threads during contexts switches (such as where a first thread is saved and a second thread is stored so that a second thread can be executed by a graphics processing engine). In at least one embodiment, on a context switch, context management circuit 948 may store current register values to a designated region in memory (such as identified by a context pointer). It may then restore register values when returning to a context. In one embodiment, an interrupt management circuit 947 receives and processes interrupts received from system devices.

In one implementation, virtual/effective addresses from a graphics processing engine 931 are translated to real/physical addresses in system memory 914 by MMU 939. One embodiment of accelerator integration circuit 936 supports multiple (such as 4, 8, 16) graphics accelerator modules 946 and/or other accelerator devices. Graphics accelerator module 946 may be dedicated to a single application executed on processor 907 or may be shared between multiple applications. In one embodiment, a virtualized graphics execution environment is presented in which resources of graphics processing engines 931-932, N are shared with multiple applications or virtual machines (VMs). In at least one embodiment, resources may be subdivided into "slices" which are allocated to different VMs and/or applications based on processing requirements and priorities associated with VMs and/or applications.

In at least one embodiment, accelerator integration circuit 936 performs as a bridge to a system for graphics acceleration module 946 and provides address translation and system memory cache services. In addition, accelerator integration circuit 936 may provide virtualization facilities for a host processor to manage virtualization of graphics processing engines 931-932, N, interrupts, and memory management.

Because hardware resources of graphics processing engines 931-932, N are mapped explicitly to a real address space seen by host processor 907, any host processor can address these resources directly using an effective address value. One function of accelerator integration circuit 936, in one embodiment, is physical separation of graphics processing engines 931-932, N so that they appear to a system as independent units.

In at least one embodiment, one or more graphics memories 933-934, M are coupled to each of graphics processing engines 931-932, N, respectively. Graphics memories 933-934, M store instructions and data being processed by each of graphics processing engines 931-932, N. Graphics memories 933-934, M may be volatile memories such as DRAMs (including stacked DRAMs), GDDR memory (such as GDDR5, GDDR6), or HBM, and/or may be non-volatile memories such as 3D XPoint or Nano-Ram.

In one embodiment, to reduce data traffic over link 940, biasing techniques are used to ensure that data stored in graphics memories 933-934, M is data which will be used most frequently by graphics processing engines 931-932, N and may not used by cores 960A-960D (at least not frequently). Similarly, a biasing mechanism attempts to keep data needed by cores (and may not graphics processing engines 931-932, N) within caches 962A-962D, 956 of cores and system memory 914.

Figure 9C:
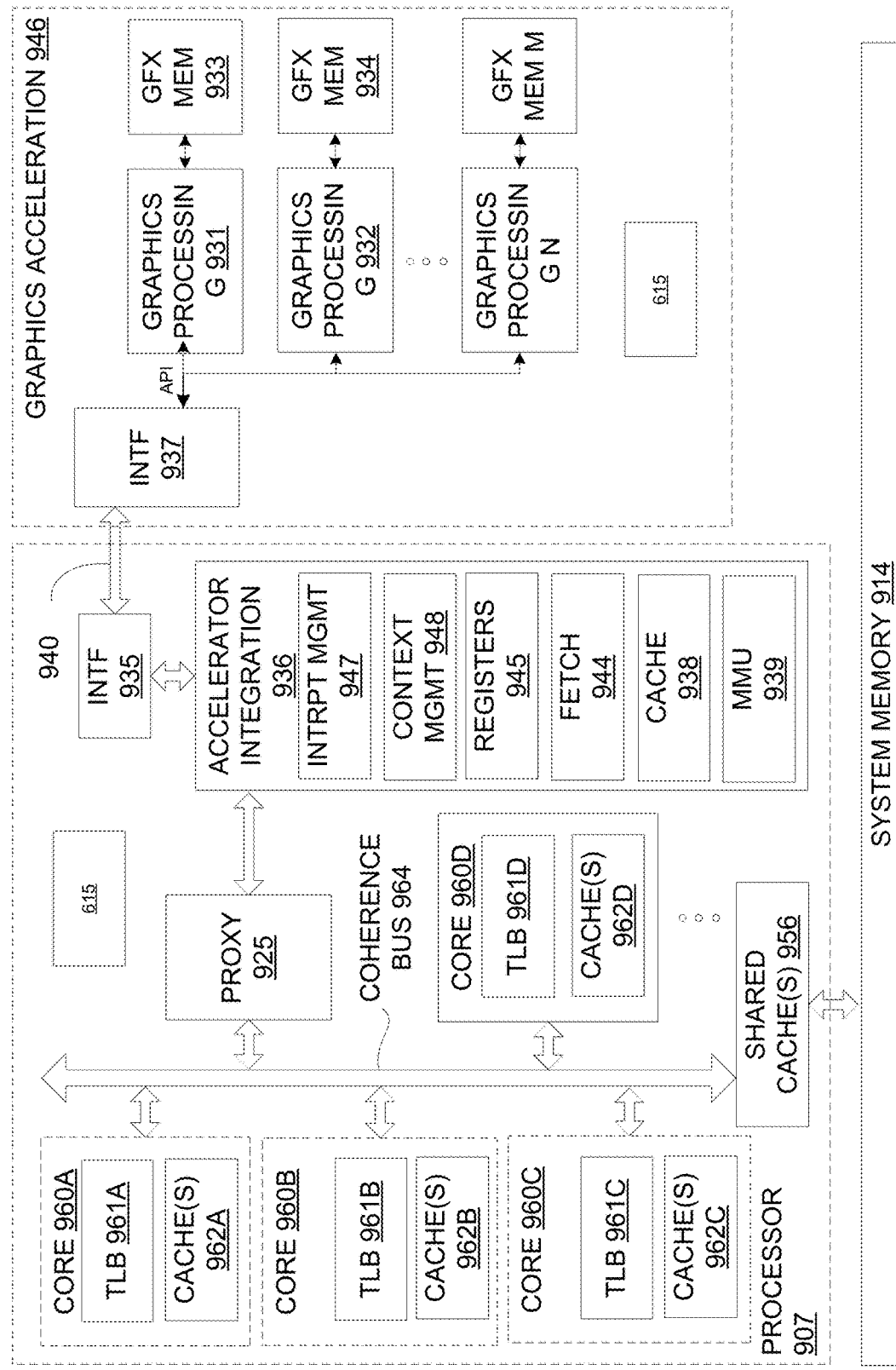
FIG. 9C illustrates another exemplary embodiment in which accelerator integration circuit is integrated within a processor for enabling and/or supporting a remediation system for threshold leaks in a datacenter liquid cooling system, according to at least one embodiment of the disclosure herein.

FIG. 9C illustrates another exemplary embodiment in which accelerator integration circuit 936 is integrated within processor 907 for enabling and/or supporting intelligent control of a remediation system for threshold leaks in a datacenter liquid cooling system, according to at least one embodiment of the disclosure herein. In at least this embodiment, graphics processing engines 931-932, N communicate directly over high-speed link 940 to accelerator integration circuit 936 via interface 937 and interface 935 (which, again, may be utilize any form of bus or interface protocol).

Accelerator integration circuit 936 may perform same operations as those described with respect to FIG. 9B, but potentially at a higher throughput given its close proximity to coherence bus 964 and caches 962A-962D, 956. At least one embodiment supports different programming models including a dedicated-process programming model (no graphics acceleration module virtualization) and shared programming models (with virtualization), which may include programming models which are controlled by accelerator integration circuit 936 and programming models which are controlled by graphics acceleration module 946.

In at least one embodiment, graphics processing engines 931-932, N are dedicated to a single application or process under a single operating system. In at least one embodiment, a single application can funnel other application requests to graphics processing engines 931-932, N, providing virtualization within a VM/partition.

In at least one embodiment, graphics processing engines 931-932, N, may be shared by multiple VM/application partitions. In at least one embodiment, shared models may use a system hypervisor to virtualize graphics processing engines 931-932, N to allow access by each operating system. For single-partition systems without a hypervisor, graphics processing engines 931-932, N are owned by an operating system. In at least one embodiment, an operating system can virtualize graphics processing engines 931-932, N to provide access to each process or application.

In at least one embodiment, graphics acceleration module 946 or an individual graphics processing engine 931-932, N selects a process element using a process handle. In at least one embodiment, process elements are stored in system memory 914 and are addressable using an effective address to real address translation techniques described herein. In at least one embodiment, a process handle may be an implementation-specific value provided to a host process when registering its context with graphics processing engine 931-932, N (that is, calling system software to add a process element to a process element linked list). In at least one embodiment, a lower 16-bits of a process handle may be an offset of a process element within a process element linked list.

Figure 9D:
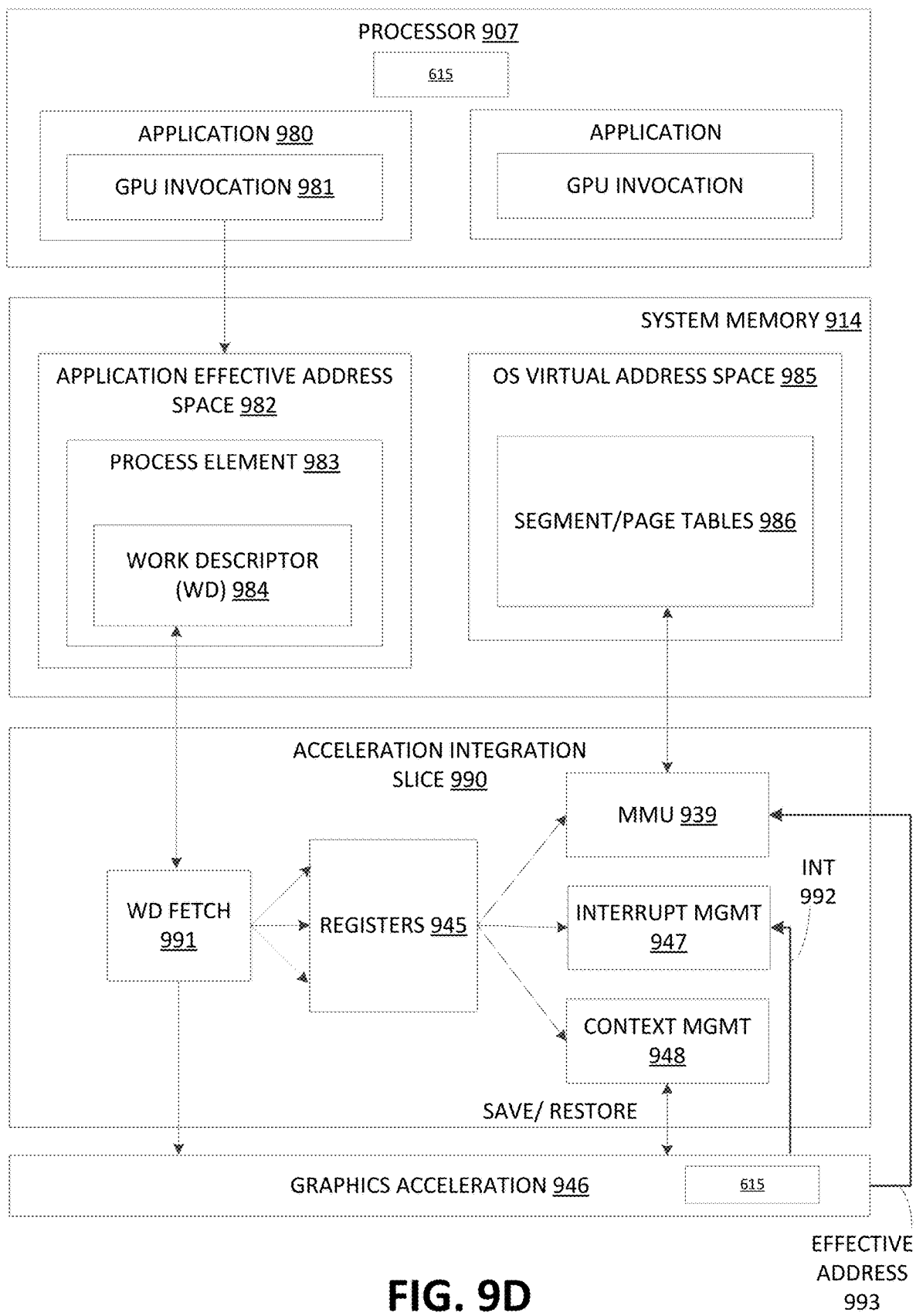
FIG. 9D illustrates an exemplary accelerator integration slice 990 for enabling and/or supporting a remediation system for threshold leaks in a datacenter liquid cooling system, according to at least one embodiment of the disclosure herein.

FIG. 9D illustrates an exemplary accelerator integration slice 990 for enabling and/or supporting intelligent control of a remediation system for threshold leaks in a datacenter liquid cooling system, according to at least one embodiment of the disclosure herein. As used herein, a "slice" comprises a specified portion of processing resources of accelerator integration circuit 936. Application effective address space 982 within system memory 914 stores process elements 983. In one embodiment, process elements 983 are stored in response to GPU invocations 981 from applications 980 executed on processor 907. A process element 983 contains process state for corresponding application 980. A work descriptor (WD) 984 contained in process element 983 can be a single job requested by an application or may contain a pointer to a queue of jobs. In at least one embodiment, WD 984 is a pointer to a job request queue in an application's address space 982.

Graphics acceleration module 946 and/or individual graphics processing engines 931-932, N can be shared by all or a subset of processes in a system. In at least one embodiment, an infrastructure for setting up process state and sending a WD 984 to a graphics acceleration module 946 to start a job in a virtualized environment may be included.

In at least one embodiment, a dedicated-process programming model is implementation-specific. In this model, a single process owns graphics acceleration module 946 or an individual graphics processing engine 931. Because graphics acceleration module 946 is owned by a single process, a hypervisor initializes accelerator integration circuit 936 for an owning partition and an operating system initializes accelerator integration circuit 936 for an owning process when graphics acceleration module 946 is assigned.

In operation, a WD fetch unit 991 in accelerator integration slice 990 fetches next WD 984 which includes an indication of work to be done by one or more graphics processing engines of graphics acceleration module 946. Data from WD 984 may be stored in registers 945 and used by MMU 939, interrupt management circuit 947, and/or context management circuit 948 as illustrated. In at least one embodiment, one embodiment of MMU 939 includes segment/page walk circuitry for accessing segment/page tables 986 within OS virtual address space 985. Interrupt management circuit 947 may process interrupt events 992 received from graphics acceleration module 946. When performing graphics operations, an effective address 993 generated by a graphics processing engine 931-932, N is translated to a real address by MMU 939.

In one embodiment, a same set of registers 945 are duplicated for each graphics processing engine 931-932, N and/or graphics acceleration module 946 and may be initialized by a hypervisor or operating system. Each of these duplicated registers may be included in an accelerator integration slice 990. Exemplary registers that may be initialized by a hypervisor are shown in Table 1.

TABLE 1

| | Hypervisor Initialized Registers |
|---|---|
| 1 | Slice Control Register |
| 2 | Real Address (RA) Scheduled Processes Area Pointer |
| 3 | Authority Mask Override Register |
| 4 | Interrupt Vector Table Entry Offset |
| 5 | Interrupt Vector Table Entry Limit |
| 6 | State Register |
| 7 | Logical Partition ID |
| 8 | Real address (RA) Hypervisor Accelerator Utilization Record Pointer |

Exemplary registers that may be initialized by an operating system are shown in Table 2.

TABLE 2

| | Operating System Initialized Registers |
|---|---|
| 1 | Process and Thread Identification |
| 2 | Effective Address (EA) Context Save/Restore Pointer |
| 3 | Virtual Address (VA) Accelerator Utilization Record Pointer |
| 4 | Virtual Address (VA) Storage Segment Table Pointer |
| 5 | Authority Mask |
| 6 | Work descriptor |

In one embodiment, each WD 984 is specific to a particular graphics acceleration module 946 and/or graphics processing engines 931-932, N. It contains all information required by a graphics processing engine 931-932, N to do work or it can be a pointer to a memory location where an application has set up a command queue of work to be completed.

Figure 9E:
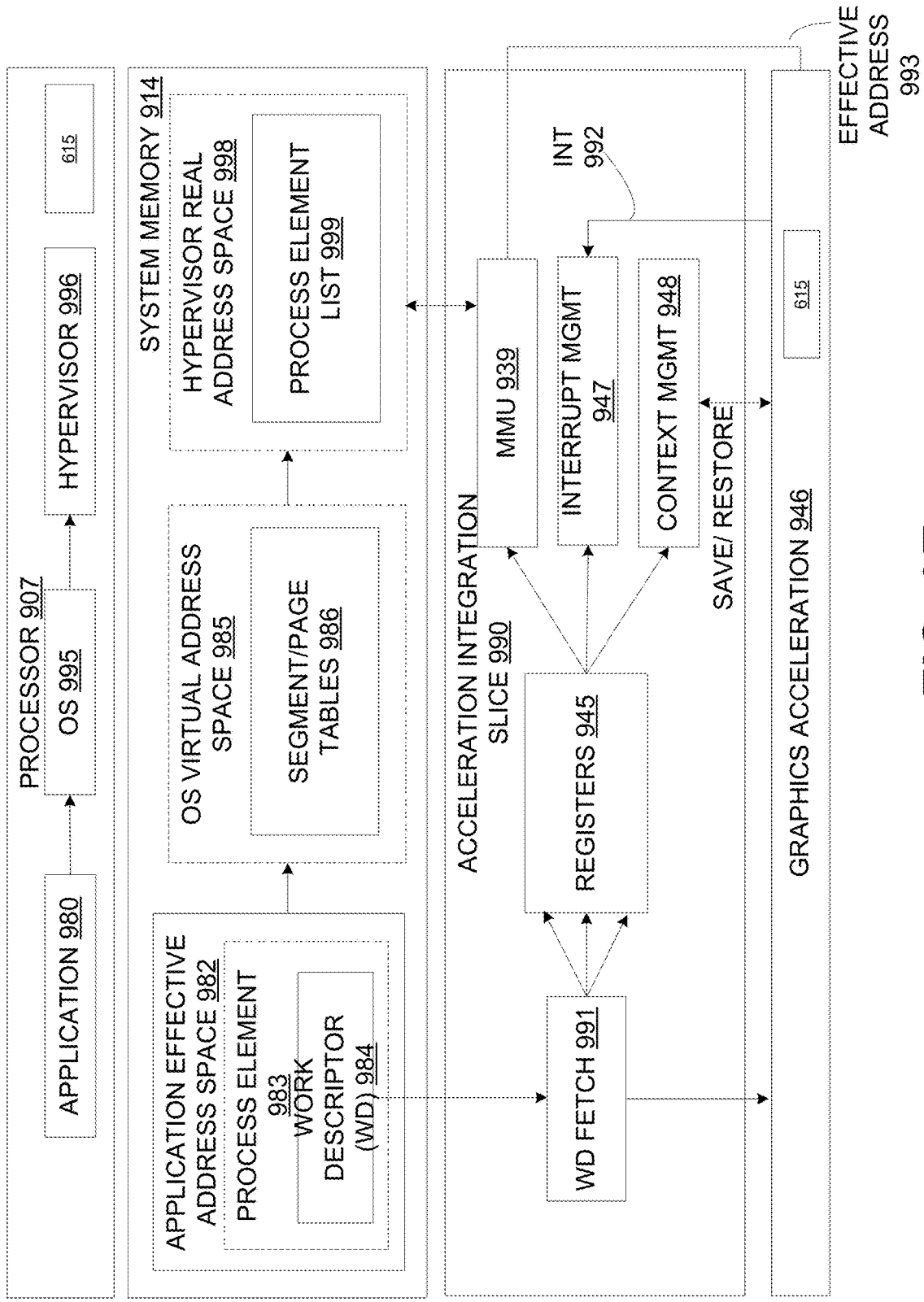
FIG. 9E illustrates additional details for one exemplary embodiment of a shared model. to enable and/or support a remediation system for threshold leaks in a datacenter liquid cooling system, according to at least one embodiment of the disclosure herein.

FIG. 9E illustrates additional details for one exemplary embodiment of a shared model. This embodiment includes a hypervisor real address space 998 in which a process element list 999 is stored. Hypervisor real address space 998 is accessible via a hypervisor 996 which virtualizes graphics acceleration module engines for operating system 995.

In at least one embodiment, shared programming models allow for all or a subset of processes from all or a subset of partitions in a system to use a graphics acceleration module 946. There are two programming models where graphics acceleration module 946 is shared by multiple processes and partitions: time-sliced shared and graphics-directed shared.

In this model, system hypervisor 996 owns graphics acceleration module 946 and makes its function available to all operating systems 995. For a graphics acceleration module 946 to support virtualization by system hypervisor 996, graphics acceleration module 946 may adhere to the following: 1) An application's job request must be autonomous (that is, state does not need to be maintained between jobs), or graphics acceleration module 946 must provide a context save and restore mechanism. 2) An application's job request is guaranteed by graphics acceleration module 946 to complete in a specified amount of time, including any translation faults, or graphics acceleration module 946 provides an ability to preempt processing of a job. 3) Graphics acceleration module 946 must be guaranteed fairness between processes when operating in a directed shared programming model.

In at least one embodiment, application 980 is required to make an operating system 995 system call with a graphics acceleration module 946 type, a work descriptor (WD), an authority mask register (AMR) value, and a context save/restore area pointer (CSRP). In at least one embodiment, graphics acceleration module 946 type describes a targeted acceleration function for a system call. In at least one embodiment, graphics acceleration module 946 type may be a system-specific value. In at least one embodiment, WD is formatted specifically for graphics acceleration module 946 and can be in a form of a graphics acceleration module 946 command, an effective address pointer to a user-defined structure, an effective address pointer to a queue of commands, or any other data structure to describe work to be done by graphics acceleration module 946. In one embodiment, an AMR value is an AMR state to use for a current process. In at least one embodiment, a value passed to an operating system is similar to an application setting an AMR. If accelerator integration circuit 936 and graphics acceleration module 946 implementations do not support a User Authority Mask Override Register (UAMOR), an operating system may apply a current UAMOR value to an AMR value before passing an AMR in a hypervisor call. Hypervisor 996 may, in at least one embodiment, apply a current Authority Mask Override Register (AMOR) value before placing an AMR into process element 983. In at least one embodiment, CSRP is one of registers 945 containing an effective address of an area in an application's effective address space 982 for graphics acceleration module 946 to save and restore context state. This pointer is used in at least one embodiment, if no state is required to be saved between jobs or when a job is preempted. In at least one embodiment, context save/restore area may be pinned system memory.

Upon receiving a system call, operating system 995 may verify that application 980 has registered and been given authority to use graphics acceleration module 946. Operating system 995 then calls hypervisor 996 with information shown in Table 3.

TABLE 3

OS to Hypervisor Call Parameters

| 1 | A work descriptor (WD) |
| 2 | An Authority Mask Register (AMR) value (potentially masked) |
| 3 | An effective address (EA) Context Save/Restore Area Pointer (CSRP) |
| 4 | A process ID (PID) and optional thread ID (TID) |
| 5 | A virtual address (VA) accelerator utilization record pointer (AURP) |
| 6 | Virtual address of storage segment table pointer (SSTP) |
| 7 | A logical interrupt service number (LISN) |

Upon receiving a hypervisor call, hypervisor 996 verifies that operating system 995 has registered and been given authority to use graphics acceleration module 946. Hypervisor 996 then puts process element 983 into a process element linked list for a corresponding graphics acceleration module 946 type. A process element may include information shown in Table 4.

TABLE 4

Process Element Information

| 1 | A work descriptor (WD) |
| 2 | An Authority Mask Register (AMR) value (potentially masked). |
| 3 | An effective address (EA) Context Save/Restore Area Pointer (CSRP) |
| 4 | A process ID (PID) and optional thread ID (TID) |
| 5 | A virtual address (VA) accelerator utilization record pointer (AURP) |
| 6 | Virtual address of storage segment table pointer (SSTP) |
| 7 | A logical interrupt service number (LISN) |
| 8 | Interrupt vector table, derived from hypervisor call parameters |
| 9 | A state register (SR) value |
| 10 | A logical partition ID (LPID) |
| 11 | A real address (RA) hypervisor accelerator utilization record pointer |
| 12 | Storage Descriptor Register (SDR) |

In at least one embodiment, hypervisor initializes a plurality of accelerator integration slice 990 registers 945.

Figure 9F:
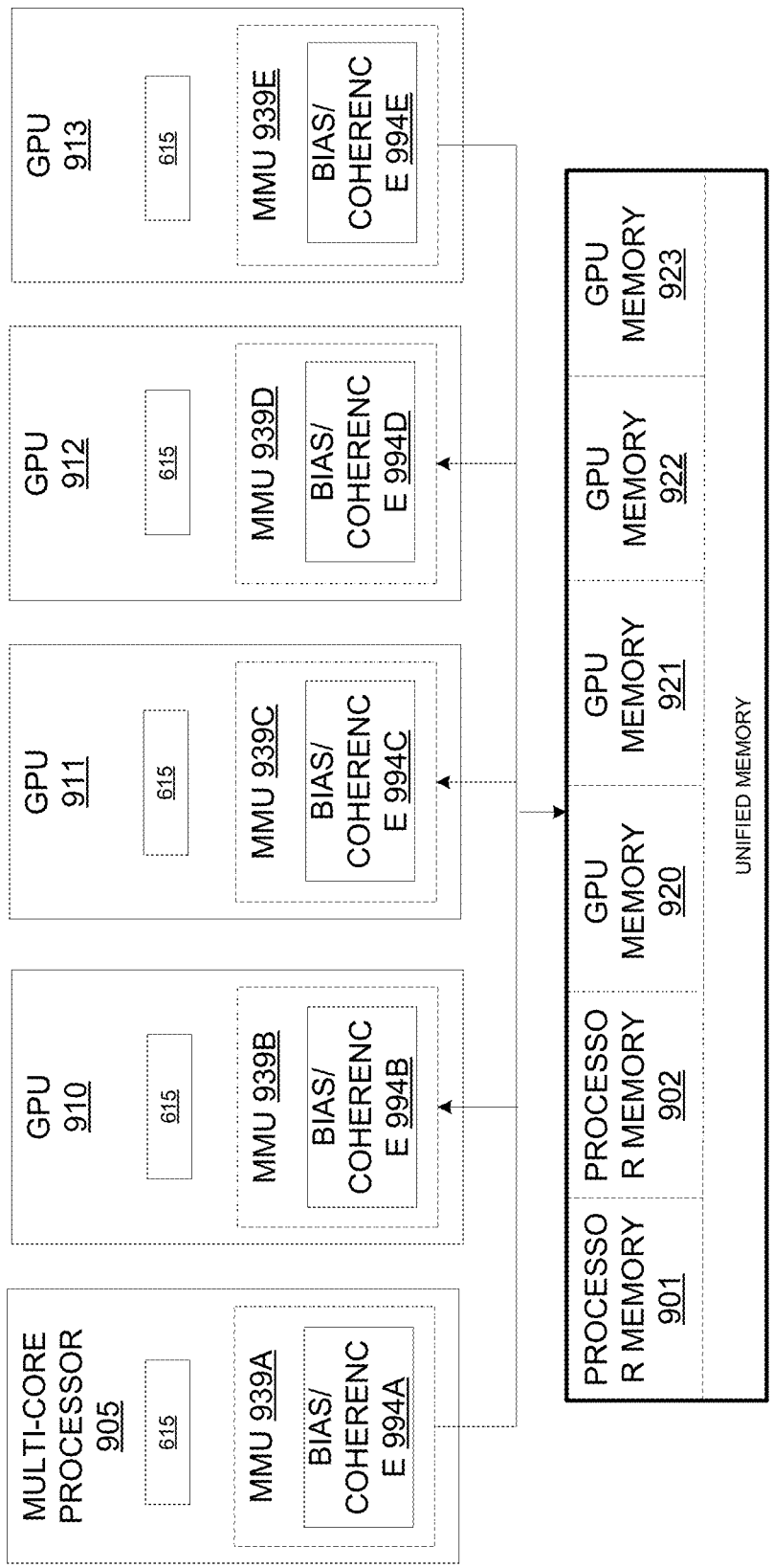
FIG. 9F illustrates additional details for one exemplary embodiment of a unified memory, addressable via a common virtual memory address space used to access physical processor memories and GPU memories to enable and/or support a remediation system for threshold leaks in a datacenter liquid cooling system, according to at least one embodiment of the disclosure herein.

As illustrated in FIG. 9F, in at least one embodiment, a unified memory is used, addressable via a common virtual memory address space used to access physical processor memories 901-902 and GPU memories 920-923. In this implementation, operations executed on GPUs 910-913 utilize a same virtual/effective memory address space to access processor memories 901-902 and vice versa, thereby simplifying programmability. In one embodiment, a first portion of a virtual/effective address space is allocated to processor memory 901, a second portion to second processor memory 902, a third portion to GPU memory 920, and so on. In at least one embodiment, an entire virtual/effective memory space (sometimes referred to as an effective address space) is thereby distributed across each of processor memories 901-902 and GPU memories 920-923, allowing any processor or GPU to access any physical memory with a virtual address mapped to that memory.

In one embodiment, bias/coherence management circuitry 994A-994E within one or more of MMUs 939A-939E ensures cache coherence between caches of one or more host processors (such as 905) and GPUs 910-913 and implements biasing techniques indicating physical memories in which certain types of data should be stored. While multiple instances of bias/coherence management circuitry 994A-994E are illustrated in FIG. 9F, bias/coherence circuitry may be implemented within an MMU of one or more host processors 905 and/or within accelerator integration circuit 936.

One embodiment allows GPU-attached memory 920-923 to be mapped as part of system memory, and accessed using shared virtual memory (SVM) technology, but without suffering performance drawbacks associated with full system cache coherence. In at least one embodiment, an ability for GPU-attached memory 920-923 to be accessed as system memory without onerous cache coherence overhead provides a beneficial operating environment for GPU offload. This arrangement allows host processor 905 software to setup operands and access computation results, without overhead of tradition I/O DMA data copies. Such traditional copies involve driver calls, interrupts and memory mapped I/O (MMIO) accesses that are all inefficient relative to simple memory accesses. In at least one embodiment, an ability to access GPU attached memory 920-923 without cache coherence overheads can be critical to execution time of an offloaded computation. In cases with substantial streaming write memory traffic, for example, cache coherence overhead can significantly reduce an effective write bandwidth seen by a GPU 910-913. In at least one embodiment, efficiency of operand setup, efficiency of results access, and efficiency of GPU computation may play a role in determining effectiveness of a GPU offload.

In at least one embodiment, selection of GPU bias and host processor bias is driven by a bias tracker data structure. A bias table may be used, for example, which may be a page-granular structure (in at least one embodiment this may be controlled at a granularity of a memory page) that includes 1 or 2 bits per GPU-attached memory page. In at least one embodiment, a bias table may be implemented in a stolen memory range of one or more GPU-attached memories 920-923, with or without a bias cache in GPU 910-913 (such as to cache frequently/recently used entries of a bias table). Alternatively, an entire bias table may be maintained within a GPU.

In at least one embodiment, a bias table entry associated with each access to GPU-attached memory 920-923 is accessed prior to actual access to a GPU memory, causing the following operations. First, local requests from GPU 910-913 that find their page in GPU bias are forwarded directly to a corresponding GPU memory 920-923. Local requests from a GPU that find their page in host bias are forwarded to processor 905 (such as over a high-speed link as discussed above). In one embodiment, requests from processor 905 that find a requested page in host processor bias complete a request like a normal memory read. Alternatively, requests directed to a GPU-biased page may be forwarded to GPU 910-913. In at least one embodiment, a GPU may then transition a page to a host processor bias if it is not currently using a page. In at least one embodiment, bias state of a page can be changed either by a software-based mechanism, a hardware-assisted software-based mechanism, or, for a limited set of cases, a purely hardware-based mechanism.

One mechanism for changing bias state employs an API call (such as OpenCL), which, in turn, calls a GPU's device driver which, in turn, sends a message (or enqueues a command descriptor) to a GPU directing it to change a bias state and, for some transitions, perform a cache flushing operation in a host. In at least one embodiment, cache flushing operation is used for a transition from host processor 905 bias to GPU bias, but is not for an opposite transition.

In one embodiment, cache coherency is maintained by temporarily rendering GPU-biased pages uncacheable by host processor 905. To access these pages, processor 905 may request access from GPU 910 which may or may not grant access right away. Thus, to reduce communication between processor 905 and GPU 910 it is beneficial to ensure that GPU-biased pages are those which are required by a GPU but not host processor 905 and vice versa.

Inference and/or training logic 615 are used to perform one or more embodiments. Details regarding the inference and/or training logic 615 are provided below in conjunction with FIGS. 6B and/or 6C.

Figure 10A:
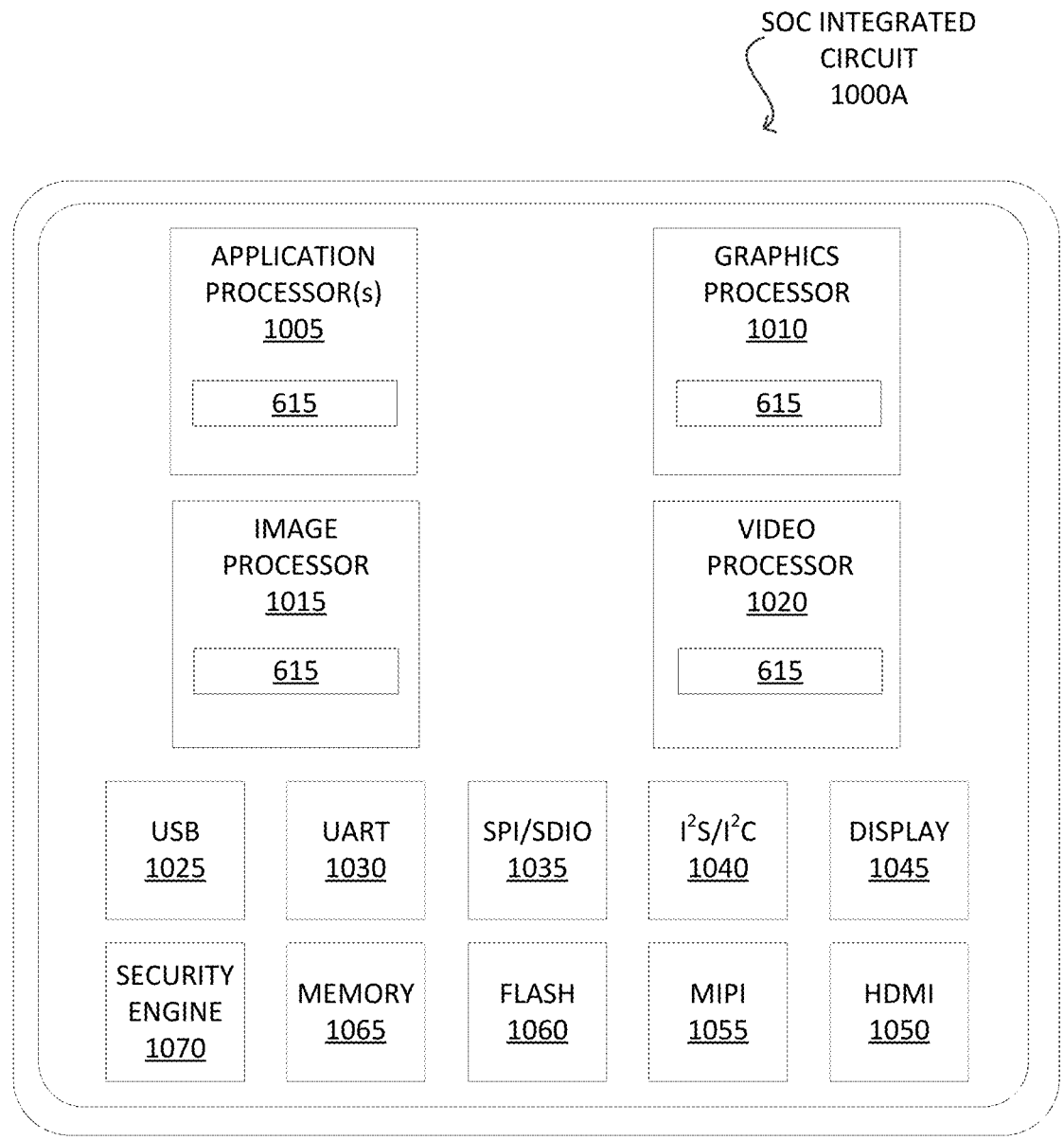
FIG. 10A illustrates exemplary integrated circuits and associated graphics processors, according to embodiments described herein for a remediation system for threshold leaks in a datacenter liquid cooling system.

FIG. 10A illustrates exemplary integrated circuits and associated graphics processors that may be fabricated using one or more IP cores, according to various embodiments described herein, to support and/or to enable a remediation system for threshold leaks in a datacenter liquid cooling system as described herein. In addition to what is illustrated, other logic and circuits may be included in at least one embodiment, including additional graphics processors/cores, peripheral interface controllers, or general-purpose processor cores.

FIG. 10A is a block diagram illustrating an exemplary system on a chip integrated circuit 1000A that may be fabricated using one or more IP cores, according to at least one embodiment. In at least one embodiment, integrated circuit 1000A includes one or more application processor(s) 1005 (such as CPUs), at least one graphics processor 1010, and may additionally include an image processor 1015 and/or a video processor 1020, any of which may be a modular IP core. In at least one embodiment, integrated circuit 1000A includes peripheral or bus logic including a USB controller 1025, UART controller 1030, an SPI/SDIO controller 1035, and an $I^2S/I^2C$ controller 1040. In at least one embodiment, integrated circuit 1000A can include a display device 1045 coupled to one or more of a high-definition multimedia interface (HDMI) controller 1050 and a mobile industry processor interface (MIPI) display interface 1055. In at least one embodiment, storage may be provided by a flash memory subsystem 1060 including flash memory and a flash memory controller. In at least one embodiment, memory interface may be provided via a memory controller 1065 for access to SDRAM or SRAM memory devices. In at least one embodiment, some integrated circuits additionally include an embedded security engine 1070.

Inference and/or training logic 615 are used to perform inferencing and/or training operations associated with one or more embodiments. Details regarding inference and/or training logic 615 are provided below in conjunction with FIGS. 6B and/or 6C. In at least one embodiment, inference and/or training logic 615 may be used in integrated circuit 1000A for inferencing or predicting operations based, at least in part, on weight parameters calculated using neural network training operations, neural network functions and/or architectures, or neural network use cases described herein.

Figure 10B:
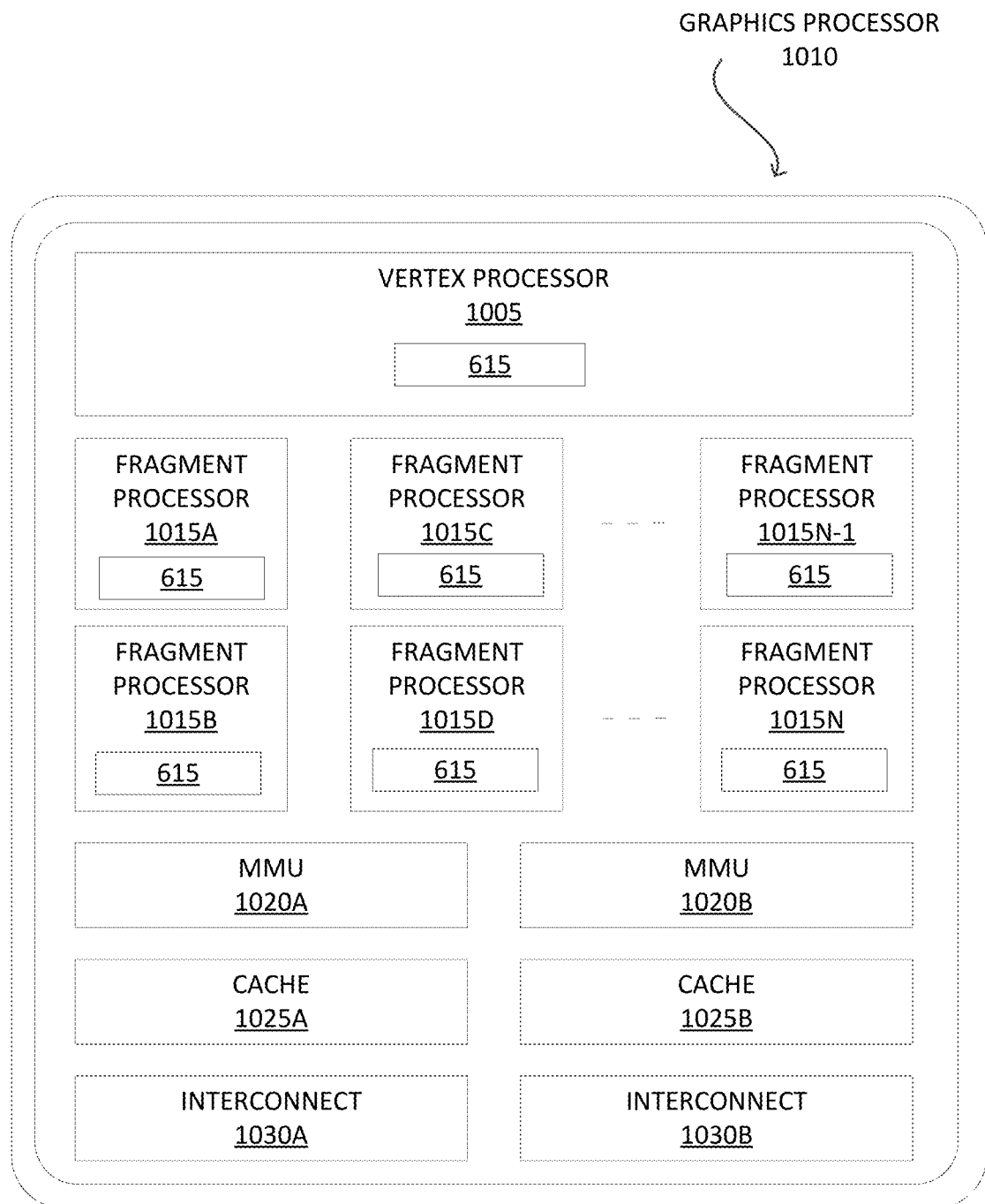
FIGS. 10B-10C illustrate exemplary integrated circuits and associated graphics processors, according to at least one embodiment, to support and/or to enable a remediation system for threshold leaks in a datacenter liquid cooling system.
Figure 10C:
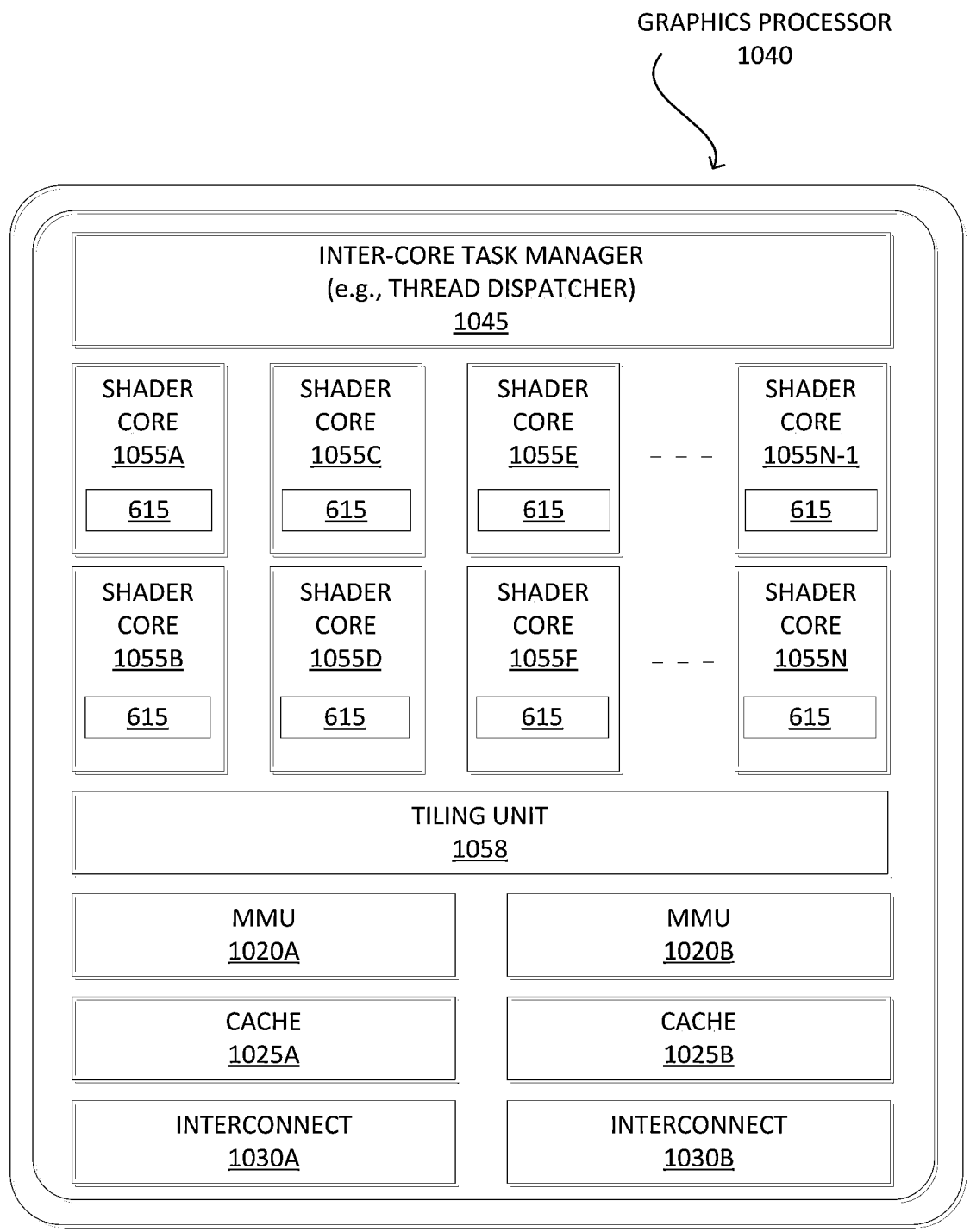

FIGS. 10B-10C illustrate exemplary integrated circuits and associated graphics processors that may be fabricated using one or more IP cores, according to various embodiments described herein to support and/or to enable a remediation system for threshold leaks in a datacenter liquid cooling system as described herein. In addition to what is illustrated, other logic and circuits may be included in at least one embodiment, including additional graphics processors/cores, peripheral interface controllers, or general-purpose processor cores.

FIGS. 10B-10C are block diagrams illustrating exemplary graphics processors for use within an SoC, according to embodiments described herein, to support and/or to enable a remediation system for threshold leaks in a datacenter liquid cooling system as described herein. In an example, the graphic processors may be used in the intelligent control of a remediation system for threshold leaks in a datacenter liquid cooling system because of existing math engines capable of faster processing of multi-level neural networks. FIG. 10B illustrates an exemplary graphics processor 1010 of a system on a chip integrated circuit that may be fabricated using one or more IP cores, according to at least one embodiment. FIG. 10C illustrates an additional exemplary graphics processor 1040 of a system on a chip integrated circuit that may be fabricated using one or more IP cores, according to at least one embodiment. In at least one embodiment, graphics processor 1010 of FIG. 10A is a low power graphics processor core. In at least one embodiment, graphics processor 1040 of FIG. 10C is a higher performance graphics processor core. In at least one embodiment, each of graphics processors 1010, 1040 can be variants of graphics processor 1010 of FIG. 10A.

In at least one embodiment, graphics processor 1010 includes a vertex processor 1005 and one or more fragment processor(s) 1015A-1015N (such as 1015A, 1015B, 1015C, 1015D, through 1015N-1, and 1015N). In at least one embodiment, graphics processor 1010 can execute different shader programs via separate logic, such that vertex processor 1005 is optimized to execute operations for vertex shader programs, while one or more fragment processor(s) 1015A-1015N execute fragment (such as pixel) shading operations for fragment or pixel shader programs. In at least one embodiment, vertex processor 1005 performs a vertex processing stage of a 3D graphics pipeline and generates primitives and vertex data. In at least one embodiment, fragment processor(s) 1015A-1015N use primitive and vertex data generated by vertex processor 1005 to produce a framebuffer that is displayed on a display device. In at least one embodiment, fragment processor(s) 1015A-1015N are optimized to execute fragment shader programs as provided for in an OpenGL API, which may be used to perform similar operations as a pixel shader program as provided for in a Direct 3D API.

In at least one embodiment, graphics processor 1010 additionally includes one or more memory management units (MMUs) 1020A-1020B, cache(s) 1025A-1025B, and circuit interconnect(s) 1030A-1030B. In at least one embodiment, one or more MMU(s) 1020A-1020B provide for virtual to physical address mapping for graphics processor 1010, including for vertex processor 1005 and/or fragment processor(s) 1015A-1015N, which may reference vertex or image/texture data stored in memory, in addition to vertex or image/texture data stored in one or more cache(s) 1025A-1025B. In at least one embodiment, one or more MMU(s) 1020A-1020B may be synchronized with other MMUs within system, including one or more MMUs associated with one or more application processor(s) 1005, image processors 1015, and/or video processors 1020 of FIG. 10A, such that each processor 1005-1020 can participate in a shared or unified virtual memory system. In at least one embodiment, one or more circuit interconnect(s) 1030A-1030B enable graphics processor 1010 to interface with other IP cores within SoC, either via an internal bus of SoC or via a direct connection.

In at least one embodiment, graphics processor 1040 includes one or more MMU(s) 1020A-1020B, cache(s) 1025A-1025B, and circuit interconnect(s) 1030A-1030B of graphics processor 1010 of FIG. 10A. In at least one embodiment, graphics processor 1040 includes one or more shader core(s) 1055A-1055N (such as 1055A, 1055B, 1055C, 1055D, 1055E, 1055F, through 1055N-1, and 1055N), which provides for a unified shader core architecture in which a single core or type or core can execute all types of programmable shader code, including shader program code to implement vertex shaders, fragment shaders, and/or compute shaders. In at least one embodiment, a number of shader cores can vary. In at least one embodiment, graphics processor 1040 includes an inter-core task manager 1045, which acts as a thread dispatcher to dispatch execution threads to one or more shader cores 1055A-1055N and a tiling unit 1058 to accelerate tiling operations for tile-based rendering, in which rendering operations for a scene are subdivided in image space, for example to exploit local spatial coherence within a scene or to optimize use of internal caches.

Inference and/or training logic 615 are used to perform inferencing and/or training operations associated with one or more embodiments. Details regarding inference and/or training logic 615 are provided below in conjunction with FIGS. 6B and/or 6C. In at least one embodiment, inference and/or training logic 615 may be used in integrated circuit 10A and/or 10B for inferencing or predicting operations based, at least in part, on weight parameters calculated using neural network training operations, neural network functions and/ or architectures, or neural network use cases described herein.

Figure 10D:
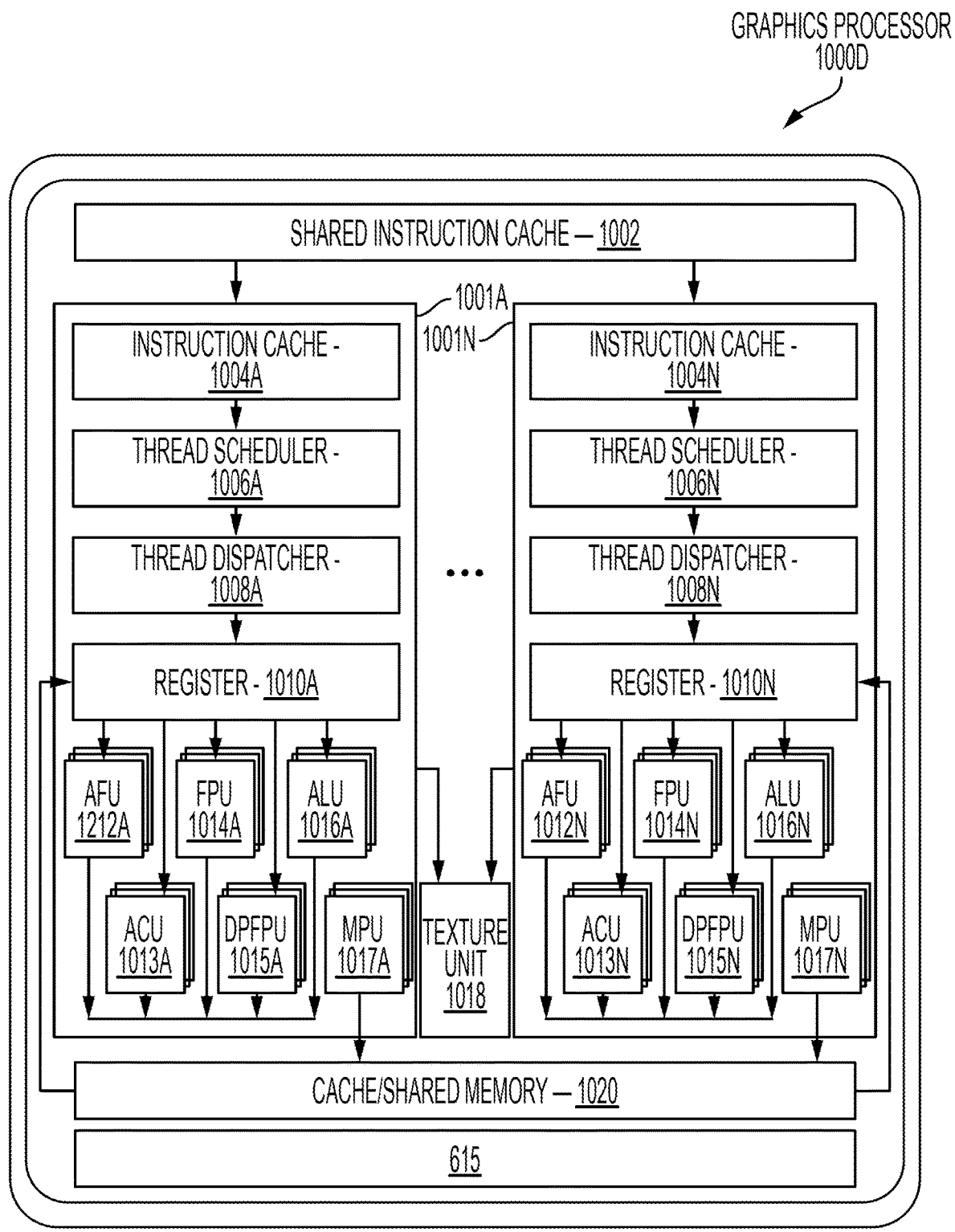
FIGS. 10D-10E illustrate additional exemplary graphics processor logic, according to at least one embodiment, to support and/or to enable a remediation system for threshold leaks in a datacenter liquid cooling system.
Figure 10E:
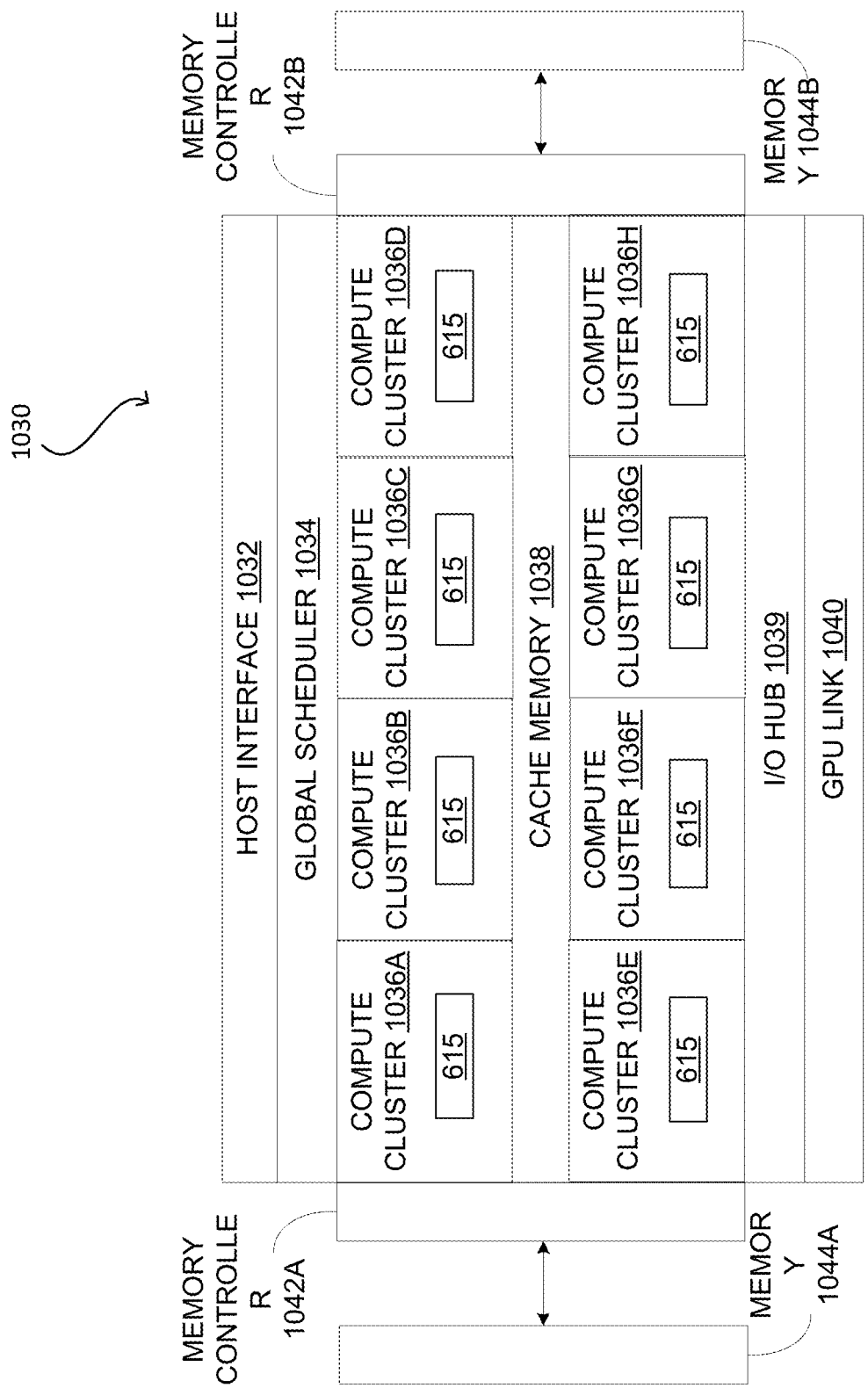

FIGS. 10D-10E illustrate additional exemplary graphics processor logic according to embodiments described herein to support and/or to enable a remediation system for threshold leaks in a datacenter liquid cooling system as described herein. FIG. 10D illustrates a graphics core 1000D that may be included within graphics processor 1010 of FIG. 10A, at least one embodiment, and may be a unified shader core 1055A-1055N as in FIG. 10C in at least one embodiment. FIG. 10B illustrates a highly-parallel general-purpose graphics processing unit 1030 suitable for deployment on a multi-chip module in at least one embodiment.

In at least one embodiment, graphics core 1000D can include multiple slices 1001A-1001N or partition for each core, and a graphics processor can include multiple instances of graphics core 1000D. Slices 1001A-1001N can include support logic including a local instruction cache 1004A-1004N, a thread scheduler 1006A-1006N, a thread dispatcher 1008A-1008N, and a set of registers 1010A-1010N. In at least one embodiment, slices 1001A-1001N can include a set of additional function units (AFUs 1012A-1012N), floating-point units (FPU 1014A-1014N), integer arithmetic logic units (ALUs 1016-1016N), address computational units (ACU 1013A-1013N), double-precision floating-point units (DPFPU 1015A-1015N), and matrix processing units (MPU 1017A-1017N).

In at least one embodiment, FPUs 1014A-1014N can perform single-precision (32-bit) and half-precision (16-bit) floating point operations, while DPFPUs 1015A-1015N perform double precision (64-bit) floating point operations. In at least one embodiment, ALUs 1016A-1016N can perform variable precision integer operations at 8-bit, 16-bit, and 32-bit precision, and can be configured for mixed precision operations. In at least one embodiment, MPUs 1017A-1017N can also be configured for mixed precision matrix operations, including half-precision floating point and 8-bit integer operations. In at least one embodiment, MPUs 1017A-1017N can perform a variety of matrix operations to accelerate machine learning application frameworks, including enabling support for accelerated general matrix to matrix multiplication (GEMM). In at least one embodiment, AFUs 1012A-1012N can perform additional logic operations not supported by floating-point or integer units, including trigonometric operations (such as Sine, Cosine, etc.).

As discussed elsewhere in this disclosure, inference and/or training logic 615 (referenced at least in FIGS. 6B, 6C) may be used to perform inferencing and/or training operations associated with one or more embodiments. Details regarding inference and/or training logic 615 are provided below in conjunction with FIGS. 6B and/or 6C. In at least one embodiment, inference and/or training logic 615 may be used in graphics core 1000D for inferencing or predicting operations based, at least in part, on weight parameters calculated using neural network training operations, neural network functions and/or architectures, or neural network use cases described herein.

Figure 11A:
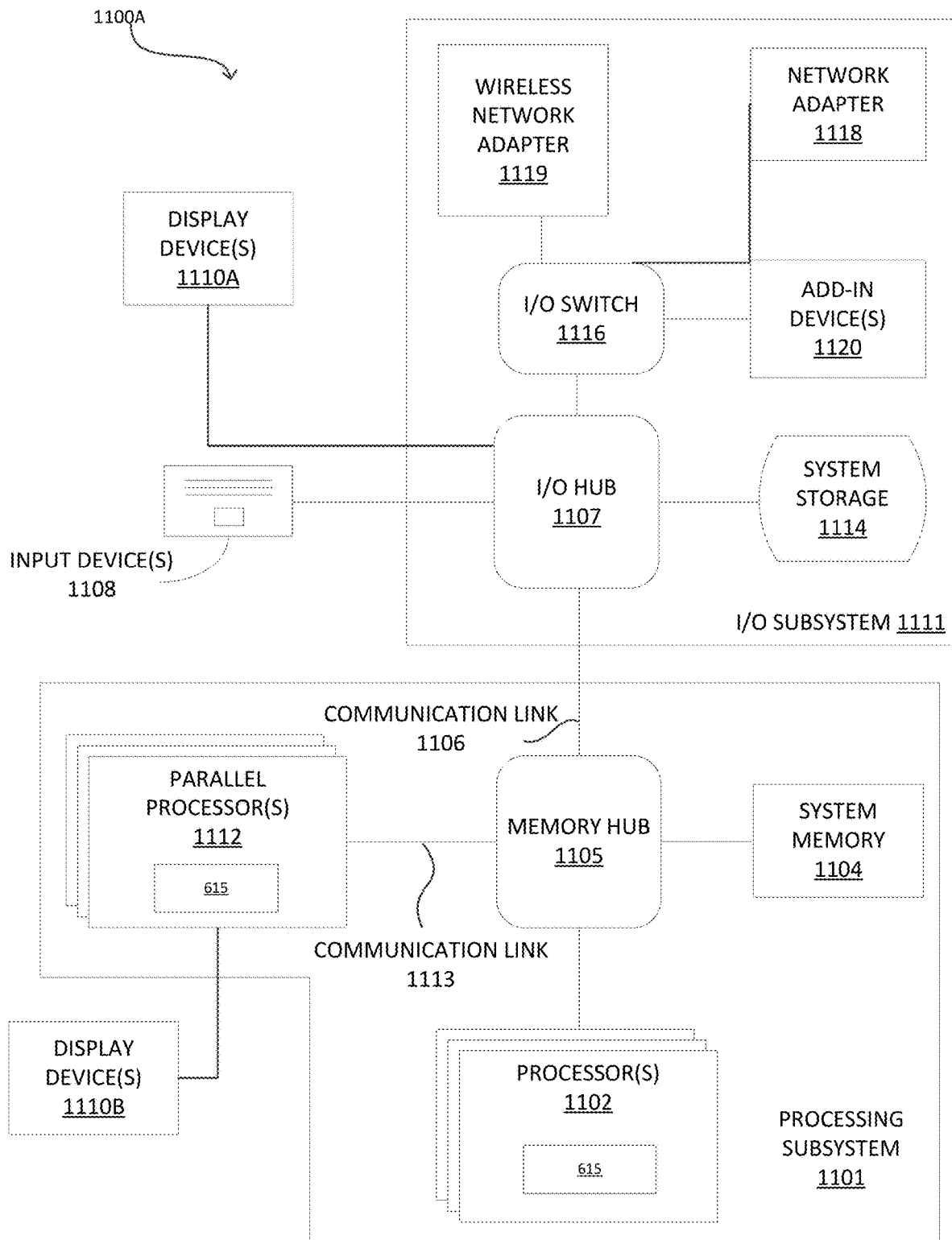
FIG. 11A is a block diagram illustrating a computing system to support and/or to enable a remediation system for threshold leaks in a datacenter liquid cooling system, according to at least one embodiment.

FIG. 11A is a block diagram illustrating a computing system 1100A according to at least one embodiment. In at least one embodiment, computing system 1100A includes a processing subsystem 1101 having one or more processor(s) 1102 and a system memory 1104 communicating via an interconnection path that may include a memory hub 1105. In at least one embodiment, memory hub 1105 may be a separate component within a chipset component or may be integrated within one or more processor(s) 1102. In at least one embodiment, memory hub 1105 couples with an I/O subsystem 1111 via a communication link 1106. In at least one embodiment, I/O subsystem 1111 includes an I/O hub 1107 that can enable computing system 1100A to receive input from one or more input device(s) 1108. In at least one embodiment, I/O hub 1107 can enable a display controller, which may be included in one or more processor(s) 1102, to provide outputs to one or more display device(s) 1110A. In at least one embodiment, one or more display device(s) 1110A coupled with I/O hub 1107 can include a local, internal, or embedded display device.

In at least one embodiment, processing subsystem 1101 includes one or more parallel processor(s) 1112 coupled to memory hub 1105 via a bus or other communication link 1113. In at least one embodiment, communication link 1113 may be one of any number of standards based communication link technologies or protocols, such as but not limited to PCI Express, or may be a vendor specific communications interface or communications fabric. In at least one embodiment, one or more parallel processor(s) 1112 form a computationally focused parallel or vector processing system that can include a large number of processing cores and/or processing clusters, such as a many integrated core (MIC) processor. In at least one embodiment, one or more parallel processor(s) 1112 form a graphics processing subsystem that can output pixels to one of one or more display device(s) 1110A coupled via I/O Hub 1107. In at least one embodiment, one or more parallel processor(s) 1112 can also include a display controller and display interface (not shown) to enable a direct connection to one or more display device(s) 1110B.

In at least one embodiment, a system storage unit 1114 can connect to I/O hub 1107 to provide a storage mechanism for computing system 1100A. In at least one embodiment, an I/O switch 1116 can be used to provide an interface mechanism to enable connections between I/O hub 1107 and other components, such as a network adapter 1118 and/or wireless network adapter 1119 that may be integrated into a platform(s), and various other devices that can be added via one or more add-in device(s) 1120. In at least one embodiment, network adapter 1118 can be an Ethernet adapter or another wired network adapter. In at least one embodiment, wireless network adapter 1119 can include one or more of a Wi-Fi, Bluetooth, near field communication (NFC), or other network device that includes one or more wireless radios.

In at least one embodiment, computing system 1100A can include other components not explicitly shown, including USB or other port connections, optical storage drives, video capture devices, and so on, may also be connected to I/O hub 1107. In at least one embodiment, communication paths interconnecting various components in FIG. 11A may be implemented using any suitable protocols, such as PCI (Peripheral Component Interconnect) based protocols (such as PCI-Express), or other bus or point-to-point communication interfaces and/or protocol(s), such as NV-Link high-speed interconnect, or interconnect protocols.

In at least one embodiment, one or more parallel processor(s) 1112 incorporate circuitry optimized for graphics and video processing, including, for example, video output circuitry, and constitutes a graphics processing unit (GPU). In at least one embodiment, one or more parallel processor(s) 1112 incorporate circuitry optimized for general purpose processing. In at least one embodiment, components of computing system 1100A may be integrated with one or more other system elements on a single integrated circuit. In at least one embodiment, in at least one embodiment, one or more parallel processor(s) 1112, memory hub 1105, processor(s) 1102, and I/O hub 1107 can be integrated into a system on chip (SoC) integrated circuit. In at least one embodiment, components of computing system 1100A can be integrated into a single package to form a system in package (SIP) configuration. In at least one embodiment, at least a portion of components of computing system 1100A can be integrated into a multi-chip module (MCM), which can be interconnected with other multi-chip modules into a modular computing system.

Inference and/or training logic 615 are used to perform inferencing and/or training operations associated with one or more embodiments. Details regarding inference and/or training logic 615 are provided below in conjunction with FIGS. 6B and/or 6C. In at least one embodiment, inference and/or training logic 615 may be used in system FIG. 11A for inferencing or predicting operations based, at least in part, on weight parameters calculated using neural network training operations, neural network functions and/or architectures, or neural network use cases described herein.

Processors

Figure 11B:
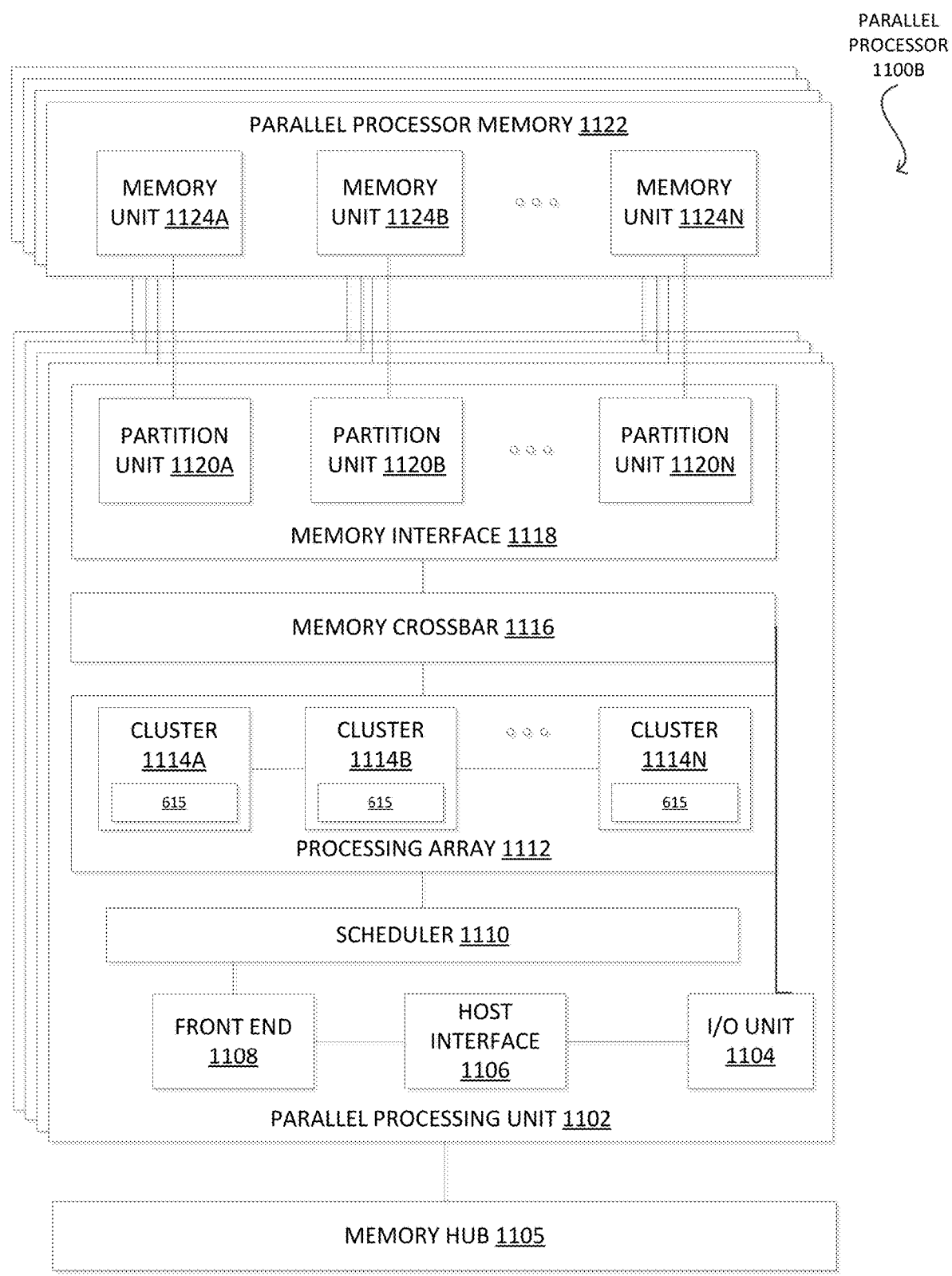
FIG. 11B illustrates a parallel processor to support and/or to enable a remediation system for threshold leaks in a datacenter liquid cooling system according to at least one embodiment.

FIG. 11B illustrates a parallel processor 1100B according to at least one embodiment. In at least one embodiment, various components of parallel processor 1100B may be implemented using one or more integrated circuit devices, such as programmable processors, application specific integrated circuits (ASICs), or field programmable gate arrays (FPGA). In at least one embodiment, illustrated parallel processor 11100B 100 is a variant of one or more parallel processor(s) 1112 shown in FIG. 11B according to an exemplary embodiment.

In at least one embodiment, parallel processor 1100B includes a parallel processing unit 1102. In at least one embodiment, parallel processing unit 1102 includes an I/O unit 1104 that enables communication with other devices, including other instances of parallel processing unit 1102. In at least one embodiment, I/O unit 1104 may be directly connected to other devices. In at least one embodiment, I/O unit 1104 connects with other devices via use of a hub or switch interface, such as memory hub 1105. In at least one embodiment, connections between memory hub 1105 and I/O unit 1104 form a communication link 1113. In at least one embodiment, I/O unit 1104 connects with a host interface 1106 and a memory crossbar 1116, where host interface 1106 receives commands directed to performing processing operations and memory crossbar 1116 receives commands directed to performing memory operations.

In at least one embodiment, when host interface 1106 receives a command buffer via I/O unit 1104, host interface 1106 can direct work operations to perform those commands to a front end 1108. In at least one embodiment, front end 1108 couples with a scheduler 1110, which is configured to distribute commands or other work items to a processing cluster array 1112. In at least one embodiment, scheduler 1110 ensures that processing cluster array 1112 is properly configured and in a valid state before tasks are distributed to processing cluster array 1112. In at least one embodiment, scheduler 1110 is implemented via firmware logic executing on a microcontroller. In at least one embodiment, microcontroller implemented scheduler 1110 is configurable to perform complex scheduling and work distribution operations at coarse and fine granularity, enabling rapid preemption and context switching of threads executing on processing array 1112. In at least one embodiment, host software can prove workloads for scheduling on processing array 1112 via one of multiple graphics processing doorbells. In at least one embodiment, workloads can then be automatically distributed across processing array 1112 by scheduler 1110 logic within a microcontroller including scheduler 1110.

In at least one embodiment, processing cluster array 1112 can include up to "N" processing clusters (such as cluster 1114A, cluster 1114B, through cluster 1114N). In at least one embodiment, each cluster 1114A-1114N of processing cluster array 1112 can execute a large number of concurrent threads. In at least one embodiment, scheduler 1110 can allocate work to clusters 1114A-1114N of processing cluster array 1112 using various scheduling and/or work distribution algorithms, which may vary depending on workload arising for each type of program or computation. In at least one embodiment, scheduling can be handled dynamically by scheduler 1110, or can be assisted in part by compiler logic during compilation of program logic configured for execution by processing cluster array 1112. In at least one embodiment, different clusters 1114A-1114N of processing cluster array 1112 can be allocated for processing different types of programs or for performing different types of computations.

In at least one embodiment, processing cluster array 1112 can be configured to perform various types of parallel processing operations. In at least one embodiment, processing cluster array 1112 is configured to perform general-purpose parallel compute operations. In at least one embodiment, in at least one embodiment, processing cluster array 1112 can include logic to execute processing tasks including filtering of video and/or audio data, performing modeling operations, including physics operations, and performing data transformations.

In at least one embodiment, processing cluster array 1112 is configured to perform parallel graphics processing operations. In at least one embodiment, processing cluster array 1112 can include additional logic to support execution of such graphics processing operations, including, but not limited to texture sampling logic to perform texture operations, as well as tessellation logic and other vertex processing logic. In at least one embodiment, processing cluster array 1112 can be configured to execute graphics processing related shader programs such as but not limited to vertex shaders, tessellation shaders, geometry shaders, and pixel shaders. In at least one embodiment, parallel processing unit 1102 can transfer data from system memory via I/O unit 1104 for processing. In at least one embodiment, during processing, transferred data can be stored to on-chip memory (such as parallel processor memory 1122) during processing, then written back to system memory.

In at least one embodiment, when parallel processing unit 1102 is used to perform graphics processing, scheduler 1110 can be configured to divide a processing workload into approximately equal sized tasks, to better enable distribution of graphics processing operations to multiple clusters 1114A-1114N of processing cluster array 1112. In at least one embodiment, portions of processing cluster array 1112 can be configured to perform different types of processing. In at least one embodiment, in at least one embodiment, a first portion may be configured to perform vertex shading and topology generation, a second portion may be configured to perform tessellation and geometry shading, and a third portion may be configured to perform pixel shading or other screen space operations, to produce a rendered image for display if a simulation of valve control for a remediation system for threshold leaks in a datacenter liquid cooling system is required. In at least one embodiment, intermediate data produced by one or more of clusters 1114A-1114N may be stored in buffers to allow intermediate data to be transmitted between clusters 1114A-1114N for further processing.

In at least one embodiment, processing cluster array 1112 can receive processing tasks to be executed via scheduler 1110, which receives commands defining processing tasks from front end 1108. In at least one embodiment, processing tasks can include indices of data to be processed, such as surface (patch) data, primitive data, vertex data, and/or pixel data, as well as state parameters and commands defining how data is to be processed (such as what program is to be executed). In at least one embodiment, scheduler 1110 may be configured to fetch indices corresponding to tasks or may receive indices from front end 1108. In at least one embodiment, front end 1108 can be configured to ensure processing cluster array 1112 is configured to a valid state before a workload specified by incoming command buffers (such as batch-buffers, push buffers, etc.) is initiated.

In at least one embodiment, each of one or more instances of parallel processing unit 1102 can couple with parallel processor memory 1122. In at least one embodiment, parallel processor memory 1122 can be accessed via memory crossbar 1116, which can receive memory requests from processing cluster array 1112 as well as I/O unit 1104. In at least one embodiment, memory crossbar 1116 can access parallel processor memory 1122 via a memory interface 1118. In at least one embodiment, memory interface 1118 can include multiple partition units (such as partition unit 1120A, partition unit 1120B, through partition unit 1120N) that can each couple to a portion (such as memory unit) of parallel processor memory 1122. In at least one embodiment, a number of partition units 1120A-1120N is configured to be equal to a number of memory units, such that a first partition unit 1120A has a corresponding first memory unit 1124A, a second partition unit 1120B has a corresponding memory unit 1124B, and a Nth partition unit 1120N has a corresponding Nth memory unit 1124N. In at least one embodiment, a number of partition units 1120A-1120N may not be equal to a number of memory devices.

In at least one embodiment, memory units 1124A-1124N can include various types of memory devices, including dynamic random access memory (DRAM) or graphics random access memory, such as synchronous graphics random access memory (SGRAM), including graphics double data rate (GDDR) memory. In at least one embodiment, memory units 1124A-1124N may also include 3D stacked memory, including but not limited to high bandwidth memory (HBM). In at least one embodiment, render targets, such as frame buffers or texture maps may be stored across memory units 1124A-1124N, allowing partition units 1120A-1120N to write portions of each render target in parallel to efficiently use available bandwidth of parallel processor memory 1122. In at least one embodiment, a local instance of parallel processor memory 1122 may be excluded in favor of a unified memory design that utilizes system memory in conjunction with local cache memory.

In at least one embodiment, any one of clusters 1114A-1114N of processing cluster array 1112 can process data that will be written to any of memory units 1124A-1124N within parallel processor memory 1122. In at least one embodiment, memory crossbar 1116 can be configured to transfer an output of each cluster 1114A-1114N to any partition unit 1120A-1120N or to another cluster 1114A-1114N, which can perform additional processing operations on an output. In at least one embodiment, each cluster 1114A-1114N can communicate with memory interface 1118 through memory crossbar 1116 to read from or write to various external memory devices. In at least one embodiment, memory crossbar 1116 has a connection to memory interface 1118 to communicate with I/O unit 1104, as well as a connection to a local instance of parallel processor memory 1122, enabling processing units within different processing clusters 1114A-1114N to communicate with system memory or other memory that is not local to parallel processing unit 1102. In at least one embodiment, memory crossbar 1116 can use virtual channels to separate traffic streams between clusters 1114A-1114N and partition units 1120A-1120N.

In at least one embodiment, multiple instances of parallel processing unit 1102 can be provided on a single add-in card, or multiple add-in cards can be interconnected. In at least one embodiment, different instances of parallel processing unit 1102 can be configured to inter-operate even if different instances have different numbers of processing cores, different amounts of local parallel processor memory, and/or other configuration differences. In at least one embodiment, in at least one embodiment, some instances of parallel processing unit 1102 can include higher precision floating point units relative to other instances. In at least one embodiment, systems incorporating one or more instances of parallel processing unit 1102 or parallel processor 1100B can be implemented in a variety of configurations and form factors, including but not limited to desktop, laptop, or handheld personal computers, servers, workstations, game consoles, and/or embedded systems.

Figure 11C:
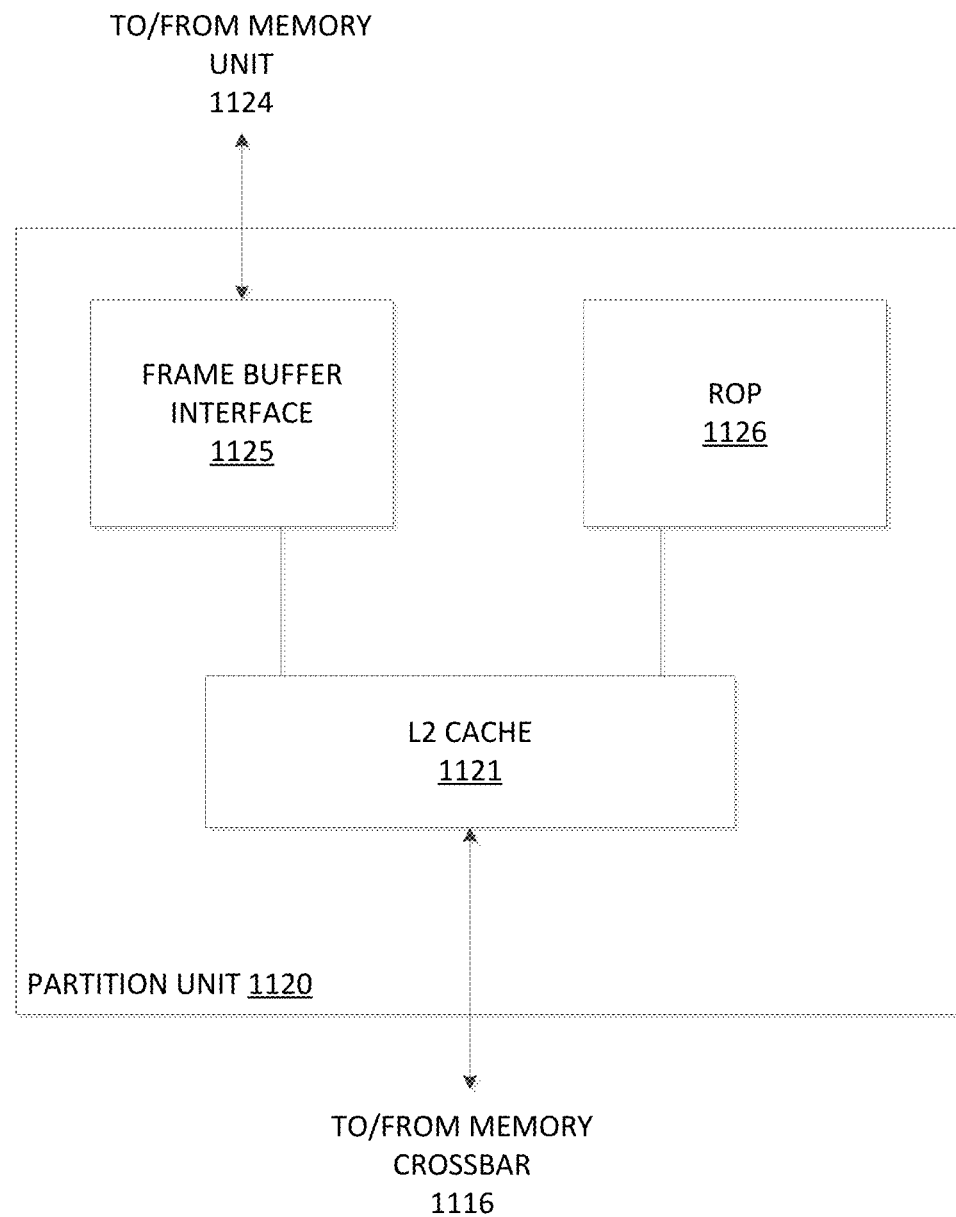
FIG. 11C is a block diagram of a partition unit according to at least one embodiment.

FIG. 11C is a block diagram of a partition unit 1120 according to at least one embodiment. In at least one embodiment, partition unit 1120 is an instance of one of partition units 1120A-1120N of FIG. 11B. In at least one embodiment, partition unit 1120 includes an L2 cache 1121, a frame buffer interface 1125, and a raster operations unit ("ROP") 1126. L2 cache 1121 is a read/write cache that is configured to perform load and store operations received from memory crossbar 1116 and ROP 1126. In at least one embodiment, read misses and urgent write-back requests are output by L2 cache 1121 to frame buffer interface 1125 for processing. In at least one embodiment, updates can also be sent to a frame buffer via frame buffer interface 1125 for processing. In at least one embodiment, frame buffer interface 1125 interfaces with one of memory units in parallel processor memory, such as memory units 1124A-1124N of FIG. 11B (such as within parallel processor memory 1122).

In at least one embodiment, ROP 1126 is a processing unit that performs raster operations such as stencil, z test, blending, and so forth. In at least one embodiment, ROP 1126 then outputs processed graphics data that is stored in graphics memory. In at least one embodiment, ROP 1126 includes compression logic to compress depth or color data that is written to memory and decompress depth or color data that is read from memory. In at least one embodiment, compression logic can be lossless compression logic that makes use of one or more of multiple compression algorithms. Compression logic that is performed by ROP 1126 can vary based on statistical characteristics of data to be compressed. In at least one embodiment, in at least one embodiment, delta color compression is performed on depth and color data on a per-tile basis.

In at least one embodiment, ROP 1126 is included within each processing cluster (such as cluster 1114A-1114N of FIG. 11B) instead of within partition unit 1120. In at least one embodiment, read and write requests for pixel data are transmitted over memory crossbar 1116 instead of pixel fragment data. In at least one embodiment, processed graphics data may be displayed on a display device, such as one of one or more display device(s) 1110 of FIG. 11, routed for further processing by processor(s) 1102, or routed for further processing by one of processing entities within parallel processor 1100B of FIG. 11B.

Figure 11D:
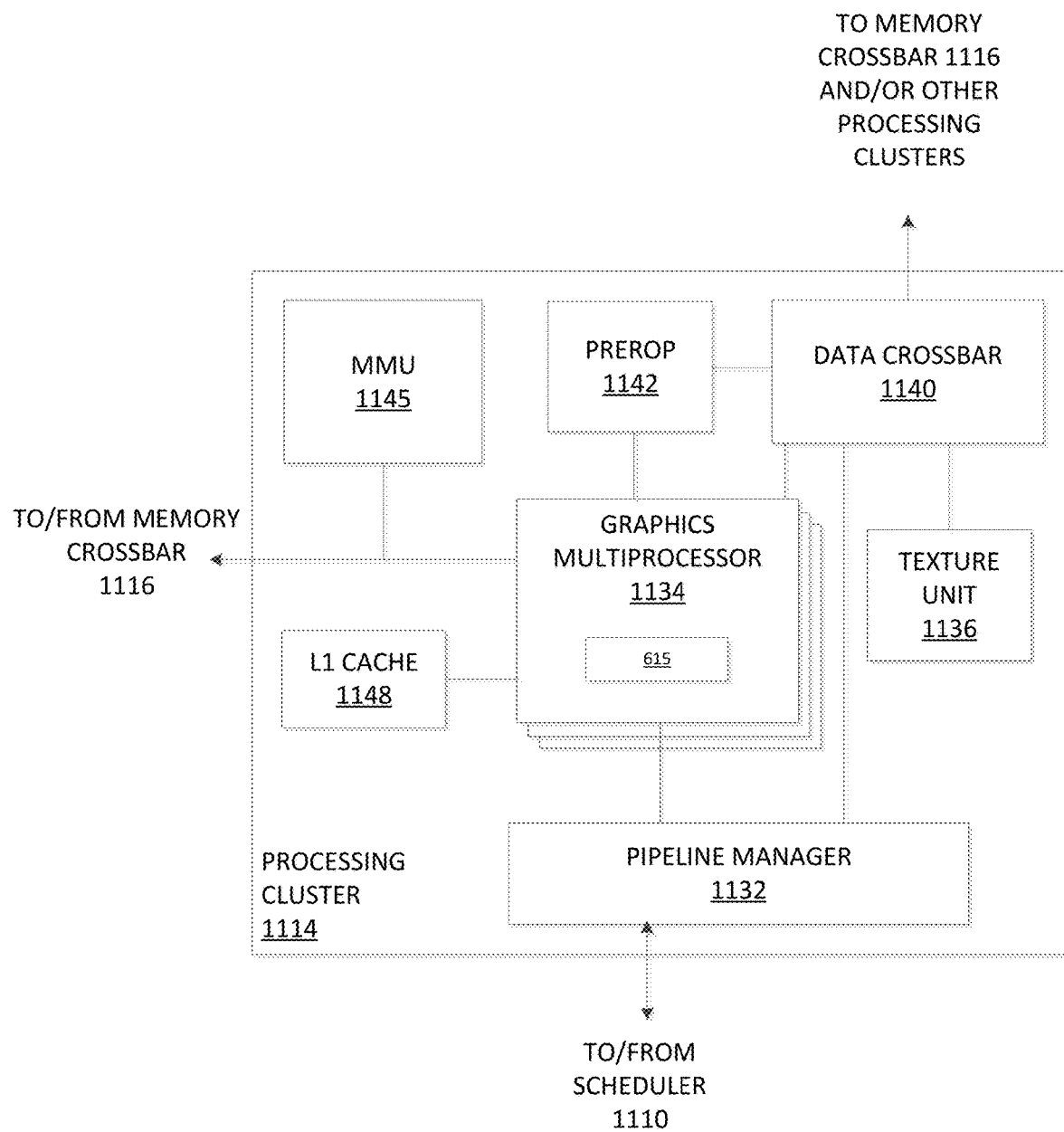
FIG. 11D shows a graphics multiprocessor used for a remediation system for threshold leaks in a datacenter liquid cooling system according to at least one embodiment.

FIG. 11D is a block diagram of a processing cluster 1114 within a parallel processing unit according to at least one embodiment. In at least one embodiment, a processing cluster is an instance of one of processing clusters 1114A-1114N of FIG. 11B. In at least one embodiment, one of more of processing cluster(s) 1114 can be configured to execute many threads in parallel, where "thread" refers to an instance of a particular program executing on a particular set of input data. In at least one embodiment, single-instruction, multiple-data (SIMD) instruction issue techniques are used to support parallel execution of a large number of threads without providing multiple independent instruction units. In at least one embodiment, single-instruction, multiple-thread (SIMT) techniques are used to support parallel execution of a large number of synchronized threads, using a common instruction unit configured to issue instructions to a set of processing engines within each one of processing clusters.

In at least one embodiment, operation of processing cluster 1114 can be controlled via a pipeline manager 1132 that distributes processing tasks to SIMT parallel processors. In at least one embodiment, pipeline manager 1132 receives instructions from scheduler 1110 of FIG. 11B and manages execution of those instructions via a graphics multiprocessor 1134 and/or a texture unit 1136. In at least one embodiment, graphics multiprocessor 1134 is an exemplary instance of a SIMT parallel processor. However, in at least one embodiment, various types of SIMT parallel processors of differing architectures may be included within processing cluster 1114. In at least one embodiment, one or more instances of graphics multiprocessor 1134 can be included within a processing cluster 1114. In at least one embodiment, graphics multiprocessor 1134 can process data and a data crossbar 1140 can be used to distribute processed data to one of multiple possible destinations, including other shader units. In at least one embodiment, pipeline manager 1132 can facilitate distribution of processed data by specifying destinations for processed data to be distributed vis data crossbar 1140.

In at least one embodiment, each graphics multiprocessor 1134 within processing cluster 1114 can include an identical set of functional execution logic (such as arithmetic logic units, load-store units, etc.). In at least one embodiment, functional execution logic can be configured in a pipelined manner in which new instructions can be issued before previous instructions are complete. In at least one embodiment, functional execution logic supports a variety of operations including integer and floating point arithmetic, comparison operations, Boolean operations, bit-shifting, and computation of various algebraic functions. In at least one embodiment, same functional-unit hardware can be leveraged to perform different operations and any combination of functional units may be present.

In at least one embodiment, instructions transmitted to processing cluster 1114 constitute a thread. In at least one embodiment, a set of threads executing across a set of parallel processing engines is a thread group. In at least one embodiment, thread group executes a program on different input data. In at least one embodiment, each thread within a thread group can be assigned to a different processing engine within a graphics multiprocessor 1134. In at least one embodiment, a thread group may include fewer threads than a number of processing engines within graphics multiprocessor 1134. In at least one embodiment, when a thread group includes fewer threads than a number of processing engines, one or more processing engines may be idle during cycles in which that thread group is being processed. In at least one embodiment, a thread group may also include more threads than a number of processing engines within graphics multiprocessor 1134. In at least one embodiment, when a thread group includes more threads than processing engines within graphics multiprocessor 1134, processing can be performed over consecutive clock cycles. In at least one embodiment, multiple thread groups can be executed concurrently on a graphics multiprocessor 1134.

In at least one embodiment, graphics multiprocessor 1134 includes an internal cache memory to perform load and store operations. In at least one embodiment, graphics multiprocessor 1134 can forego an internal cache and use a cache memory (such as L1 cache 1148) within processing cluster 1114. In at least one embodiment, each graphics multiprocessor 1134 also has access to L2 caches within partition units (such as partition units 1120A-1120N of FIG. 11B) that are shared among all processing clusters 1114 and may be used to transfer data between threads. In at least one embodiment, graphics multiprocessor 1134 may also access off-chip global memory, which can include one or more of local parallel processor memory and/or system memory. In at least one embodiment, any memory external to parallel processing unit 1102 may be used as global memory. In at least one embodiment, processing cluster 1114 includes multiple instances of graphics multiprocessor 1134 can share common instructions and data, which may be stored in L1 cache 1148.

In at least one embodiment, each processing cluster 1114 may include a memory management unit ("MMU") 1145 that is configured to map virtual addresses into physical addresses. In at least one embodiment, one or more instances of MMU 1145 may reside within memory interface 1118 of FIG. 11B. In at least one embodiment, MMU 1145 includes a set of page table entries (PTEs) used to map a virtual address to a physical address of a tile and, in at least one embodiment, a cache line index. In at least one embodiment, MMU 1145 may include address translation lookaside buffers (TLB) or caches that may reside within graphics multiprocessor 1134 or L1 cache or processing cluster 1114. In at least one embodiment, physical address is processed to distribute surface data access locality to allow efficient request interleaving among partition units. In at least one embodiment, cache line index may be used to determine whether a request for a cache line is a hit or miss.

In at least one embodiment, a processing cluster 1114 may be configured such that each graphics multiprocessor 1134 is coupled to a texture unit 1136 for performing texture mapping operations, such as determining texture sample positions, reading texture data, and filtering texture data. In at least one embodiment, texture data is read from an internal texture L1 cache (not shown) or from an L1 cache within graphics multiprocessor 1134 and is fetched from an L2 cache, local parallel processor memory, or system memory, as needed. In at least one embodiment, each graphics multiprocessor 1134 outputs processed tasks to data crossbar 1140 to provide processed task(s) to another processing cluster 1114 for further processing or to store processed task(s) in an L2 cache, local parallel processor memory, or system memory via memory crossbar 1116. In at least one embodiment, preROP 1142 (pre-raster operations unit) is configured to receive data from graphics multiprocessor 1134, direct data to ROP units, which may be located with partition units as described herein (such as partition units 1120A-1120N of FIG. 11B). In at least one embodiment, PreROP 1142 unit can perform optimizations for color blending, organize pixel color data, and perform address translations.

Inference and/or training logic 615 are used to perform inferencing and/or training operations associated with one or more embodiments. Details regarding inference and/or training logic 615 are provided below in conjunction with FIGS. 6B and/or 6C. In at least one embodiment, inference and/or training logic 615 may be used in graphics processing cluster 1114 for inferencing or predicting operations based, at least in part, on weight parameters calculated using neural network training operations, neural network functions and/or architectures, or neural network use cases described herein.

Figure 11E:
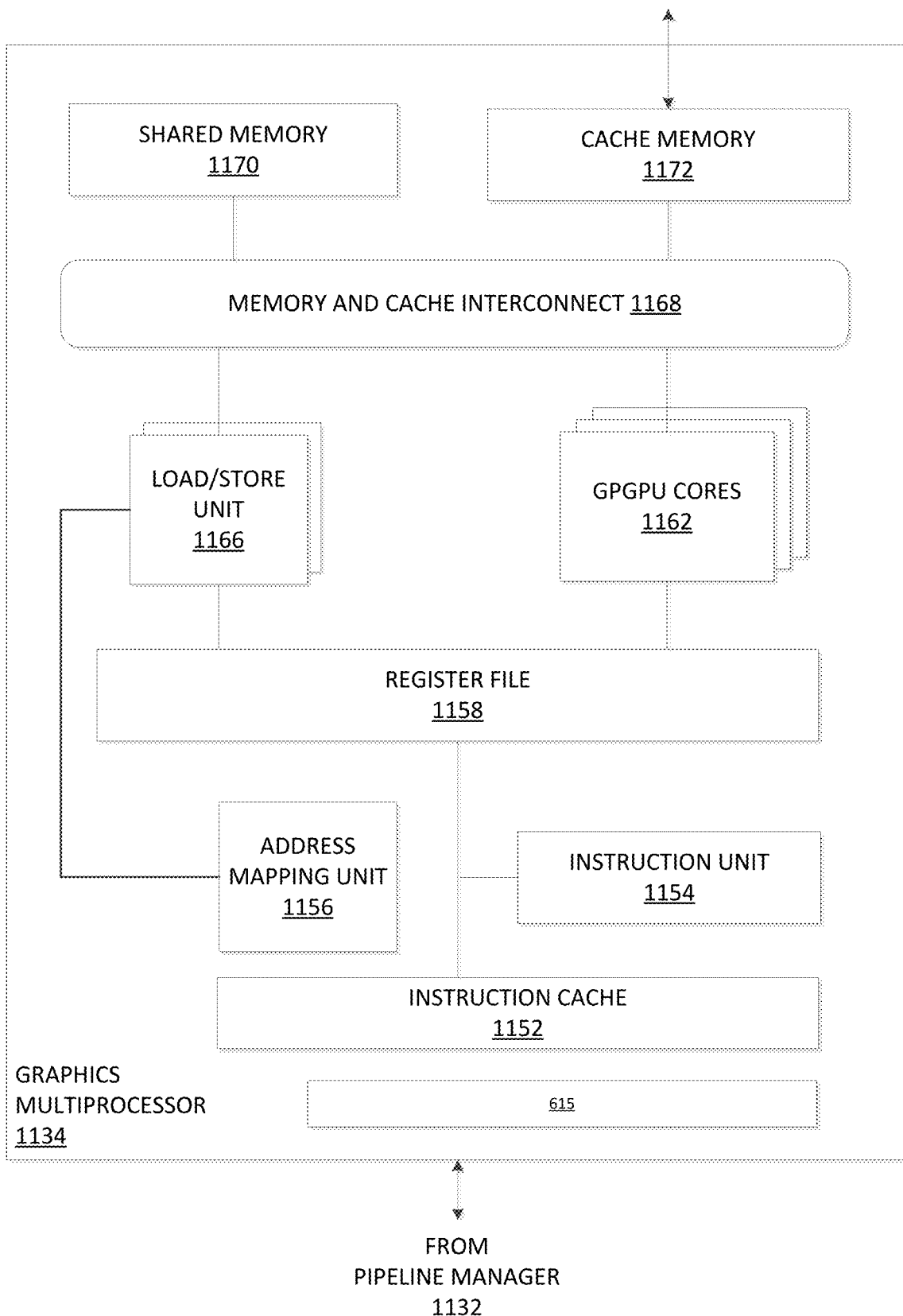
FIG. 11E shows a graphics multiprocessor according to at least one embodiment.

FIG. 11E shows a graphics multiprocessor 1134 according to at least one embodiment. In at least one embodiment, graphics multiprocessor 1134 couples with pipeline manager 1132 of processing cluster 1114. In at least one embodiment, graphics multiprocessor 1134 has an execution pipeline including but not limited to an instruction cache 1152, an instruction unit 1154, an address mapping unit 1156, a register file 1158, one or more general purpose graphics processing unit (GPGPU) cores 1162, and one or more load/store units 1166. GPGPU core(s) 1162 and load/store unit(s) 1166 are coupled with cache memory 1172 and shared memory 1170 via a memory and cache interconnect 1168.

In at least one embodiment, instruction cache 1152 receives a stream of instructions to execute from pipeline manager 1132. In at least one embodiment, instructions are cached in instruction cache 1152 and dispatched for execution by instruction unit 1154. In at least one embodiment, instruction unit 1154 can dispatch instructions as thread groups (such as warps), with each thread group assigned to a different execution unit within GPGPU core(s) 1162. In at least one embodiment, an instruction can access any of a local, shared, or global address space by specifying an address within a unified address space. In at least one embodiment, address mapping unit 1156 can be used to translate addresses in a unified address space into a distinct memory address that can be accessed by load/store unit(s) 1166.

In at least one embodiment, register file 1158 provides a set of registers for functional units of graphics multiprocessor 1134. In at least one embodiment, register file 1158 provides temporary storage for operands connected to data paths of functional units (such as GPGPU cores 1162, load/store units 1166) of graphics multiprocessor 1134. In at least one embodiment, register file 1158 is divided between each of functional units such that each functional unit is allocated a dedicated portion of register file 1158. In at least one embodiment, register file 1158 is divided between different warps being executed by graphics multiprocessor 1134.

In at least one embodiment, GPGPU cores 1162 can each include floating point units (FPUs) and/or integer arithmetic logic units (ALUs) that are used to execute instructions of graphics multiprocessor 1134. GPGPU cores 1162 can be similar in architecture or can differ in architecture. In at least one embodiment, a first portion of GPGPU cores 1162 include a single precision FPU and an integer ALU while a second portion of GPGPU cores include a double precision FPU. In at least one embodiment, FPUs can implement IEEE 754-2008 standard for floating point arithmetic or enable variable precision floating point arithmetic. In at least one embodiment, graphics multiprocessor 1134 can additionally include one or more fixed function or special function units to perform specific functions such as copy rectangle or pixel blending operations. In at least one embodiment one or more of GPGPU cores can also include fixed or special function logic.

In at least one embodiment, GPGPU cores 1162 include SIMD logic capable of performing a single instruction on multiple sets of data. In at least one embodiment GPGPU cores 1162 can physically execute SIMD4, SIMD8, and SIMD16 instructions and logically execute SIMD1, SIMD2, and SIMD32 instructions. In at least one embodiment, SIMD instructions for GPGPU cores can be generated at compile time by a shader compiler or automatically generated when executing programs written and compiled for single program multiple data (SPMD) or SIMT architectures. In at least one embodiment, multiple threads of a program configured for an SIMT execution model can executed via a single SIMD instruction. In at least one embodiment, in at least one embodiment, eight SIMT threads that perform same or similar operations can be executed in parallel via a single SIMD8 logic unit.

In at least one embodiment, memory and cache interconnect 1168 is an interconnect network that connects each functional unit of graphics multiprocessor 1134 to register file 1158 and to shared memory 1170. In at least one embodiment, memory and cache interconnect 1168 is a crossbar interconnect that allows load/store unit 1166 to implement load and store operations between shared memory 1170 and register file 1158. In at least one embodiment, register file 1158 can operate at a same frequency as GPGPU cores 1162, thus data transfer between GPGPU cores 1162 and register file 1158 is very low latency. In at least one embodiment, shared memory 1170 can be used to enable communication between threads that execute on functional units within graphics multiprocessor 1134. In at least one embodiment, cache memory 1172 can be used as a data cache for example, to cache texture data communicated between functional units and texture unit 1136. In at least one embodiment, shared memory 1170 can also be used as a program managed cache. In at least one embodiment, threads executing on GPGPU cores 1162 can programmatically store data within shared memory in addition to automatically cached data that is stored within cache memory 1172.

In at least one embodiment, a parallel processor or GPGPU as described herein is communicatively coupled to host/processor cores to accelerate graphics operations, machine-learning operations, pattern analysis operations, and various general purpose GPU (GPGPU) functions. In at least one embodiment, GPU may be communicatively coupled to host processor/cores over a bus or other interconnect (such as a high speed interconnect such as PCIe or NVLink). In at least one embodiment, GPU may be integrated on same package or chip as cores and communicatively coupled to cores over an internal processor bus/interconnect (in at least one embodiment, internal to package or chip). In at least one embodiment, regardless of manner in which GPU is connected, processor cores may allocate work to GPU in form of sequences of commands/instructions contained in a work descriptor. In at least one embodiment, GPU then uses dedicated circuitry/logic for efficiently processing these commands/instructions.

Inference and/or training logic 615 are used to perform inferencing and/or training operations associated with one or more embodiments. Details regarding inference and/or training logic 615 are provided below in conjunction with FIGS. 6B and/or 6C. In at least one embodiment, inference and/or training logic 615 may be used in graphics multiprocessor 1134 for inferencing or predicting operations based, at least in part, on weight parameters calculated using neural network training operations, neural network functions and/or architectures, or neural network use cases described herein.

Figure 12A:
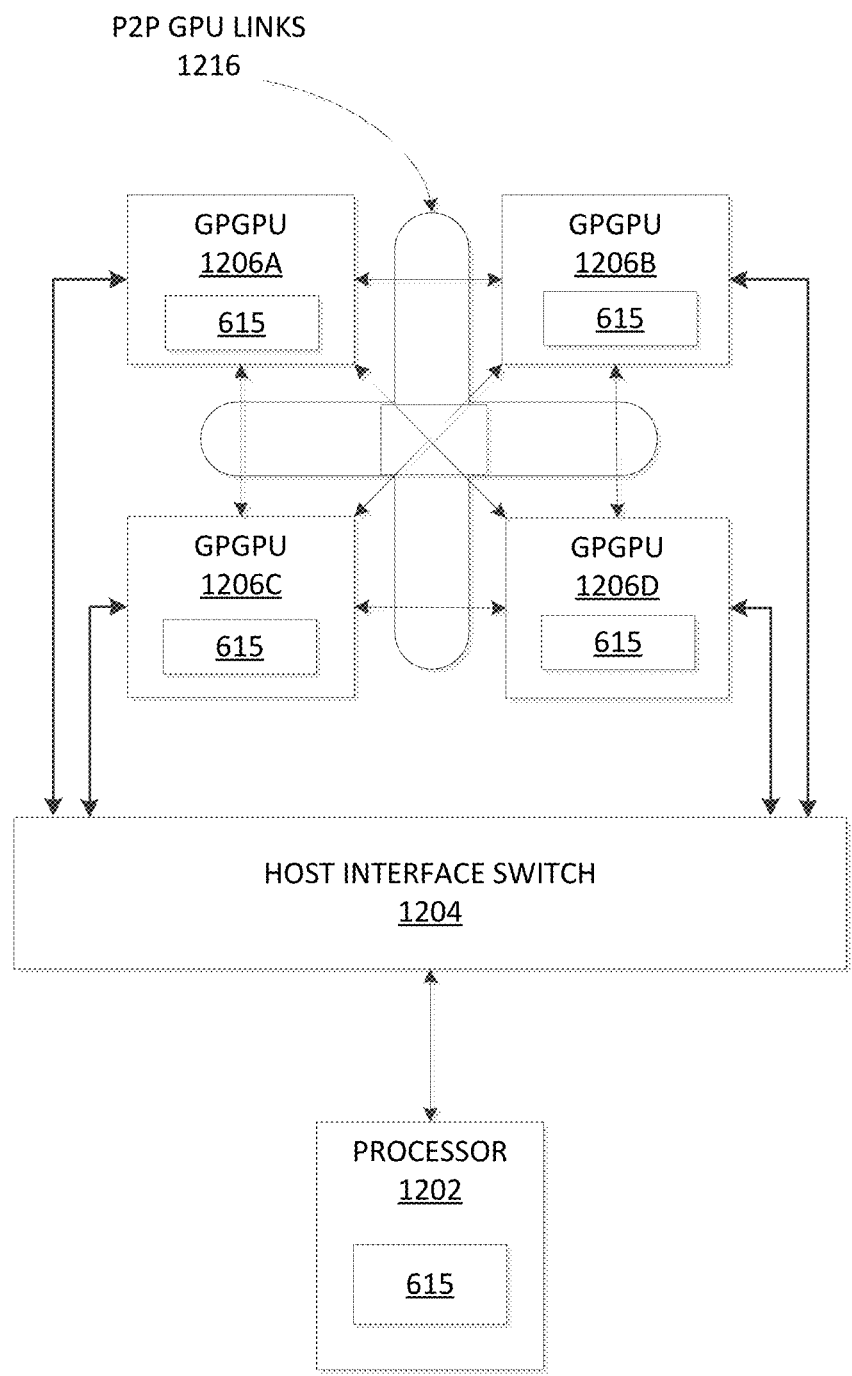
FIG. 12A illustrates a multi-GPU computing system, according to at least one embodiment.

FIG. 12A illustrates a multi-GPU computing system 1200A, according to at least one embodiment. In at least one embodiment, multi-GPU computing system 1200A can include a processor 1202 coupled to multiple general purpose graphics processing units (GPGPUs) 1206A-D via a host interface switch 1204. In at least one embodiment, host interface switch 1204 is a PCI express switch device that couples processor 1202 to a PCI express bus over which processor 1202 can communicate with GPGPUs 1206A-D. GPGPUs 1206A-D can interconnect via a set of high-speed point to point GPU to GPU links 1216. In at least one embodiment, GPU to GPU links 1216 connect to each of GPGPUs 1206A-D via a dedicated GPU link. In at least one embodiment, P2P GPU links 1216 enable direct communication between each of GPGPUs 1206A-D without requiring communication over host interface bus 1204 to which processor 1202 is connected. In at least one embodiment, with GPU-to-GPU traffic directed to P2P GPU links 1216, host interface bus 1204 remains available for system memory access or to communicate with other instances of multi-GPU computing system 1200A, for example, via one or more network devices. While in at least one embodiment GPGPUs 1206A-D connect to processor 1202 via host interface switch 1204, in at least one embodiment processor 1202 includes direct support for P2P GPU links 1216 and can connect directly to GPGPUs 1206A-D.

Inference and/or training logic 615 are used to perform inferencing and/or training operations associated with one or more embodiments. Details regarding inference and/or training logic 615 are provided below in conjunction with FIGS. 6B and/or 6C. In at least one embodiment, inference and/or training logic 615 may be used in multi-GPU computing system 1200A for inferencing or predicting operations based, at least in part, on weight parameters calculated using neural network training operations, neural network functions and/or architectures, or neural network use cases described herein.

Figure 12B:
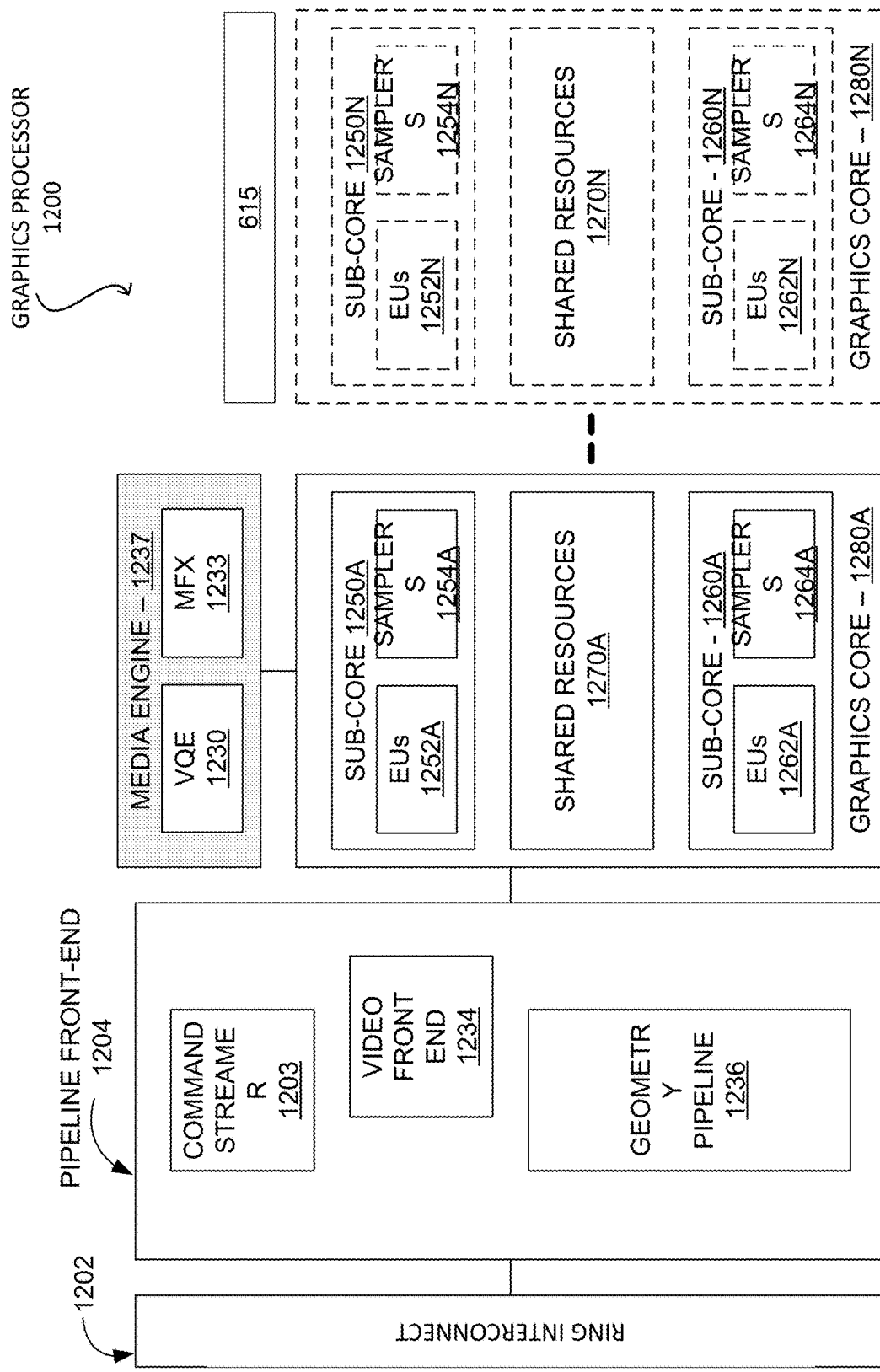
FIG. 12B is a block diagram of a graphics processor, according to at least one embodiment.

FIG. 12B is a block diagram of a graphics processor 1200B, according to at least one embodiment. In at least one embodiment, graphics processor 1200B includes a ring interconnect 1202, a pipeline front-end 1204, a media engine 1237, and graphics cores 1280A-1280N. In at least one embodiment, ring interconnect 1202 couples graphics processor 1200B to other processing units, including other graphics processors or one or more general-purpose processor cores. In at least one embodiment, graphics processor 1200B is one of many processors integrated within a multi-core processing system.

In at least one embodiment, graphics processor 1200B receives batches of commands via ring interconnect 1202. In at least one embodiment, incoming commands are interpreted by a command streamer 1203 in pipeline front-end 1204. In at least one embodiment, graphics processor 1200B includes scalable execution logic to perform 3D geometry processing and media processing via graphics core(s) 1280A-1280N. In at least one embodiment, for 3D geometry processing commands, command streamer 1203 supplies commands to geometry pipeline 1236. In at least one embodiment, for at least some media processing commands, command streamer 1203 supplies commands to a video front end 1234, which couples with a media engine 1237. In at least one embodiment, media engine 1237 includes a Video Quality Engine (VQE) 1230 for video and image post-processing and a multi-format encode/decode (MFX) 1233 engine to provide hardware-accelerated media data encode and decode. In at least one embodiment, geometry pipeline 1236 and media engine 1237 each generate execution threads for thread execution resources provided by at least one graphics core 1280A.

In at least one embodiment, graphics processor 1200B includes scalable thread execution resources featuring modular cores 1280A-1280N (sometimes referred to as core slices), each having multiple sub-cores 1250A-1250N, 1260A-1260N (sometimes referred to as core sub-slices). In at least one embodiment, graphics processor 1200B can have any number of graphics cores 1280A through 1280N. In at least one embodiment, graphics processor 1200B includes a graphics core 1280A having at least a first sub-core 1250A and a second sub-core 1260A. In at least one embodiment, graphics processor 1200B is a low power processor with a single sub-core (such as 1250A). In at least one embodiment, graphics processor 1200B includes multiple graphics cores 1280A-1280N, each including a set of first sub-cores 1250A-1250N and a set of second sub-cores 1260A-1260N. In at least one embodiment, each sub-core in first sub-cores 1250A-1250N includes at least a first set of execution units 1252A-1252N and media/texture samplers 1254A-1254N. In at least one embodiment, each sub-core in second sub-cores 1260A-1260N includes at least a second set of execution units 1262A-1262N and samplers 1264A-1264N. In at least one embodiment, each sub-core 1250A-1250N, 1260A-1260N shares a set of shared resources 1270A-1270N. In at least one embodiment, shared resources include shared cache memory and pixel operation logic.

Inference and/or training logic 615 are used to perform inferencing and/or training operations associated with one or more embodiments. Details regarding inference and/or training logic 615 are provided below in conjunction with FIGS. 6B and/or 6C. In at least one embodiment, inference and/or training logic 615 may be used in graphics processor 1200B for inferencing or predicting operations based, at least in part, on weight parameters calculated using neural network training operations, neural network functions and/or architectures, or neural network use cases described herein.

Figure 13:
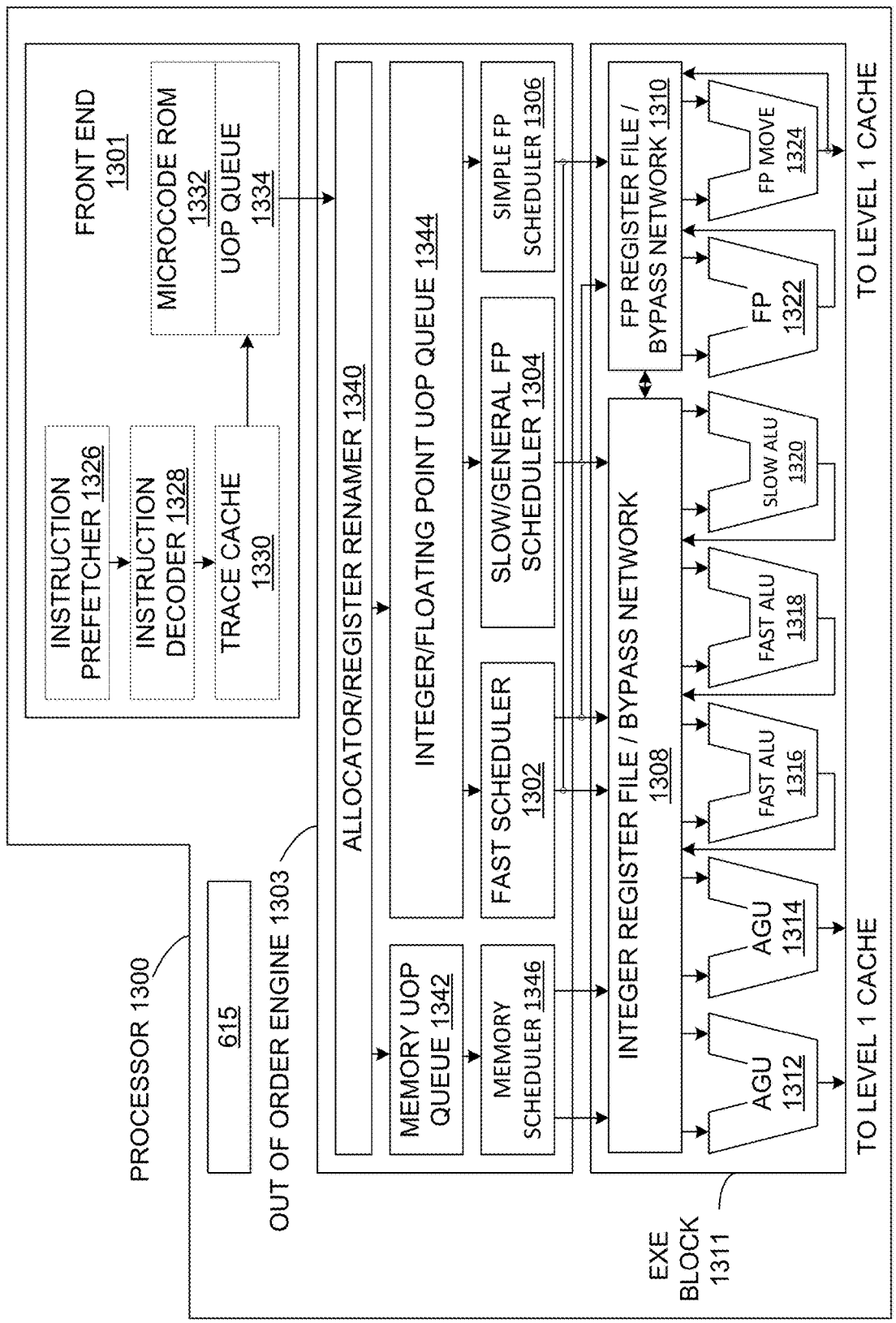
FIG. 13 is a block diagram illustrating micro-architecture for a processor that may include logic circuits to perform instructions, according to at least one embodiment.

FIG. 13 is a block diagram illustrating micro-architecture for a processor 1300 that may include logic circuits to perform instructions, according to at least one embodiment. In at least one embodiment, processor 1300 may perform instructions, including x86 instructions, ARM instructions, specialized instructions for application-specific integrated circuits (ASICs), etc. In at least one embodiment, processor 1300 may include registers to store packed data, such as 64-bit wide MMX™ registers in microprocessors enabled with MMX technology from Intel Corporation of Santa Clara, Calif. In at least one embodiment, MMX registers, available in both integer and floating point forms, may operate with packed data elements that accompany single instruction, multiple data ("SIMD") and streaming SIMD extensions ("SSE") instructions. In at least one embodiment, 128-bit wide XMM registers relating to SSE2, SSE3, SSE4, AVX, or beyond (referred to generically as "SSEx") technology may hold such packed data operands. In at least one embodiment, processor 1300 may perform instructions to accelerate machine learning or deep learning algorithms, training, or inferencing.

In at least one embodiment, processor 1300 includes an in-order front end ("front end") 1301 to fetch instructions to be executed and prepare instructions to be used later in processor pipeline. In at least one embodiment, front end 1301 may include several units. In at least one embodiment, an instruction prefetcher 1326 fetches instructions from memory and feeds instructions to an instruction decoder 1328 which in turn decodes or interprets instructions. In at least one embodiment, in at least one embodiment, instruction decoder 1328 decodes a received instruction into one or more operations called "micro-instructions" or "micro-operations" (also called "micro ops" or "uops") that machine may execute. In at least one embodiment, instruction decoder 1328 parses instruction into an opcode and corresponding data and control fields that may be used by micro-architecture to perform operations in accordance with at least one embodiment. In at least one embodiment, a trace cache 1330 may assemble decoded uops into program ordered sequences or traces in a uop queue 1334 for execution. In at least one embodiment, when trace cache 1330 encounters a complex instruction, a microcode ROM 1332 provides uops needed to complete operation.

In at least one embodiment, some instructions may be converted into a single micro-op, whereas others need several micro-ops to complete full operation. In at least one embodiment, if more than four micro-ops are needed to complete an instruction, instruction decoder 1328 may access microcode ROM 1332 to perform instruction. In at least one embodiment, an instruction may be decoded into a small number of micro-ops for processing at instruction decoder 1328. In at least one embodiment, an instruction may be stored within microcode ROM 1332 should a number of micro-ops be needed to accomplish operation. In at least one embodiment, trace cache 1330 refers to an entry point programmable logic array ("PLA") to determine a correct micro-instruction pointer for reading microcode sequences to complete one or more instructions from microcode ROM 1332 in accordance with at least one embodiment. In at least one embodiment, after microcode ROM 1332 finishes sequencing micro-ops for an instruction, front end 1301 of machine may resume fetching micro-ops from trace cache 1330.

In at least one embodiment, out-of-order execution engine ("out of order engine") 1303 may prepare instructions for execution. In at least one embodiment, out-of-order execution logic has a number of buffers to smooth out and re-order flow of instructions to optimize performance as they go down pipeline and get scheduled for execution. In at least one embodiment, out-of-order execution engine 1303 includes, without limitation, an allocator/register renamer

1340, a memory uop queue 1342, an integer/floating point uop queue 1344, a memory scheduler 1346, a fast scheduler 1302, a slow/general floating point scheduler ("slow/general FP scheduler") 1304, and a simple floating point scheduler ("simple FP scheduler") 1306. In at least one embodiment, fast schedule 1302, slow/general floating point scheduler 1304, and simple floating point scheduler 1306 are also collectively referred to herein as "uop schedulers 1302, 1304, 1306." In at least one embodiment, allocator/register renamer 1340 allocates machine buffers and resources that each uop needs in order to execute. In at least one embodiment, allocator/register renamer 1340 renames logic registers onto entries in a register file. In at least one embodiment, allocator/register renamer 1340 also allocates an entry for each uop in one of two uop queues, memory uop queue 1342 for memory operations and integer/floating point uop queue 1344 for non-memory operations, in front of memory scheduler 1346 and uop schedulers 1302, 1304, 1306. In at least one embodiment, uop schedulers 1302, 1304, 1306 determine when a uop is ready to execute based on readiness of their dependent input register operand sources and availability of execution resources uops need to complete their operation. In at least one embodiment, fast scheduler 1302 of at least one embodiment may schedule on each half of main clock cycle while slow/general floating point scheduler 1304 and simple floating point scheduler 1306 may schedule once per main processor clock cycle. In at least one embodiment, uop schedulers 1302, 1304, 1306 arbitrate for dispatch ports to schedule uops for execution.

In at least one embodiment, execution block 1311 includes, without limitation, an integer register file/bypass network 1308, a floating point register file/bypass network ("FP register file/bypass network") 1310, address generation units ("AGUs") 1312 and 1314, fast Arithmetic Logic Units (ALUs) ("fast ALUs") 1316 and 1318, a slow Arithmetic Logic Unit ("slow ALU") 1320, a floating point ALU ("FP") 1322, and a floating point move unit ("FP move") 1324. In at least one embodiment, integer register file/bypass network 1308 and floating point register file/bypass network 1310 are also referred to herein as "register files 1308, 1310." In at least one embodiment, AGUs 1312 and 1314, fast ALUs 1316 and 1318, slow ALU 1320, floating point ALU 1322, and floating point move unit 1324 are also referred to herein as "execution units 1312, 1314, 1316, 1318, 1320, 1322, and 1324." In at least one embodiment, execution block b11 may include, without limitation, any number (including zero) and type of register files, bypass networks, address generation units, and execution units, in any combination.

In at least one embodiment, register files 1308, 1310 may be arranged between uop schedulers 1302, 1304, 1306, and execution units 1312, 1314, 1316, 1318, 1320, 1322, and 1324. In at least one embodiment, integer register file/bypass network 1308 performs integer operations. In at least one embodiment, floating point register file/bypass network 1310 performs floating point operations. In at least one embodiment, each of register files 1308, 1310 may include, without limitation, a bypass network that may bypass or forward just completed results that have not yet been written into register file to new dependent uops. In at least one embodiment, register files 1308, 1310 may communicate data with each other. In at least one embodiment, integer register file/bypass network 1308 may include, without limitation, two separate register files, one register file for low-order thirty-two bits of data and a second register file for high order thirty-two bits of data. In at least one embodiment, floating point register file/bypass network 1310 may include, without limitation, 128-bit wide entries because floating point instructions typically have operands from 64 to 128 bits in width.

In at least one embodiment, execution units 1312, 1314, 1316, 1318, 1320, 1322, 1324 may execute instructions. In at least one embodiment, register files 1308, 1310 store integer and floating point data operand values that microinstructions need to execute. In at least one embodiment, processor 1300 may include, without limitation, any number and combination of execution units 1312, 1314, 1316, 1318, 1320, 1322, 1324. In at least one embodiment, floating point ALU 1322 and floating point move unit 1324, may execute floating point, MMX, SIMD, AVX and SSE, or other operations, including specialized machine learning instructions. In at least one embodiment, floating point ALU 1322 may include, without limitation, a 64-bit by 64-bit floating point divider to execute divide, square root, and remainder micro ops. In at least one embodiment, instructions involving a floating point value may be handled with floating point hardware. In at least one embodiment, ALU operations may be passed to fast ALUs 1316, 1318. In at least one embodiment, fast ALUS 1316, 1318 may execute fast operations with an effective latency of half a clock cycle. In at least one embodiment, most complex integer operations go to slow ALU 1320 as slow ALU 1320 may include, without limitation, integer execution hardware for long-latency type of operations, such as a multiplier, shifts, flag logic, and branch processing. In at least one embodiment, memory load/store operations may be executed by AGUS 1312, 1314. In at least one embodiment, fast ALU 1316, fast ALU 1318, and slow ALU 1320 may perform integer operations on 64-bit data operands. In at least one embodiment, fast ALU 1316, fast ALU 1318, and slow ALU 1320 may be implemented to support a variety of data bit sizes including sixteen, thirty-two, 128, 256, etc. In at least one embodiment, floating point ALU 1322 and floating point move unit 1324 may be implemented to support a range of operands having bits of various widths. In at least one embodiment, floating point ALU 1322 and floating point move unit 1324 may operate on 128-bit wide packed data operands in conjunction with SIMD and multimedia instructions.

In at least one embodiment, uop schedulers 1302, 1304, 1306, dispatch dependent operations before parent load has finished executing. In at least one embodiment, as uops may be speculatively scheduled and executed in processor 1300, processor 1300 may also include logic to handle memory misses. In at least one embodiment, if a data load misses in data cache, there may be dependent operations in flight in pipeline that have left scheduler with temporarily incorrect data. In at least one embodiment, a replay mechanism tracks and re-executes instructions that use incorrect data. In at least one embodiment, dependent operations might need to be replayed and independent ones may be allowed to complete. In at least one embodiment, schedulers and replay mechanism of at least one embodiment of a processor may also be designed to catch instruction sequences for text string comparison operations.

In at least one embodiment, registers may refer to onboard processor storage locations that may be used as part of instructions to identify operands. In at least one embodiment, registers may be those that may be usable from outside of processor (from a programmer's perspective). In at least one embodiment, registers might not be limited to a particular type of circuit. Rather, in at least one embodiment, a register may store data, provide data, and perform functions described herein. In at least one embodiment, registers described herein may be implemented by circuitry within a processor using any number of different techniques, such as dedicated physical registers, dynamically allocated physical registers using register renaming, combinations of dedicated and dynamically allocated physical registers, etc. In at least one embodiment, integer registers store 32-bit integer data. A register file of at least one embodiment also contains eight multimedia SIMD registers for packed data.

Inference and/or training logic 615 are used to perform inferencing and/or training operations associated with one or more embodiments. Details regarding inference and/or training logic 615 are provided below in conjunction with FIGS. 6B and/or 6C. In at least one embodiment portions or all of inference and/or training logic 615 may be incorporated into execution block 1311 and other memory or registers shown or not shown. In at least one embodiment, in at least one embodiment, training and/or inferencing techniques described herein may use one or more of ALUs illustrated in execution block 1311. Moreover, weight parameters may be stored in on-chip or off-chip memory and/or registers (shown or not shown) that configure ALUs of execution block 1311 to perform one or more machine learning algorithms, neural network architectures, use cases, or training techniques described herein.

FIG. 14 illustrates a deep learning application processor 1400, according to at least one embodiment. In at least one embodiment, deep learning application processor 1400 uses instructions that, if executed by deep learning application processor 1400, cause deep learning application processor 1400 to perform some or all of processes and techniques described throughout this disclosure. In at least one embodiment, deep learning application processor 1400 is an application-specific integrated circuit (ASIC). In at least one embodiment, application processor 1400 performs matrix multiply operations either "hard-wired" into hardware as a result of performing one or more instructions or both. In at least one embodiment, deep learning application processor 1400 includes, without limitation, processing clusters 1410(1)-1410(12), Inter-Chip Links ("ICLs") 1420(1)-1420(12), Inter-Chip Controllers ("ICCs") 1430(1)-1430(2), memory controllers ("Mem Ctrlrs") 1442(1)-1442(4), high bandwidth memory physical layer ("HBM PHY") 1444(1)-1444(4), a management-controller central processing unit ("management-controller CPU") 1450, a Serial Peripheral Interface, Inter-Integrated Circuit, and General Purpose Input/Output block ("SPI, I2C, GPIO"), a peripheral component interconnect express controller and direct memory access block ("PCIe Controller and DMA") 1470, and a sixteen-lane peripheral component interconnect express port ("PCI Express×16") 1480.

In at least one embodiment, processing clusters 1410 may perform deep learning operations, including inference or prediction operations based on weight parameters calculated one or more training techniques, including those described herein. In at least one embodiment, each processing cluster 1410 may include, without limitation, any number and type of processors. In at least one embodiment, deep learning application processor 1400 may include any number and type of processing clusters 1400. In at least one embodiment, Inter-Chip Links 1420 are bi-directional. In at least one embodiment, Inter-Chip Links 1420 and Inter-Chip Controllers 1430 enable multiple deep learning application processors 1400 to exchange information, including activation information resulting from performing one or more machine learning algorithms embodied in one or more neural networks. In at least one embodiment, deep learning application processor 1400 may include any number (including zero) and type of ICLs 1420 and ICCs 1430.

In at least one embodiment, HBM2s 1440 provide a total of 32 Gigabytes (GB) of memory. HBM2 1440($i$) is associated with both memory controller 1442($i$) and HBM PHY 1444($i$). In at least one embodiment, any number of HBM2s 1440 may provide any type and total amount of high bandwidth memory and may be associated with any number (including zero) and type of memory controllers 1442 and HBM PHYs 1444. In at least one embodiment, SPI, I2C, GPIO 1460, PCIe Controller and DMA 1470, and/or PCIe 1480 may be replaced with any number and type of blocks that enable any number and type of communication standards in any technically feasible fashion.

Inference and/or training logic 615 are used to perform inferencing and/or training operations associated with one or more embodiments. Details regarding inference and/or training logic 615 are provided below in conjunction with FIGS. 6B and/or 6C. In at least one embodiment, deep learning application processor 1400 is used to train a machine learning model, such as a neural network, to predict or infer information provided to deep learning application processor 1400. In at least one embodiment, deep learning application processor 1400 is used to infer or predict information based on a trained machine learning model (such as neural network) that has been trained by another processor or system or by deep learning application processor 1400. In at least one embodiment, processor 1400 may be used to perform one or more neural network use cases described herein.

FIG. 15 is a block diagram of a neuromorphic processor 1500, according to at least one embodiment. In at least one embodiment, neuromorphic processor 1500 may receive one or more inputs from sources external to neuromorphic processor 1500. In at least one embodiment, these inputs may be transmitted to one or more neurons 1502 within neuromorphic processor 1500. In at least one embodiment, neurons 1502 and components thereof may be implemented using circuitry or logic, including one or more arithmetic logic units (ALUs). In at least one embodiment, neuromorphic processor 1500 may include, without limitation, thousands or millions of instances of neurons 1502, but any suitable number of neurons 1502 may be used. In at least one embodiment, each instance of neuron 1502 may include a neuron input 1504 and a neuron output 1506. In at least one embodiment, neurons 1502 may generate outputs that may be transmitted to inputs of other instances of neurons 1502. In at least one embodiment, in at least one embodiment, neuron inputs 1504 and neuron outputs 1506 may be interconnected via synapses 1508.

In at least one embodiment, neurons 1502 and synapses 1508 may be interconnected such that neuromorphic processor 1500 operates to process or analyze information received by neuromorphic processor 1500. In at least one embodiment, neurons 1502 may transmit an output pulse (or "fire" or "spike") when inputs received through neuron input 1504 exceed a threshold. In at least one embodiment, neurons 1502 may sum or integrate signals received at neuron inputs 1504. In at least one embodiment, in at least one embodiment, neurons 1502 may be implemented as leaky integrate-and-fire neurons, wherein if a sum (referred to as a "membrane potential") exceeds a threshold value, neuron 1502 may generate an output (or "fire") using a transfer function such as a sigmoid or threshold function. In at least one embodiment, a leaky integrate-and-fire neuron may sum signals received at neuron inputs 1504 into a membrane potential and may also apply a decay factor (or leak) to reduce a membrane potential. In at least one embodiment, a leaky integrate-and-fire neuron may fire if multiple input signals are received at neuron inputs 1504 rapidly enough to exceed a threshold value (in at least one embodiment, this is before a membrane potential decays too low to fire). In at least one embodiment, neurons 1502 may be implemented using circuits or logic that receive inputs, integrate inputs into a membrane potential, and decay a membrane potential. In at least one embodiment, inputs may be averaged, or any other suitable transfer function may be used. Furthermore, in at least one embodiment, neurons 1502 may include, without limitation, comparator circuits or logic that generate an output spike at neuron output 1506 when result of applying a transfer function to neuron input 1504 exceeds a threshold. In at least one embodiment, once neuron 1502 fires, it may disregard previously received input information by, for example, resetting a membrane potential to 0 or another suitable default value. In at least one embodiment, once membrane potential is reset to 0, neuron 1502 may resume normal operation after a suitable period of time (or refractory period).

In at least one embodiment, neurons 1502 may be interconnected through synapses 1508. In at least one embodiment, synapses 1508 may operate to transmit signals from an output of a first neuron 1502 to an input of a second neuron 1502. In at least one embodiment, neurons 1502 may transmit information over more than one instance of synapse 1508. In at least one embodiment, one or more instances of neuron output 1506 may be connected, via an instance of synapse 1508, to an instance of neuron input 1504 in same neuron 1502. In at least one embodiment, an instance of neuron 1502 generating an output to be transmitted over an instance of synapse 1508 may be referred to as a "presynaptic neuron" with respect to that instance of synapse 1508. In at least one embodiment, an instance of neuron 1502 receiving an input transmitted over an instance of synapse 1508 may be referred to as a "post-synaptic neuron" with respect to that instance of synapse 1508. Because an instance of neuron 1502 may receive inputs from one or more instances of synapse 1508, and may also transmit outputs over one or more instances of synapse 1508, a single instance of neuron 1502 may therefore be both a "presynaptic neuron" and "post-synaptic neuron," with respect to various instances of synapses 1508, in at least one embodiment.

In at least one embodiment, neurons 1502 may be organized into one or more layers. Each instance of neuron 1502 may have one neuron output 1506 that may fan out through one or more synapses 1508 to one or more neuron inputs 1504. In at least one embodiment, neuron outputs 1506 of neurons 1502 in a first layer 1510 may be connected to neuron inputs 1504 of neurons 1502 in a second layer 1512. In at least one embodiment, layer 1510 may be referred to as a "feed-forward layer." In at least one embodiment, each instance of neuron 1502 in an instance of first layer 1510 may fan out to each instance of neuron 1502 in second layer 1512. In at least one embodiment, first layer 1510 may be referred to as a "fully connected feed-forward layer." In at least one embodiment, each instance of neuron 1502 in an instance of second layer 1512 may fan out to fewer than all instances of neuron 1502 in a third layer 1514. In at least one embodiment, second layer 1512 may be referred to as a "sparsely connected feed-forward layer." In at least one embodiment, neurons 1502 in second layer 1512 may fan out to neurons 1502 in multiple other layers, including to neurons 1502 in (same) second layer 1512. In at least one embodiment, second layer 1512 may be referred to as a "recurrent layer." In at least one embodiment, neuromorphic processor 1500 may include, without limitation, any suitable combination of recurrent layers and feed-forward layers, including, without limitation, both sparsely connected feed-forward layers and fully connected feed-forward layers.

In at least one embodiment, neuromorphic processor 1500 may include, without limitation, a reconfigurable interconnect architecture or dedicated hard wired interconnects to connect synapse 1508 to neurons 1502. In at least one embodiment, neuromorphic processor 1500 may include, without limitation, circuitry or logic that allows synapses to be allocated to different neurons 1502 as needed based on neural network topology and neuron fan-in/out. In at least one embodiment, in at least one embodiment, synapses 1508 may be connected to neurons 1502 using an interconnect fabric, such as network-on-chip, or with dedicated connections. In at least one embodiment, synapse interconnections and components thereof may be implemented using circuitry or logic.

Figure 16A:
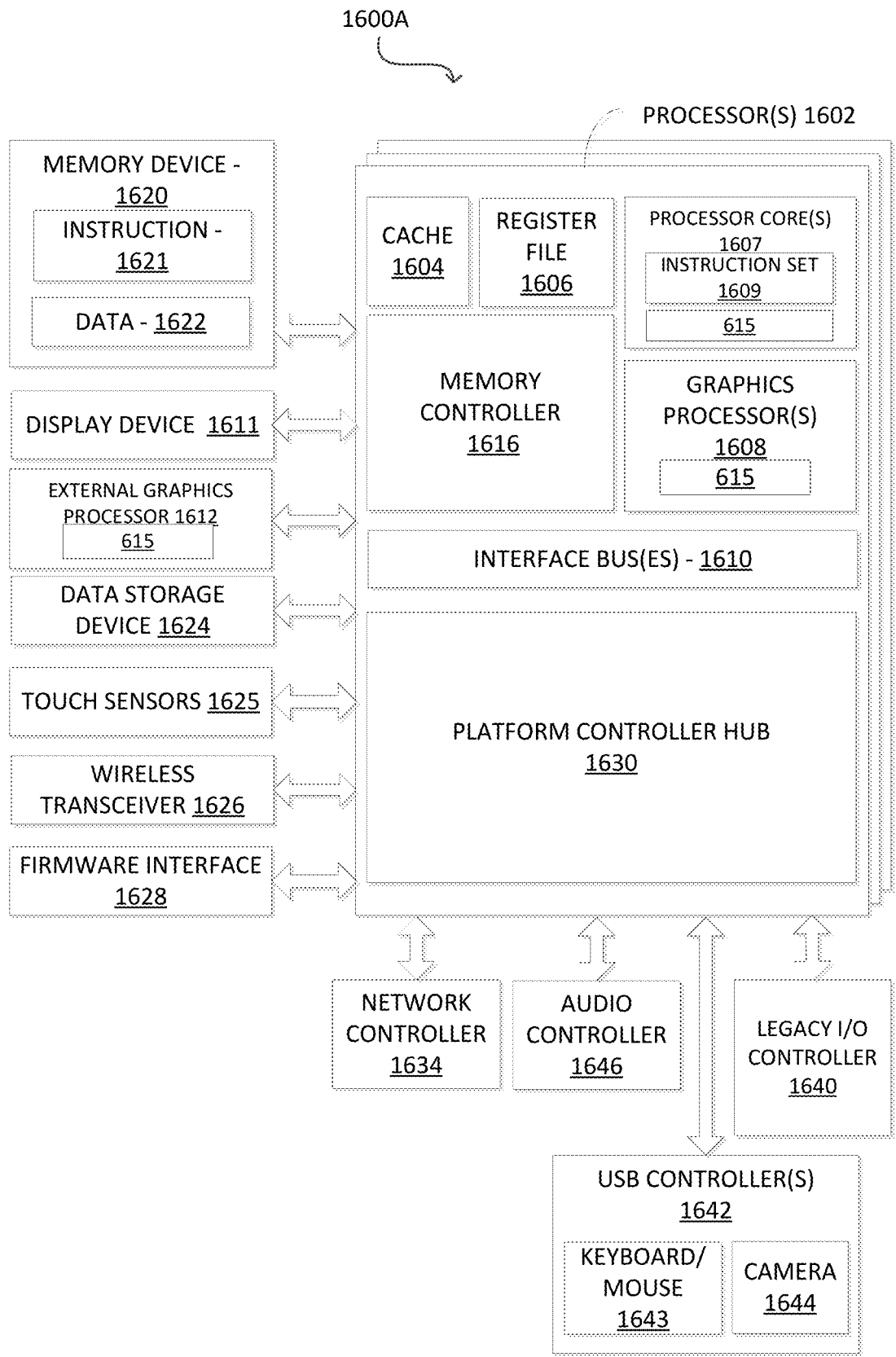
FIG. 16A is a block diagram of a processing system, according to at least one embodiment.

FIG. 16A is a block diagram of a processing system, according to at least one embodiment. In at least one embodiment, system 1600A includes one or more processors 1602 and one or more graphics processors 1608, and may be a single processor desktop system, a multiprocessor workstation system, or a server system having a large number of processors 1602 or processor cores 1607. In at least one embodiment, system 1600A is a processing platform incorporated within a system-on-a-chip (SoC) integrated circuit for use in mobile, handheld, or embedded devices.

In at least one embodiment, system 1600A can include, or be incorporated within a server-based gaming platform, a game console, including a game and media console, a mobile gaming console, a handheld game console, or an online game console. In at least one embodiment, system 1600A is a mobile phone, smart phone, tablet computing device or mobile Internet device. In at least one embodiment, processing system 1600A can also include, couple with, or be integrated within a wearable device, such as a smart watch wearable device, smart eyewear device, augmented reality device, or virtual reality device. In at least one embodiment, processing system 1600A is a television or set top box device having one or more processors 1602 and a graphical interface generated by one or more graphics processors 1608.

In at least one embodiment, one or more processors 1602 each include one or more processor cores 1607 to process instructions which, when executed, perform operations for system and user software. In at least one embodiment, each of one or more processor cores 1607 is configured to process a specific instruction set 1609. In at least one embodiment, instruction set 1609 may facilitate Complex Instruction Set Computing (CISC), Reduced Instruction Set Computing (RISC), or computing via a Very Long Instruction Word (VLIW). In at least one embodiment, processor cores 1607 may each process a different instruction set 1609, which may include instructions to facilitate emulation of other instruction sets. In at least one embodiment, processor core 1607 may also include other processing devices, such a Digital Signal Processor (DSP).

In at least one embodiment, processor 1602 includes cache memory 1604. In at least one embodiment, processor 1602 can have a single internal cache or multiple levels of internal cache. In at least one embodiment, cache memory is shared among various components of processor 1602. In at least one embodiment, processor 1602 also uses an external cache (such as a Level-3 (L3) cache or Last Level Cache (LLC)) (not shown), which may be shared among processor cores 1607 using known cache coherency techniques. In at least one embodiment, register file 1606 is additionally included in processor 1602 which may include different types of registers for storing different types of data (such as integer registers, floating point registers, status registers, and an instruction pointer register). In at least one embodiment, register file 1606 may include general-purpose registers or other registers.

In at least one embodiment, one or more processor(s) 1602 are coupled with one or more interface bus(es) 1610 to transmit communication signals such as address, data, or control signals between processor 1602 and other components in system 1600A. In at least one embodiment, interface bus 1610, in one embodiment, can be a processor bus, such as a version of a Direct Media Interface (DMI) bus. In at least one embodiment, interface 1610 is not limited to a DMI bus, and may include one or more Peripheral Component Interconnect buses (such as PCI, PCI Express), memory busses, or other types of interface busses. In at least one embodiment processor(s) 1602 include an integrated memory controller 1616 and a platform controller hub 1630. In at least one embodiment, memory controller 1616 facilitates communication between a memory device and other components of system 1600A, while platform controller hub (PCH) 1630 provides connections to I/O devices via a local I/O bus.

In at least one embodiment, memory device 1620 can be a dynamic random access memory (DRAM) device, a static random access memory (SRAM) device, flash memory device, phase-change memory device, or some other memory device having suitable performance to serve as process memory. In at least one embodiment memory device 1620 can operate as system memory for system 1600A, to store data 1622 and instructions 1621 for use when one or more processors 1602 executes an application or process. In at least one embodiment, memory controller 1616 also couples with an, in at least one embodiment, external graphics processor 1612, which may communicate with one or more graphics processors 1608 in processors 1602 to perform graphics and media operations. In at least one embodiment, a display device 1611 can connect to processor(s) 1602. In at least one embodiment display device 1611 can include one or more of an internal display device, as in a mobile electronic device or a laptop device or an external display device attached via a display interface (such as DisplayPort, etc.). In at least one embodiment, display device 1611 can include a head mounted display (HMD) such as a stereoscopic display device for use in virtual reality (VR) applications or augmented reality (AR) applications.

In at least one embodiment, platform controller hub 1630 enables peripherals to connect to memory device 1620 and processor 1602 via a high-speed I/O bus. In at least one embodiment, I/O peripherals include, but are not limited to, an audio controller 1646, a network controller 1634, a firmware interface 1628, a wireless transceiver 1626, touch sensors 1625, a data storage device 1624 (such as hard disk drive, flash memory, etc.). In at least one embodiment, data storage device 1624 can connect via a storage interface (such as SATA) or via a peripheral bus, such as a Peripheral Component Interconnect bus (such as PCI, PCI Express). In at least one embodiment, touch sensors 1625 can include touch screen sensors, pressure sensors, or fingerprint sensors. In at least one embodiment, wireless transceiver 1626 can be a Wi-Fi transceiver, a Bluetooth transceiver, or a mobile network transceiver such as a 3G, 4G, or Long Term Evolution (LTE) transceiver. In at least one embodiment, firmware interface 1628 enables communication with system firmware, and can be, for example, a unified extensible firmware interface (UEFI). In at least one embodiment, network controller 1634 can enable a network connection to a wired network. In at least one embodiment, a high-performance network controller (not shown) couples with interface bus 1610. In at least one embodiment, audio controller 1646 is a multi-channel high definition audio controller. In at least one embodiment, system 1600A includes a legacy I/O controller 1640 for coupling legacy (such as Personal System 2 (PS/2)) devices to system. In at least one embodiment, platform controller hub 1630 can also connect to one or more Universal Serial Bus (USB) controllers 1642 connect input devices, such as keyboard and mouse 1643 combinations, a camera 1644, or other USB input devices.

In at least one embodiment, an instance of memory controller 1616 and platform controller hub 1630 may be integrated into a discreet external graphics processor, such as external graphics processor 1612. In at least one embodiment, platform controller hub 1630 and/or memory controller 1616 may be external to one or more processor(s) 1602. In at least one embodiment, in at least one embodiment, system 1600A can include an external memory controller 1616 and platform controller hub 1630, which may be configured as a memory controller hub and peripheral controller hub within a system chipset that is in communication with processor(s) 1602.

Inference and/or training logic 615 are used to perform inferencing and/or training operations associated with one or more embodiments. Details regarding inference and/or training logic 615 are provided below in conjunction with FIGS. 6B and/or 6C. In at least one embodiment portions or all of inference and/or training logic 615 may be incorporated into graphics processor 1600A. In at least one embodiment, in at least one embodiment, training and/or inferencing techniques described herein may use one or more of ALUs embodied in graphics processor 1612. Moreover, in at least one embodiment, inferencing and/or training operations described herein may be done using logic other than logic illustrated in FIG. 6B or 6C. In at least one embodiment, weight parameters may be stored in on-chip or off-chip memory and/or registers (shown or not shown) that configure ALUs of graphics processor 1600A to perform one or more machine learning algorithms, neural network architectures, use cases, or training techniques described herein.

Figure 16B:
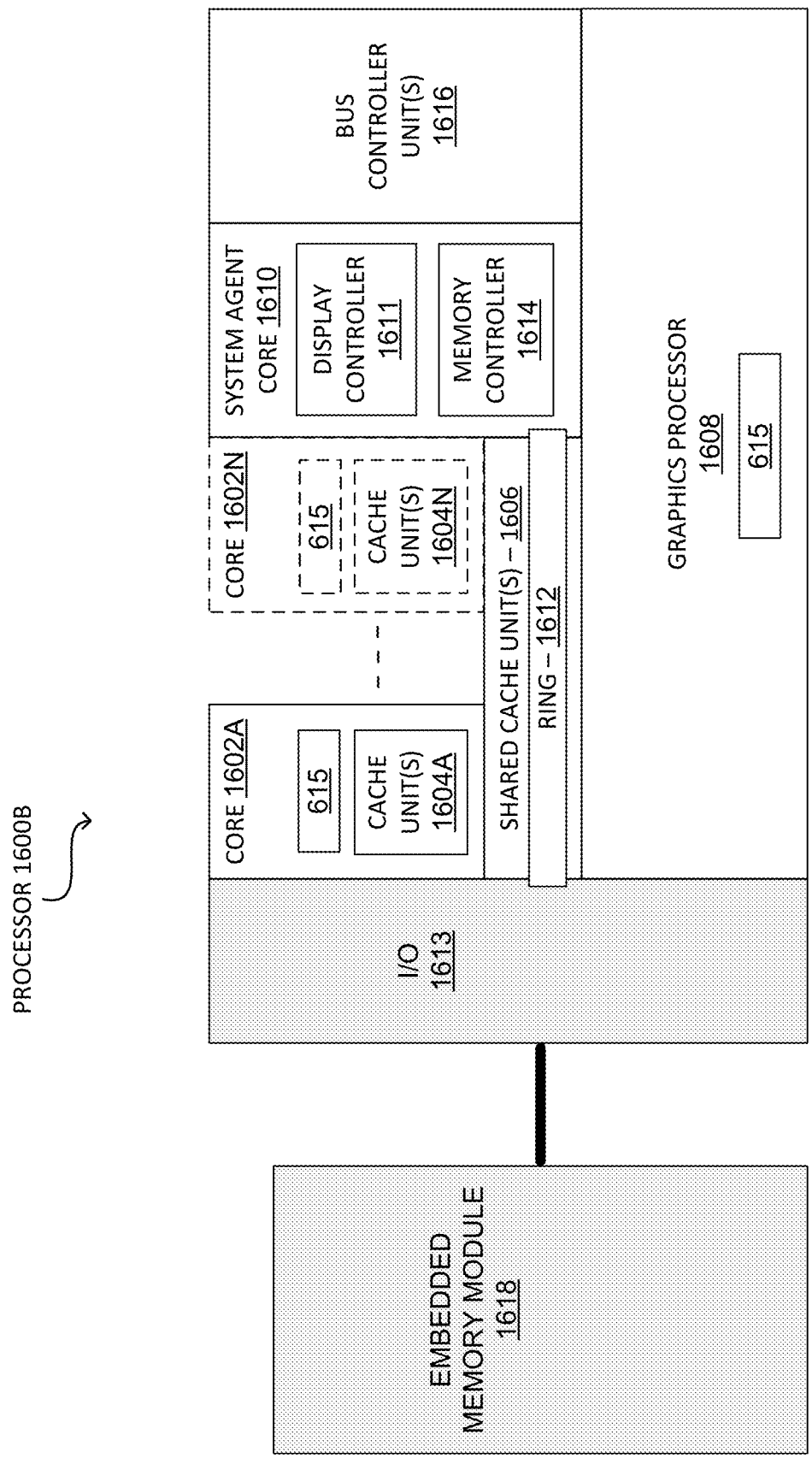
FIG. 16B is a block diagram of a processor having one or more processor cores, an integrated memory controller, and an integrated graphics processor, according to at least one embodiment.

FIG. 16B is a block diagram of a processor 1600B having one or more processor cores 1602A-1602N, an integrated memory controller 1614, and an integrated graphics processor 1608, according to at least one embodiment. In at least one embodiment, processor 1600B can include additional cores up to and including additional core 1602N represented by dashed lined boxes. In at least one embodiment, each of processor cores 1602A-1602N includes one or more internal cache units 1604A-1604N. In at least one embodiment, each processor core also has access to one or more shared cached units 1606.

In at least one embodiment, internal cache units 1604A-1604N and shared cache units 1606 represent a cache memory hierarchy within processor 1600B. In at least one embodiment, cache memory units 1604A-1604N may include at least one level of instruction and data cache within each processor core and one or more levels of shared mid-level cache, such as a Level 2 (L2), Level 3 (L3), Level 4 (L4), or other levels of cache, where a highest level of cache before external memory is classified as an LLC. In at least one embodiment, cache coherency logic maintains coherency between various cache units 1606 and 1604A-1604N.

In at least one embodiment, processor 1600B may also include a set of one or more bus controller units 1616 and a system agent core 1610. In at least one embodiment, one or more bus controller units 1616 manage a set of peripheral buses, such as one or more PCI or PCI express busses. In at least one embodiment, system agent core 1610 provides management functionality for various processor components. In at least one embodiment, system agent core 1610 includes one or more integrated memory controllers 1614 to manage access to various external memory devices (not shown).

In at least one embodiment, one or more of processor cores 1602A-1602N include support for simultaneous multi-threading. In at least one embodiment, system agent core 1610 includes components for coordinating and operating cores 1602A-1602N during multi-threaded processing. In at least one embodiment, system agent core 1610 may additionally include a power control unit (PCU), which includes logic and components to regulate one or more power states of processor cores 1602A-1602N and graphics processor 1608.

In at least one embodiment, processor 1600B additionally includes graphics processor 1608 to execute graphics processing operations. In at least one embodiment, graphics processor 1608 couples with shared cache units 1606, and system agent core 1610, including one or more integrated memory controllers 1614. In at least one embodiment, system agent core 1610 also includes a display controller 1611 to drive graphics processor output to one or more coupled displays. In at least one embodiment, display controller 1611 may also be a separate module coupled with graphics processor 1608 via at least one interconnect, or may be integrated within graphics processor 1608.

In at least one embodiment, a ring based interconnect unit 1612 is used to couple internal components of processor 1600B. In at least one embodiment, an alternative interconnect unit may be used, such as a point-to-point interconnect, a switched interconnect, or other techniques. In at least one embodiment, graphics processor 1608 couples with ring interconnect 1612 via an I/O link 1613.

In at least one embodiment, I/O link 1613 represents at least one of multiple varieties of I/O interconnects, including an on package I/O interconnect which facilitates communication between various processor components and a high-performance embedded memory module 1618, such as an eDRAM module. In at least one embodiment, each of processor cores 1602A-1602N and graphics processor 1608 use embedded memory modules 1618 as a shared Last Level Cache.

In at least one embodiment, processor cores 1602A-1602N are homogenous cores executing a common instruction set architecture. In at least one embodiment, processor cores 1602A-1602N are heterogeneous in terms of instruction set architecture (ISA), where one or more of processor cores 1602A-1602N execute a common instruction set, while one or more other cores of processor cores 1602A-16-02N executes a subset of a common instruction set or a different instruction set. In at least one embodiment, processor cores 1602A-1602N are heterogeneous in terms of microarchitecture, where one or more cores having a relatively higher power consumption couple with one or more power cores having a lower power consumption. In at least one embodiment, processor 1600B can be implemented on one or more chips or as an SoC integrated circuit.

Inference and/or training logic 615 are used to perform inferencing and/or training operations associated with one or more embodiments. Details regarding inference and/or training logic 615 are provided below in conjunction with FIGS. 6B and/or 6C. In at least one embodiment portions or all of inference and/or training logic 615 may be incorporated into processor 1600B. In at least one embodiment, in at least one embodiment, training and/or inferencing techniques described herein may use one or more of ALUs embodied in graphics processor 1612, graphics core(s) 1602A-1602N, or other components in FIG. 16. Moreover, in at least one embodiment, inferencing and/or training operations described herein may be done using logic other than logic illustrated in FIG. 6B or 6C. In at least one embodiment, weight parameters may be stored in on-chip or off-chip memory and/or registers (shown or not shown) that configure ALUs of graphics processor 1600B to perform one or more machine learning algorithms, neural network architectures, use cases, or training techniques described herein.

Figure 16C:
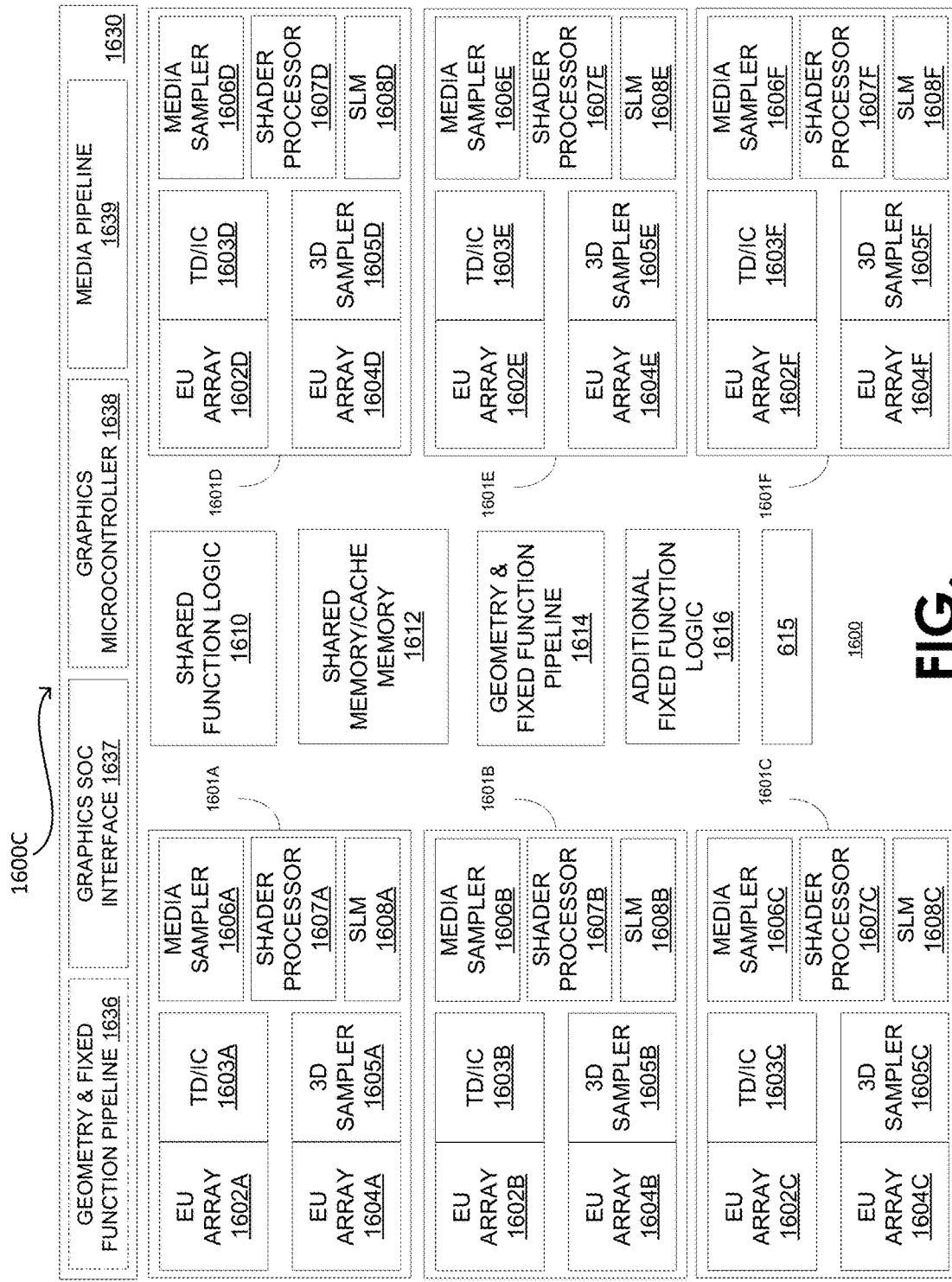
FIG. 16C is a block diagram of hardware logic of a graphics processor core, according to at least one embodiment.

FIG. 16C is a block diagram of hardware logic of a graphics processor core 1600C, according to at least one embodiment described herein. In at least one embodiment, graphics processor core 1600C is included within a graphics core array. In at least one embodiment, graphics processor core 1600C, sometimes referred to as a core slice, can be one or multiple graphics cores within a modular graphics processor. In at least one embodiment, graphics processor core 1600C is exemplary of one graphics core slice, and a graphics processor as described herein may include multiple graphics core slices based on target power and performance envelopes. In at least one embodiment, each graphics core 1600C can include a fixed function block 1630 coupled with multiple sub-cores 1601A-1601F, also referred to as sub-slices, that include modular blocks of general-purpose and fixed function logic.

In at least one embodiment, fixed function block 1630 includes a geometry/fixed function pipeline 1636 that can be shared by all sub-cores in graphics processor 1600C, for example, in lower performance and/or lower power graphics processor implementations. In at least one embodiment, geometry/fixed function pipeline 1636 includes a 3D fixed function pipeline, a video front-end unit, a thread spawner and thread dispatcher, and a unified return buffer manager, which manages unified return buffers.

In at least one embodiment fixed, function block 1630 also includes a graphics SoC interface 1637, a graphics microcontroller 1638, and a media pipeline 1639. In at least one embodiment fixed, graphics SoC interface 1637 provides an interface between graphics core 1600C and other processor cores within a system on a chip integrated circuit. In at least one embodiment, graphics microcontroller 1638 is a programmable sub-processor that is configurable to manage various functions of graphics processor 1600C, including thread dispatch, scheduling, and pre-emption. In at least one embodiment, media pipeline 1639 includes logic to facilitate decoding, encoding, pre-processing, and/or post-processing of multimedia data, including image and video data. In at least one embodiment, media pipeline 1639 implements media operations via requests to compute or sampling logic within sub-cores 1601-1601F.

In at least one embodiment, SoC interface 1637 enables graphics core 1600C to communicate with general-purpose application processor cores (such as CPUs) and/or other components within an SoC, including memory hierarchy elements such as a shared last level cache memory, system RAM, and/or embedded on-chip or on-package DRAM. In at least one embodiment, SoC interface 1637 can also enable communication with fixed function devices within an SoC, such as camera imaging pipelines, and enables use of and/or implements global memory atomics that may be shared between graphics core 1600C and CPUs within an SoC. In at least one embodiment, SoC interface 1637 can also implement power management controls for graphics core 1600C and enable an interface between a clock domain of graphic core 1600C and other clock domains within an SoC. In at least one embodiment, SoC interface 1637 enables receipt of command buffers from a command streamer and global thread dispatcher that are configured to provide commands and instructions to each of one or more graphics cores within a graphics processor. In at least one embodiment, commands and instructions can be dispatched to media pipeline 1639, when media operations are to be performed, or a geometry and fixed function pipeline (such as geometry and fixed function pipeline 1636, geometry and fixed function pipeline 1614) when graphics processing operations are to be performed.

In at least one embodiment, graphics microcontroller 1638 can be configured to perform various scheduling and management tasks for graphics core 1600C. In at least one embodiment, graphics microcontroller 1638 can perform graphics and/or compute workload scheduling on various graphics parallel engines within execution unit (EU) arrays 1602A-1602F, 1604A-1604F within sub-cores 1601A-1601F. In at least one embodiment, host software executing on a CPU core of an SoC including graphics core 1600C can submit workloads one of multiple graphic processor doorbells, which invokes a scheduling operation on an appropriate graphics engine. In at least one embodiment, scheduling operations include determining which workload to run next, submitting a workload to a command streamer, preempting existing workloads running on an engine, monitoring progress of a workload, and notifying host software when a workload is complete. In at least one embodiment, graphics microcontroller 1638 can also facilitate low-power or idle states for graphics core 1600C, providing graphics core 1600C with an ability to save and restore registers within graphics core 1600C across low-power state transitions independently from an operating system and/or graphics driver software on a system.

In at least one embodiment, graphics core 1600C may have greater than or fewer than illustrated sub-cores 1601A-1601F, up to N modular sub-cores. For each set of N sub-cores, in at least one embodiment, graphics core 1600C can also include shared function logic 1610, shared and/or cache memory 1612, a geometry/fixed function pipeline 1614, as well as additional fixed function logic 1616 to accelerate various graphics and compute processing operations. In at least one embodiment, shared function logic 1610 can include logic units (such as sampler, math, and/or inter-thread communication logic) that can be shared by each N sub-cores within graphics core 1600C. In at least one embodiment fixed, shared and/or cache memory 1612 can be a last-level cache for N sub-cores 1601A-1601F within graphics core 1600C and can also serve as shared memory that is accessible by multiple sub-cores. In at least one embodiment, geometry/fixed function pipeline 1614 can be included instead of geometry/fixed function pipeline 1636 within fixed function block 1630 and can include same or similar logic units.

In at least one embodiment, graphics core 1600C includes additional fixed function logic 1616 that can include various fixed function acceleration logic for use by graphics core 1600C. In at least one embodiment, additional fixed function logic 1616 includes an additional geometry pipeline for use in position only shading. In position-only shading, at least two geometry pipelines exist, whereas in a full geometry pipeline within geometry/fixed function pipeline 1616, 1636, and a cull pipeline, which is an additional geometry pipeline which may be included within additional fixed function logic 1616. In at least one embodiment, cull pipeline is a trimmed down version of a full geometry pipeline. In at least one embodiment, a full pipeline and a cull pipeline can execute different instances of an application, each instance having a separate context. In at least one embodiment, position only shading can hide long cull runs of discarded triangles, enabling shading to be completed earlier in some instances. In at least one embodiment, in at least one embodiment, cull pipeline logic within additional fixed function logic 1616 can execute position shaders in parallel with a main application and generates critical results faster than a full pipeline, as cull pipeline fetches and shades position attribute of vertices, without performing rasterization and rendering of pixels to a frame buffer. In at least one embodiment, cull pipeline can use generated critical results to compute visibility information for all triangles without regard to whether those triangles are culled. In at least one embodiment, full pipeline (which in this instance may be referred to as a replay pipeline) can consume visibility information to skip culled triangles to shade only visible triangles that are finally passed to a rasterization phase.

In at least one embodiment, additional fixed function logic 1616 can also include machine-learning acceleration logic, such as fixed function matrix multiplication logic, for implementations including optimizations for machine learning training or inferencing.

In at least one embodiment, within each graphics sub-core 1601A-1601F includes a set of execution resources that may be used to perform graphics, media, and compute operations in response to requests by graphics pipeline, media pipeline, or shader programs. In at least one embodiment, graphics sub-cores 1601A-1601F include multiple EU arrays 1602A-1602F, 1604A-1604F, thread dispatch and inter-thread communication (TD/IC) logic 1603A-1603F, a 3D (such as texture) sampler 1605A-1605F, a media sampler 1606A-1606F, a shader processor 1607A-1607F, and shared local memory (SLM) 1608A-1608F. EU arrays 1602A-1602F, 1604A-1604F each include multiple execution units, which are general-purpose graphics processing units capable of performing floating-point and integer/fixed-point logic operations in service of a graphics, media, or compute operation, including graphics, media, or compute shader programs. In at least one embodiment, TD/IC logic 1603A-1603F performs local thread dispatch and thread control operations for execution units within a sub-core and facilitate communication between threads executing on execution units of a sub-core. In at least one embodiment, 3D sampler 1605A-1605F can read texture or other 3D graphics related data into memory. In at least one embodiment, 3D sampler can read texture data differently based on a configured sample state and texture format associated with a given texture. In at least one embodiment, media sampler 1606A-1606F can perform similar read operations based on a type and format associated with media data. In at least one embodiment, each graphics sub-core 1601A-1601F can alternately include a unified 3D and media sampler. In at least one embodiment, threads executing on execution units within each of sub-cores 1601A-1601F can make use of shared local memory 1608A-1608F within each sub-core, to enable threads executing within a thread group to execute using a common pool of on-chip memory.

Inference and/or training logic 615 are used to perform inferencing and/or training operations associated with one or more embodiments. Details regarding inference and/or training logic 615 are provided below in conjunction with FIGS. 6B and/or 6C. In at least one embodiment, portions or all of inference and/or training logic 615 may be incorporated into graphics processor 1610. In at least one embodiment, in at least one embodiment, training and/or inferencing techniques described herein may use one or more of ALUs embodied in graphics processor 1612, graphics microcontroller 1638, geometry & fixed function pipeline 1614 and 1636, or other logic in FIG. 16B. Moreover, in at least one embodiment, inferencing and/or training operations described herein may be done using logic other than logic illustrated in FIG. 6B or 6C. In at least one embodiment, weight parameters may be stored in on-chip or off-chip memory and/or registers (shown or not shown) that configure ALUs of graphics processor 1600C to perform one or more machine learning algorithms, neural network architectures, use cases, or training techniques described herein.

Figure 16D:
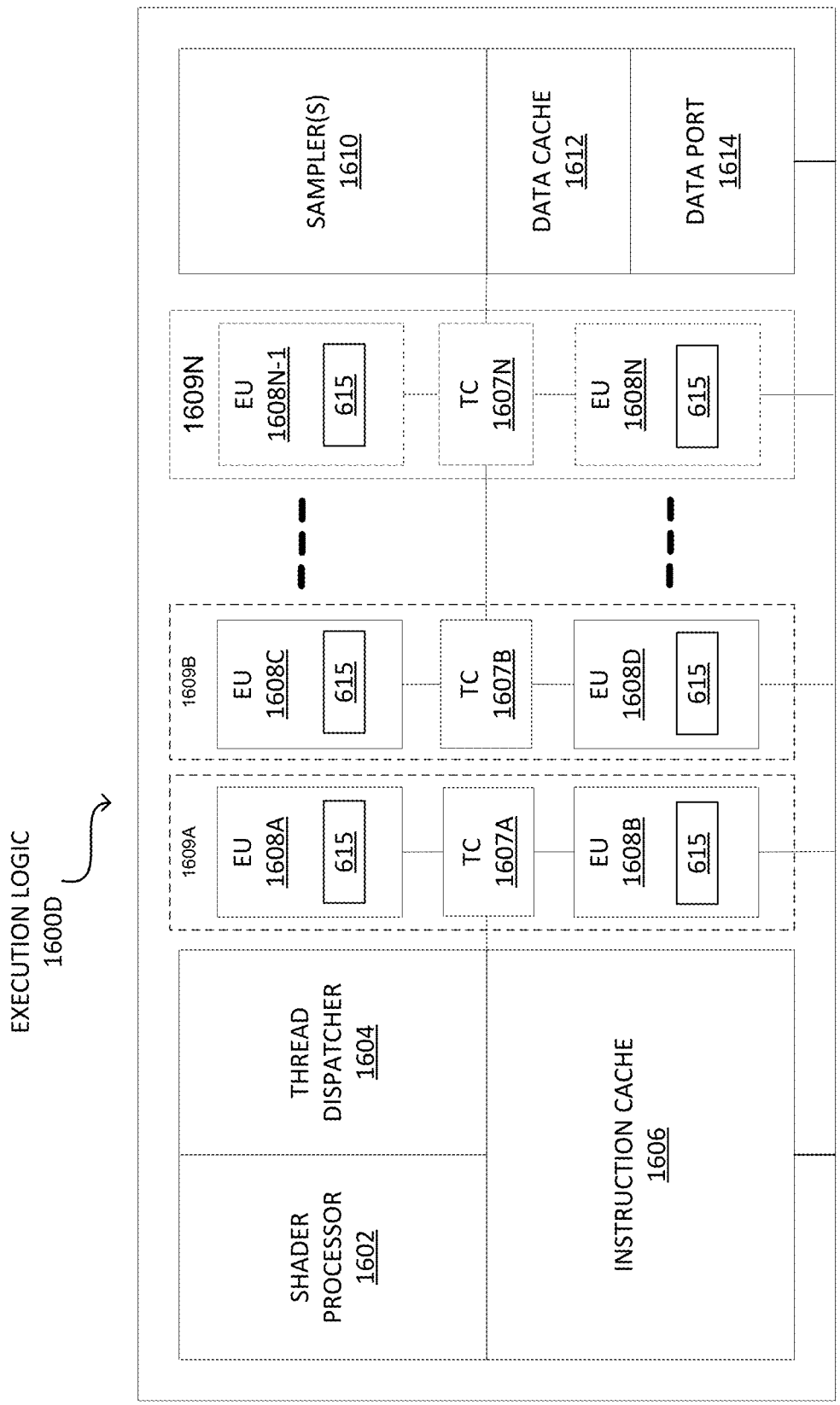
FIGS. 16D-16E illustrate thread execution logic including an array of processing elements of a graphics processor core according to at least one embodiment.
Figure 16E:
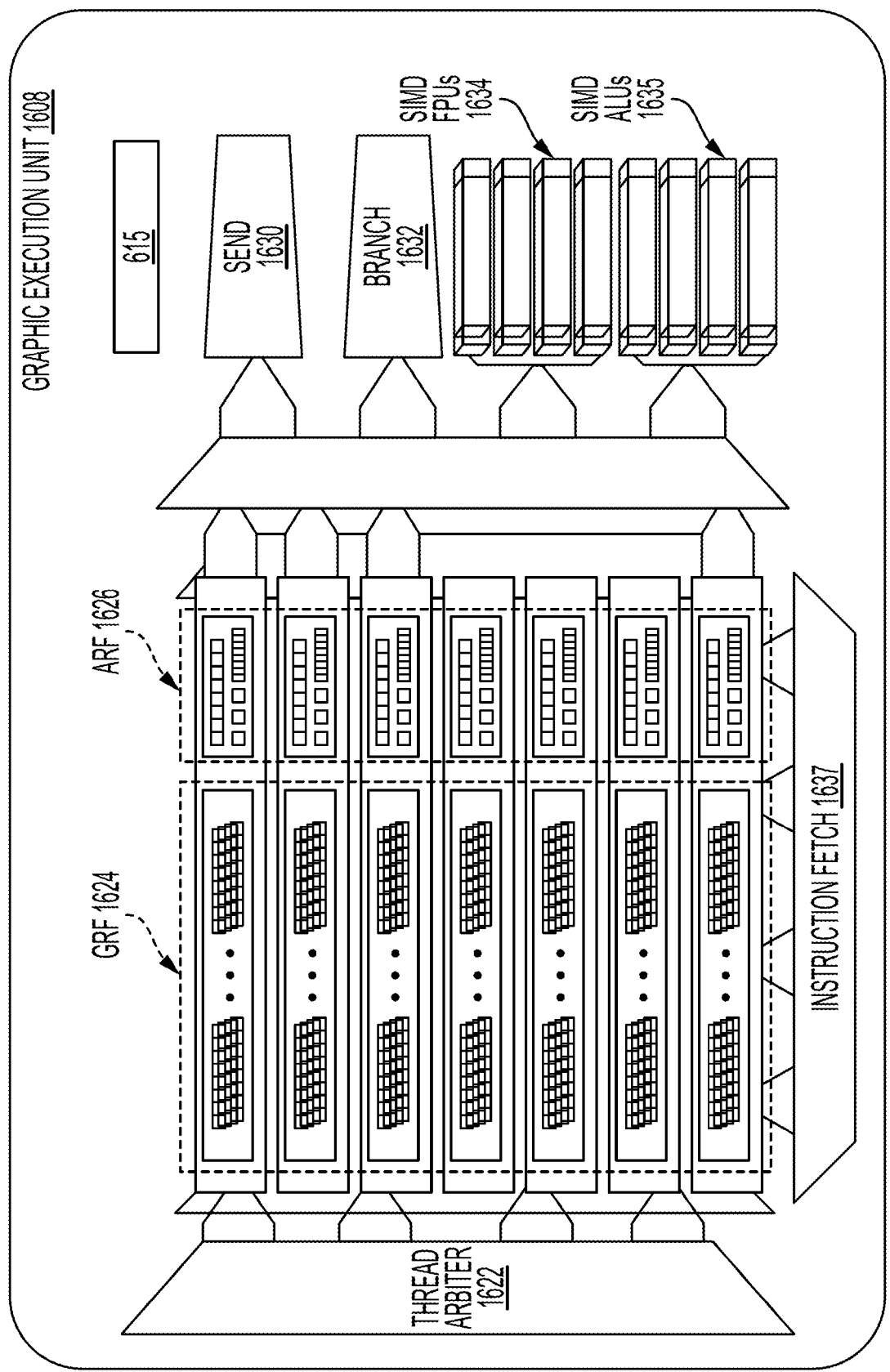

FIGS. 16D-16E illustrate thread execution logic 1600D including an array of processing elements of a graphics processor core according to at least one embodiment. FIG. 16D illustrates at least one embodiment, in which thread execution logic 1600D is used. FIG. 16E illustrates exemplary internal details of an execution unit, according to at least one embodiment.

As illustrated in FIG. 16D, in at least one embodiment, thread execution logic 1600D includes a shader processor 1602, a thread dispatcher 1604, instruction cache 1606, a scalable execution unit array including a plurality of execution units 1608A-1608N, sampler(s) 1610, a data cache 1612, and a data port 1614. In at least one embodiment a scalable execution unit array can dynamically scale by enabling or disabling one or more execution units (such as any of execution unit 1608A, 1608B, 1608C, 1608D, through 1608N-1 and 1608N) based on computational requirements of a workload, for example. In at least one embodiment, scalable execution units are interconnected via an interconnect fabric that links to each of execution unit. In at least one embodiment, thread execution logic 1600D includes one or more connections to memory, such as system memory or cache memory, through one or more of instruction cache 1606, data port 1614, sampler 1610, and execution units 1608A-1608N. In at least one embodiment, each execution unit (such as 1608A) is a stand-alone programmable general-purpose computational unit that is capable of executing multiple simultaneous hardware threads while processing multiple data elements in parallel for each thread. In at least one embodiment, array of execution units 1608A-1608N is scalable to include any number individual execution units.

In at least one embodiment, execution units 1608A-1608N are primarily used to execute shader programs. In at least one embodiment, shader processor 1602 can process various shader programs and dispatch execution threads associated with shader programs via a thread dispatcher 1604. In at least one embodiment, thread dispatcher 1604 includes logic to arbitrate thread initiation requests from graphics and media pipelines and instantiate requested threads on one or more execution units in execution units 1608A-1608N. In at least one embodiment, in at least one embodiment, a geometry pipeline can dispatch vertex, tessellation, or geometry shaders to thread execution logic for processing. In at least one embodiment, thread dispatcher 1604 can also process runtime thread spawning requests from executing shader programs.

In at least one embodiment, execution units 1608A-1608N support an instruction set that includes native support for many standard 3D graphics shader instructions, such that shader programs from graphics libraries (such as Direct 3D and OpenGL) are executed with a minimal translation. In at least one embodiment, execution units support vertex and geometry processing (such as vertex programs, geometry programs, vertex shaders), pixel processing (such as pixel shaders, fragment shaders) and general-purpose processing (such as compute and media shaders). In at least one embodiment, each of execution units 1608A-1608N, which include one or more arithmetic logic units (ALUs), is capable of multi-issue single instruction multiple data (SIMD) execution and multi-threaded operation enables an efficient execution environment despite higher latency memory accesses. In at least one embodiment, each hardware thread within each execution unit has a dedicated high-bandwidth register file and associated independent thread-state. In at least one embodiment, execution is multi-issue per clock to pipelines capable of integer, single and double precision floating point operations, SIMD branch capability, logical operations, transcendental operations, and other miscellaneous operations. In at least one embodiment, while waiting for data from memory or one of shared functions, dependency logic within execution units 1608A-1608N causes a waiting thread to sleep until requested data has been returned. In at least one embodiment, while a waiting thread is sleeping, hardware resources may be devoted to processing other threads. In at least one embodiment, in at least one embodiment, during a delay associated with a vertex shader operation, an execution unit can perform operations for a pixel shader, fragment shader, or another type of shader program, including a different vertex shader.

In at least one embodiment, each execution unit in execution units 1608A-1608N operates on arrays of data elements. In at least one embodiment, a number of data elements is "execution size," or number of channels for an instruction. In at least one embodiment, an execution channel is a logical unit of execution for data element access, masking, and flow control within instructions. In at least one embodiment, a number of channels may be independent of a number of physical Arithmetic Logic Units (ALUs) or Floating Point Units (FPUs) for a particular graphics processor. In at least one embodiment, execution units 1608A-1608N support integer and floating-point data types.

In at least one embodiment, an execution unit instruction set includes SIMD instructions. In at least one embodiment, various data elements can be stored as a packed data type in a register and an execution unit will process various elements based on data size of elements. In at least one embodiment, in at least one embodiment, when operating on a 256-bit wide vector, 256 bits of a vector are stored in a register and an execution unit operates on a vector as four separate 64-bit packed data elements (Quad-Word (QW) size data elements), eight separate 32-bit packed data elements (Double Word (DW) size data elements), sixteen separate 16-bit packed data elements (Word (W) size data elements), or thirty-two separate 8-bit data elements (byte (B) size data elements). However, in at least one embodiment, different vector widths and register sizes are possible.

In at least one embodiment, one or more execution units can be combined into a fused execution unit 1609A-1609N having thread control logic (1607A-1607N) that is common to fused EUs. In at least one embodiment, multiple EUs can be fused into an EU group. In at least one embodiment, each EU in fused EU group can be configured to execute a separate SIMD hardware thread. Number of EUs in a fused EU group can vary according to various embodiments. In at least one embodiment, various SIMD widths can be performed per-EU, including but not limited to SIMD8, SIMD16, and SIMD32. In at least one embodiment, each fused graphics execution unit 1609A-1609N includes at least two execution units. In at least one embodiment, in at least one embodiment, fused execution unit 1609A includes a first EU 1608A, second EU 1608B, and thread control logic 1607A that is common to first EU 1608A and second EU 1608B. In at least one embodiment, thread control logic 1607A controls threads executed on fused graphics execution unit 1609A, allowing each EU within fused execution units 1609A-1609N to execute using a common instruction pointer register.

In at least one embodiment, one or more internal instruction caches (such as 1606) are included in thread execution logic 1600D to cache thread instructions for execution units. In at least one embodiment, one or more data caches (such as 1612) are included to cache thread data during thread execution. In at least one embodiment, a sampler 1610 is included to provide texture sampling for 3D operations and media sampling for media operations. In at least one embodiment, sampler 1610 includes specialized texture or media sampling functionality to process texture or media data during a sampling process before providing sampled data to an execution unit.

During execution, in at least one embodiment, graphics and media pipelines send thread initiation requests to thread execution logic 1600D via thread spawning and dispatch logic. In at least one embodiment, once a group of geometric objects has been processed and rasterized into pixel data, pixel processor logic (such as pixel shader logic, fragment shader logic, etc.) within shader processor 1602 is invoked to further compute output information and cause results to be written to output surfaces (such as color buffers, depth buffers, stencil buffers, etc.). In at least one embodiment, a pixel shader or fragment shader calculates values of various vertex attributes that are to be interpolated across a rasterized object. In at least one embodiment, pixel processor logic within shader processor 1602 then executes an application programming interface (API)-supplied pixel or fragment shader program. In at least one embodiment, to execute a shader program, shader processor 1602 dispatches threads to an execution unit (such as 1608A) via thread dispatcher 1604. In at least one embodiment, shader processor 1602 uses texture sampling logic in sampler 1610 to access texture data in texture maps stored in memory. In at least one embodiment, arithmetic operations on texture data and input geometry data compute pixel color data for each geometric fragment, or discards one or more pixels from further processing.

In at least one embodiment, data port 1614 provides a memory access mechanism for thread execution logic 1600D to output processed data to memory for further processing on a graphics processor output pipeline. In at least one embodiment, data port 1614 includes or couples to one or more cache memories (such as data cache 1612) to cache data for memory access via a data port.

As illustrated in FIG. 16E, in at least one embodiment, a graphics execution unit 1608 can include an instruction fetch unit 1637, a general register file array (GRF) 1624, an architectural register file array (ARF) 1626, a thread arbiter 1622, a send unit 1630, a branch unit 1632, a set of SIMD floating point units (FPUs) 1634, and, in at least one embodiment, a set of dedicated integer SIMD ALUs 1635. In at least one embodiment, GRF 1624 and ARF 1626 includes a set of general register files and architecture register files associated with each simultaneous hardware thread that may be active in graphics execution unit 1608. In at least one embodiment, per thread architectural state is maintained in ARF 1626, while data used during thread execution is stored in GRF 1624. In at least one embodiment, execution state of each thread, including instruction pointers for each thread, can be held in thread-specific registers in ARF 1626.

In at least one embodiment, graphics execution unit 1608 has an architecture that is a combination of Simultaneous Multi-Threading (SMT) and fine-grained Interleaved Multi-Threading (IMT). In at least one embodiment, architecture has a modular configuration that can be fine-tuned at design time based on a target number of simultaneous threads and number of registers per execution unit, where execution unit resources are divided across logic used to execute multiple simultaneous threads.

In at least one embodiment, graphics execution unit 1608 can co-issue multiple instructions, which may each be different instructions. In at least one embodiment, thread arbiter 1622 of graphics execution unit thread 1608 can dispatch instructions to one of send unit 1630, branch unit 1642, or SIMD FPU(s) 1634 for execution. In at least one embodiment, each execution thread can access 128 general-purpose registers within GRF 1624, where each register can store 32 bytes, accessible as a SIMD 8-element vector of 32-bit data elements. In at least one embodiment, each execution unit thread has access to 4 Kbytes within GRF 1624, although embodiments are not so limited, and greater or fewer register resources may be provided in other embodiments. In at least one embodiment, up to seven threads can execute simultaneously, although a number of threads per execution unit can also vary according to embodiments. In at least one embodiment, in which seven threads may access 4 Kbytes, GRF 1624 can store a total of 28 Kbytes. In at least one embodiment, flexible addressing modes can permit registers to be addressed together to build effectively wider registers or to represent strided rectangular block data structures.

In at least one embodiment, memory operations, sampler operations, and other longer-latency system communications are dispatched via "send" instructions that are executed by message passing send unit 1630. In at least one embodiment, branch instructions are dispatched to a dedicated branch unit 1632 to facilitate SIMD divergence and eventual convergence.

In at least one embodiment graphics execution unit 1608 includes one or more SIMD floating point units (FPU(s)) 1634 to perform floating-point operations. In at least one embodiment, FPU(s) 1634 also support integer computation. In at least one embodiment FPU(s) 1634 can SIMD execute up to M number of 32-bit floating-point (or integer) operations, or SIMD execute up to 2M 16-bit integer or 16-bit floating-point operations. In at least one embodiment, at least one of FPU(s) provides extended math capability to support high-throughput transcendental math functions and double precision 64-bit floating-point. In at least one embodiment, a set of 8-bit integer SIMD ALUs 1635 are also present, and may be specifically optimized to perform operations associated with machine learning computations.

In at least one embodiment, arrays of multiple instances of graphics execution unit 1608 can be instantiated in a graphics sub-core grouping (such as a sub-slice). In at least one embodiment, execution unit 1608 can execute instructions across a plurality of execution channels. In at least one embodiment, each thread executed on graphics execution unit 1608 is executed on a different channel.

Inference and/or training logic 615 are used to perform inferencing and/or training operations associated with one or more embodiments. Details regarding inference and/or training logic 615 are provided below in conjunction with FIGS. 6B and/or 6C. In at least one embodiment, portions or all of inference and/or training logic 615 may be incorporated into execution logic 1600D. Moreover, in at least one embodiment, inferencing and/or training operations described herein may be done using logic other than logic illustrated in FIG. 6B or 6C. In at least one embodiment, weight parameters may be stored in on-chip or off-chip memory and/or registers (shown or not shown) that configure ALUs of execution logic 1600D to perform one or more machine learning algorithms, neural network architectures, use cases, or training techniques described herein.

Figure 17A:
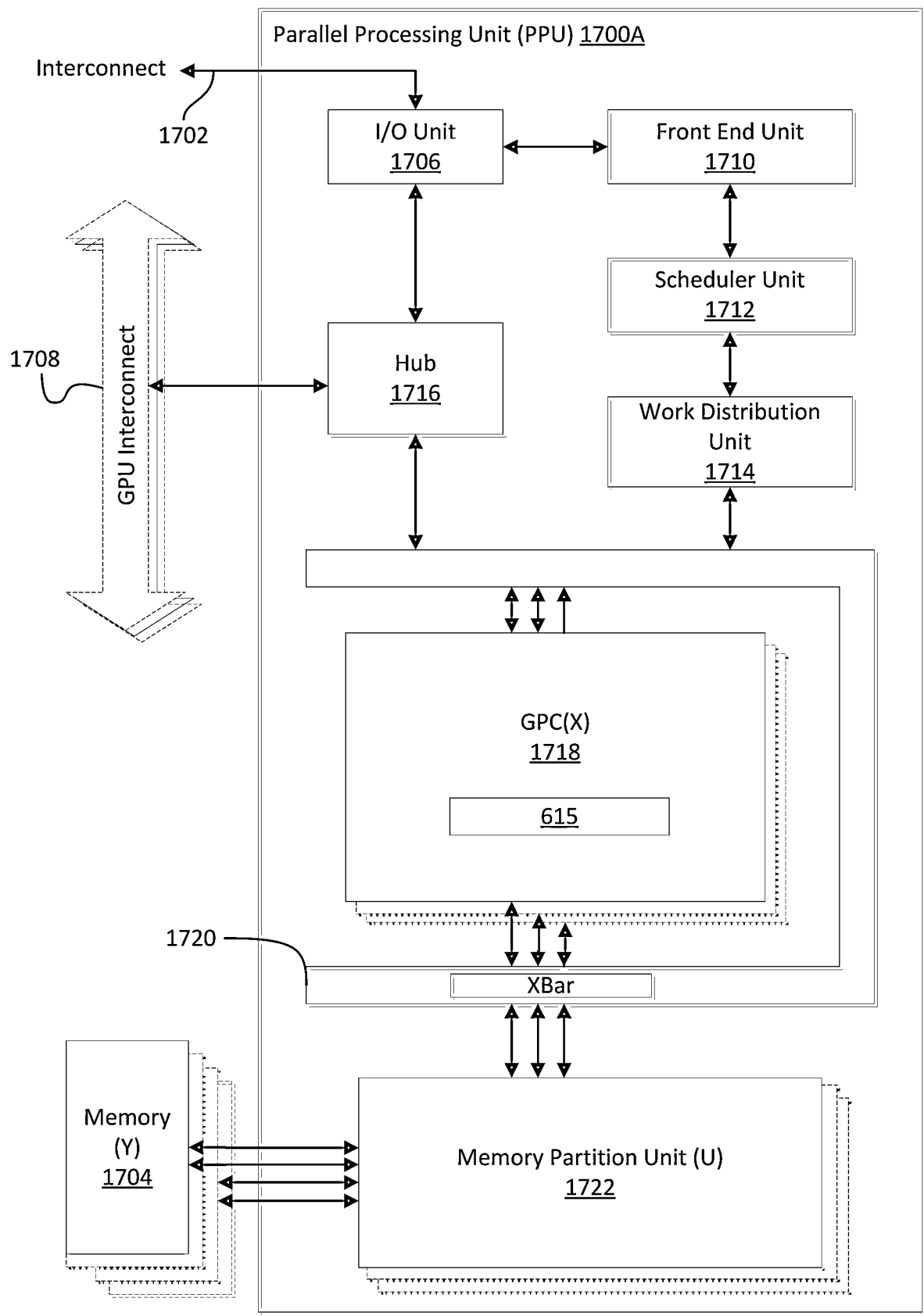
FIG. 17A illustrates a parallel processing unit, according to at least one embodiment.

FIG. 17A illustrates a parallel processing unit ("PPU") 1700A, according to at least one embodiment. In at least one embodiment, PPU 1700A is configured with machine-readable code that, if executed by PPU 1700A, causes PPU 1700A to perform some or all of processes and techniques described throughout this disclosure. In at least one embodiment, PPU 1700A is a multi-threaded processor that is implemented on one or more integrated circuit devices and that utilizes multithreading as a latency-hiding technique designed to process computer-readable instructions (also referred to as machine-readable instructions or simply instructions) on multiple threads in parallel. In at least one embodiment, a thread refers to a thread of execution and is an instantiation of a set of instructions configured to be executed by PPU 1700A. In at least one embodiment, PPU 1700A is a graphics processing unit ("GPU") configured to implement a graphics rendering pipeline for processing three-dimensional ("3D") graphics data in order to generate two-dimensional ("2D") image data for display on a display device such as a liquid crystal display ("LCD") device. In at least one embodiment, PPU 1700A is utilized to perform computations such as linear algebra operations and machine-learning operations. FIG. 17A illustrates an example parallel processor for illustrative purposes only and should be construed as a non-limiting example of processor architectures contemplated within scope of this disclosure and that any suitable processor may be employed to supplement and/or substitute for same.

In at least one embodiment, one or more PPUs 1700A are configured to accelerate High Performance Computing ("HPC"), datacenter, and machine learning applications. In at least one embodiment, PPU 1700A is configured to accelerate deep learning systems and applications including following non-limiting examples: autonomous vehicle platforms, deep learning, high-accuracy speech, image, text recognition systems, intelligent video analytics, molecular simulations, drug discovery, disease diagnosis, weather forecasting, big data analytics, astronomy, molecular dynamics simulation, financial modeling, robotics, factory automation, real-time language translation, online search optimizations, and personalized user recommendations, and more.

In at least one embodiment, PPU 1700A includes, without limitation, an Input/Output ("I/O") unit 1706, a front-end unit 1710, a scheduler unit 1712, a work distribution unit 1714, a hub 1716, a crossbar ("Xbar") 1720, one or more general processing clusters ("GPCs") 1718, and one or more partition units ("memory partition units") 1722. In at least one embodiment, PPU 1700A is connected to a host processor or other PPUs 1700A via one or more high-speed GPU interconnects ("GPU interconnects") 1708. In at least one embodiment, PPU 1700A is connected to a host processor or other peripheral devices via an interconnect 1702. In at least one embodiment, PPU 1700A is connected to a local memory comprising one or more memory devices ("memory") 1704. In at least one embodiment, memory devices 1704 include, without limitation, one or more dynamic random access memory ("DRAM") devices. In at least one embodiment, one or more DRAM devices are configured and/or configurable as high-bandwidth memory ("HBM") subsystems, with multiple DRAM dies stacked within each device.

In at least one embodiment, high-speed GPU interconnect 1708 may refer to a wire-based multi-lane communications link that is used by systems to scale and include one or more PPUs 1700A combined with one or more central processing units ("CPUs"), supports cache coherence between PPUs 1700A and CPUs, and CPU mastering. In at least one embodiment, data and/or commands are transmitted by high-speed GPU interconnect 1708 through hub 1716 to/from other units of PPU 1700A such as one or more copy engines, video encoders, video decoders, power management units, and other components which may not be explicitly illustrated in FIG. 17A.

In at least one embodiment, I/O unit 1706 is configured to transmit and receive communications (such as commands, data) from a host processor (not illustrated in FIG. 17A) over system bus 1702. In at least one embodiment, I/O unit 1706 communicates with host processor directly via system bus 1702 or through one or more intermediate devices such as a memory bridge. In at least one embodiment, I/O unit 1706 may communicate with one or more other processors, such as one or more of PPUs 1700A via system bus 1702. In at least one embodiment, I/O unit 1706 implements a Peripheral Component Interconnect Express ("PCIe") interface for communications over a PCIe bus. In at least one embodiment, I/O unit 1706 implements interfaces for communicating with external devices.

In at least one embodiment, I/O unit 1706 decodes packets received via system bus 1702. In at least one embodiment, at least some packets represent commands configured to cause PPU 1700A to perform various operations. In at least one embodiment, I/O unit 1706 transmits decoded commands to various other units of PPU 1700A as specified by commands. In at least one embodiment, commands are transmitted to front-end unit 1710 and/or transmitted to hub 1716 or other units of PPU 1700A such as one or more copy engines, a video encoder, a video decoder, a power management unit, etc. (not explicitly illustrated in FIG. 17A). In at least one embodiment, I/O unit 1706 is configured to route communications between and among various logical units of PPU 1700A.

In at least one embodiment, a program executed by host processor encodes a command stream in a buffer that provides workloads to PPU 1700A for processing. In at least one embodiment, a workload comprises instructions and data to be processed by those instructions. In at least one embodiment, buffer is a region in a memory that is accessible (such as read/write) by both host processor and PPU 1700A—a host interface unit may be configured to access buffer in a system memory connected to system bus 1702 via memory requests transmitted over system bus 1702 by I/O unit 1706. In at least one embodiment, host processor writes command stream to buffer and then transmits a pointer to start of command stream to PPU 1700A such that front-end unit 1710 receives pointers to one or more command streams and manages one or more command streams, reading commands from command streams and forwarding commands to various units of PPU 1700A.

In at least one embodiment, front-end unit 1710 is coupled to scheduler unit 1712 that configures various GPCs 1718 to process tasks defined by one or more command streams. In at least one embodiment, scheduler unit 1712 is configured to track state information related to various tasks managed by scheduler unit 1712 where state information may indicate which of GPCs 1718 a task is assigned to, whether task is active or inactive, a priority level associated with task, and so forth. In at least one embodiment, scheduler unit 1712 manages execution of a plurality of tasks on one or more of GPCs 1718.

In at least one embodiment, scheduler unit 1712 is coupled to work distribution unit 1714 that is configured to dispatch tasks for execution on GPCs 1718. In at least one embodiment, work distribution unit 1714 tracks a number of scheduled tasks received from scheduler unit 1712 and work distribution unit 1714 manages a pending task pool and an active task pool for each of GPCs 1718. In at least one embodiment, pending task pool comprises a number of slots (such as 32 slots) that contain tasks assigned to be processed by a particular GPC 1718; active task pool may comprise a number of slots (such as 4 slots) for tasks that are actively being processed by GPCs 1718 such that as one of GPCs 1718 completes execution of a task, that task is evicted from active task pool for GPC 1718 and one of other tasks from pending task pool is selected and scheduled for execution on GPC 1718. In at least one embodiment, if an active task is idle on GPC 1718, such as while waiting for a data dependency to be resolved, then active task is evicted from GPC 1718 and returned to pending task pool while another task in pending task pool is selected and scheduled for execution on GPC 1718.

In at least one embodiment, work distribution unit 1714 communicates with one or more GPCs 1718 via XBar 1720. In at least one embodiment, XBar 1720 is an interconnect network that couples many of units of PPU 1700A to other units of PPU 1700A and can be configured to couple work distribution unit 1714 to a particular GPC 1718. In at least one embodiment, one or more other units of PPU 1700A may also be connected to XBar 1720 via hub 1716.

In at least one embodiment, tasks are managed by scheduler unit 1712 and dispatched to one of GPCs 1718 by work distribution unit 1714. GPC 1718 is configured to process task and generate results. In at least one embodiment, results may be consumed by other tasks within GPC 1718, routed to a different GPC 1718 via XBar 1720, or stored in memory 1704. In at least one embodiment, results can be written to memory 1704 via partition units 1722, which implement a memory interface for reading and writing data to/from memory 1704. In at least one embodiment, results can be transmitted to another PPU 1704 or CPU via high-speed GPU interconnect 1708. In at least one embodiment, PPU 1700A includes, without limitation, a number U of partition units 1722 that is equal to number of separate and distinct memory devices 1704 coupled to PPU 1700A. In at least one embodiment, partition unit 1722 will be described in more detail below in conjunction with FIG. 17C.

In at least one embodiment, a host processor executes a driver kernel that implements an application programming interface ("API") that enables one or more applications executing on host processor to schedule operations for execution on PPU 1700A. In at least one embodiment, multiple compute applications are simultaneously executed by PPU 1700A and PPU 1700A provides isolation, quality of service ("QoS"), and independent address spaces for multiple compute applications. In at least one embodiment, an application generates instructions (such as in form of API calls) that cause driver kernel to generate one or more tasks for execution by PPU 1700A and driver kernel outputs tasks to one or more streams being processed by PPU 1700A. In at least one embodiment, each task comprises one or more groups of related threads, which may be referred to as a warp. In at least one embodiment, a warp comprises a plurality of related threads (such as 32 threads) that can be executed in parallel. In at least one embodiment, cooperating threads can refer to a plurality of threads including instructions to perform task and that exchange data through shared memory. In at least one embodiment, threads and cooperating threads are described in more detail, in accordance with at least one embodiment, in conjunction with FIG. 17C.

Inference and/or training logic 615 are used to perform inferencing and/or training operations associated with one or more embodiments. Details regarding inference and/or training logic 615 are provided below in conjunction with FIGS. 6B and/or 6C. In at least one embodiment, deep learning application processor is used to train a machine learning model, such as a neural network, to predict or infer information provided to PPU 1700A. In at least one embodiment, PPU 1700A is used to infer or predict information based on a trained machine learning model (such as neural network) that has been trained by another processor or system or by PPU 1700A. In at least one embodiment, PPU 1700A may be used to perform one or more neural network use cases described herein.

Figure 17B:
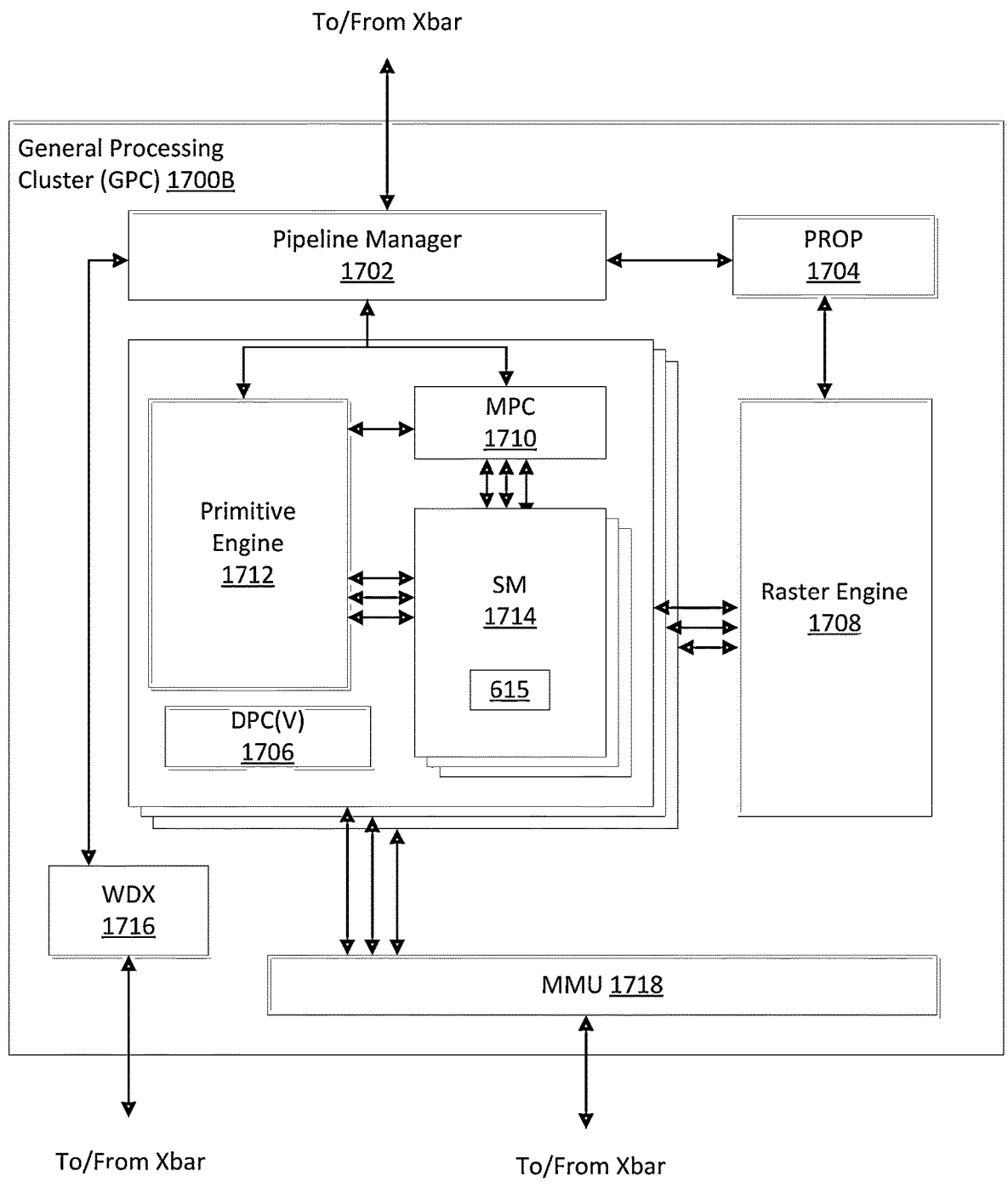
FIG. 17B illustrates a general processing cluster, according to at least one embodiment.

FIG. 17B illustrates a general processing cluster ("GPC") 1700B, according to at least one embodiment. In at least one embodiment, GPC 1700B is GPC 1718 of FIG. 17A. In at least one embodiment, each GPC 1700B includes, without limitation, a number of hardware units for processing tasks and each GPC 1700B includes, without limitation, a pipeline manager 1702, a pre-raster operations unit ("PROP") 1704, a raster engine 1708, a work distribution crossbar ("WDX") 1716, a memory management unit ("MMU") 1718, one or more Data Processing Clusters ("DPCs") 1706, and any suitable combination of parts.

In at least one embodiment, operation of GPC 1700B is controlled by pipeline manager 1702. In at least one embodiment, pipeline manager 1702 manages configuration of one or more DPCs 1706 for processing tasks allocated to GPC 1700B. In at least one embodiment, pipeline manager 1702 configures at least one of one or more DPCs 1706 to implement at least a portion of a graphics rendering pipeline. In at least one embodiment, DPC 1706 is configured to execute a vertex shader program on a programmable streaming multi-processor ("SM") 1714. In at least one embodiment, pipeline manager 1702 is configured to route packets received from a work distribution unit to appropriate logical units within GPC 1700B, in at least one embodiment, and some packets may be routed to fixed function hardware units in PROP 1704 and/or raster engine 1708 while other packets may be routed to DPCs 1706 for processing by a primitive engine 1712 or SM 1714. In at least one embodiment, pipeline manager 1702 configures at least one of DPCs 1706 to implement a neural network model and/or a computing pipeline.

In at least one embodiment, PROP unit 1704 is configured, in at least one embodiment, to route data generated by raster engine 1708 and DPCs 1706 to a Raster Operations ("ROP") unit in partition unit 1722, described in more detail above in conjunction with FIG. 17A. In at least one embodiment, PROP unit 1704 is configured to perform optimizations for color blending, organize pixel data, perform address translations, and more. In at least one embodiment, raster engine 1708 includes, without limitation, a number of fixed function hardware units configured to perform various raster operations, in at least one embodiment, and raster engine 1708 includes, without limitation, a setup engine, a coarse raster engine, a culling engine, a clipping engine, a fine raster engine, a tile coalescing engine, and any suitable combination thereof. In at least one embodiment, setup engine receives transformed vertices and generates plane equations associated with geometric primitive defined by vertices; plane equations are transmitted to coarse raster engine to generate coverage information (such as an x, y coverage mask for a tile) for primitive; output of coarse raster engine is transmitted to culling engine where fragments associated with primitive that fail a z-test are culled, and transmitted to a clipping engine where fragments lying outside a viewing frustum are clipped. In at least one embodiment, fragments that survive clipping and culling are passed to fine raster engine to generate attributes for pixel fragments based on plane equations generated by setup engine. In at least one embodiment, output of raster engine 1708 comprises fragments to be processed by any suitable entity such as by a fragment shader implemented within DPC 1706.

In at least one embodiment, each DPC 1706 included in GPC 1700B comprise, without limitation, an M-Pipe Controller ("MPC") 1710; primitive engine 1712; one or more SMs 1714; and any suitable combination thereof. In at least one embodiment, MPC 1710 controls operation of DPC 1706, routing packets received from pipeline manager 1702 to appropriate units in DPC 1706. In at least one embodiment, packets associated with a vertex are routed to primitive engine 1712, which is configured to fetch vertex attributes associated with vertex from memory; in contrast, packets associated with a shader program may be transmitted to SM 1714.

In at least one embodiment, SM 1714 comprises, without limitation, a programmable streaming processor that is configured to process tasks represented by a number of threads. In at least one embodiment, SM 1714 is multi-threaded and configured to execute a plurality of threads (such as 32 threads) from a particular group of threads concurrently and implements a Single-Instruction, Multiple-Data ("SIMD") architecture where each thread in a group of threads (such as a warp) is configured to process a different set of data based on same set of instructions. In at least one embodiment, all threads in group of threads execute same instructions. In at least one embodiment, SM 1714 implements a Single-Instruction, Multiple Thread ("SIMT") architecture wherein each thread in a group of threads is configured to process a different set of data based on same set of instructions, but where individual threads in group of threads are allowed to diverge during execution. In at least one embodiment, a program counter, call stack, and execution state is maintained for each warp, enabling concurrency between warps and serial execution within warps when threads within warp diverge. In another embodiment, a program counter, call stack, and execution state is maintained for each individual thread, enabling equal concurrency between all threads, within and between warps. In at least one embodiment, execution state is maintained for each individual thread and threads executing same instructions may be converged and executed in parallel for better efficiency. At least one embodiment of SM 1714 are described in more detail below.

In at least one embodiment, MMU 1718 provides an interface between GPC 1700B and memory partition unit (such as partition unit 1722 of FIG. 17A) and MMU 1718 provides translation of virtual addresses into physical addresses, memory protection, and arbitration of memory requests. In at least one embodiment, MMU 1718 provides one or more translation lookaside buffers ("TLBs") for performing translation of virtual addresses into physical addresses in memory.

Inference and/or training logic 615 are used to perform inferencing and/or training operations associated with one or more embodiments. Details regarding inference and/or training logic 615 are provided below in conjunction with FIGS. 6B and/or 6C. In at least one embodiment, deep learning application processor is used to train a machine learning model, such as a neural network, to predict or infer information provided to GPC 1700B. In at least one embodiment, GPC 1700B is used to infer or predict information based on a trained machine learning model (such as neural network) that has been trained by another processor or system or by GPC 1700B. In at least one embodiment, GPC 1700B may be used to perform one or more neural network use cases described herein.

Figure 17C:
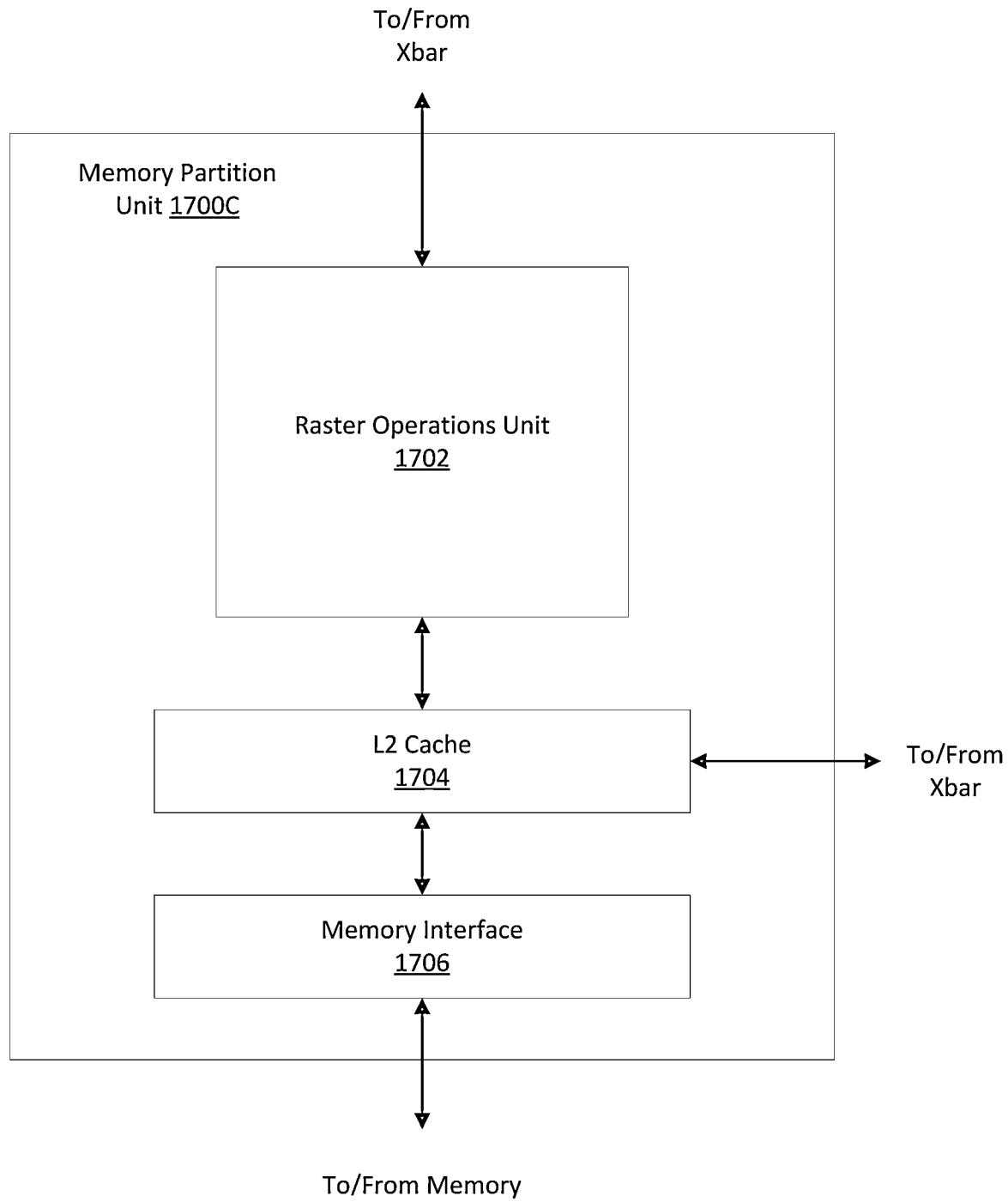
FIG. 17C illustrates a memory partition unit of a parallel processing unit, in accordance with at least one embodiment.

FIG. 17C illustrates a memory partition unit 1700C of a parallel processing unit ("PPU"), in accordance with at least one embodiment. In at least one embodiment, memory partition unit 1700C includes, without limitation, a Raster Operations ("ROP") unit 1702; a level two ("L2") cache 1704; a memory interface 1706; and any suitable combination thereof. In at least one embodiment, memory interface 1706 is coupled to memory. In at least one embodiment, memory interface 1706 may implement 32, 64, 128, 1024-bit data buses, or similar implementations, for high-speed data transfer. In at least one embodiment, PPU incorporates U memory interfaces 1706, one memory interface 1706 per pair of partition units 1700C, where each pair of partition units 1700C is connected to a corresponding memory device. In at least one embodiment, in at least one embodiment, PPU may be connected to up to Y memory devices, such as high bandwidth memory stacks or graphics double-data-rate, version 5, synchronous dynamic random a17ess memory ("GDDR5 SDRAM").

In at least one embodiment, memory interface 1706 implements a high bandwidth memory second generation ("HBM2") memory interface and Y equals half U. In at least one embodiment, HBM2 memory stacks are located on same physical package as PPU, providing substantial power and area savings compared with GDDR5 SDRAM systems. In at least one embodiment, each HBM2 stack includes, without limitation, four memory dies and Y equals 4, with each HBM2 stack including two 128-bit channels per die for a total of 8 channels and a data bus width of 1024 bits. In at least one embodiment, memory supports Single-Error Correcting Double-Error Detecting ("SECDED") Error Correction Code ("ECC") to protect data. In at least one embodiment, ECC provides higher reliability for compute applications that are sensitive to data corruption.

In at least one embodiment, PPU implements a multi-level memory hierarchy. In at least one embodiment, memory partition unit 1700C supports a unified memory to provide a single unified virtual address space for central processing unit ("CPU") and PPU memory, enabling data sharing between virtual memory systems. In at least one embodiment, frequency of accesses by a PPU to memory located on other processors is traced to ensure that memory pages are moved to physical memory of PPU that is accessing pages more frequently. In at least one embodiment, high-speed GPU interconnect 1708 supports address translation services allowing PPU to directly access a CPU's page tables and providing full access to CPU memory by PPU.

In at least one embodiment, copy engines transfer data between multiple PPUs or between PPUs and CPUs. In at least one embodiment, copy engines can generate page faults for addresses that are not mapped into page tables and memory partition unit 1700C then services page faults, mapping addresses into page table, after which copy engine performs transfer. In at least one embodiment, memory is pinned (in at least one embodiment, non-pageable) for multiple copy engine operations between multiple processors, substantially reducing available memory. In at least one embodiment, with hardware page faulting, addresses can be passed to copy engines without regard as to whether memory pages are resident, and copy process is transparent.

Data from memory 1704 of FIG. 17A or other system memory is fetched by memory partition unit 1700C and stored in L2 cache 1704, which is located on-chip and is shared between various GPCs, in accordance with at least one embodiment. Each memory partition unit 1700C, in at least one embodiment, includes, without limitation, at least a portion of L2 cache associated with a corresponding memory device. In at least one embodiment, lower level caches are implemented in various units within GPCs. In at least one embodiment, each of SMs 1714 may implement a level one ("L1") cache wherein L1 cache is private memory that is dedicated to a particular SM 1714 and data from L2 cache 1704 is fetched and stored in each of L1 caches for processing in functional units of SMs 1714. In at least one embodiment, L2 cache 1704 is coupled to memory interface 1706 and XBar 1720.

ROP unit 1702 performs graphics raster operations related to pixel color, such as color compression, pixel blending, and more, in at least one embodiment. ROP unit 1702, in at least one embodiment, implements depth testing in conjunction with raster engine 1708, receiving a depth for a sample location associated with a pixel fragment from culling engine of raster engine 1708. In at least one embodiment, depth is tested against a corresponding depth in a depth buffer for a sample location associated with fragment. In at least one embodiment, if fragment passes depth test for sample location, then ROP unit 1702 updates depth buffer and transmits a result of depth test to raster engine 1708. It will be appreciated that number of partition units 1700C may be different than number of GPCs and, therefore, each ROP unit 1702 can, in at least one embodiment, be coupled to each of GPCs. In at least one embodiment, ROP unit 1702 tracks packets received from different GPCs and determines which that a result generated by ROP unit 1702 is routed to through XBar 1720.

Figure 17D:
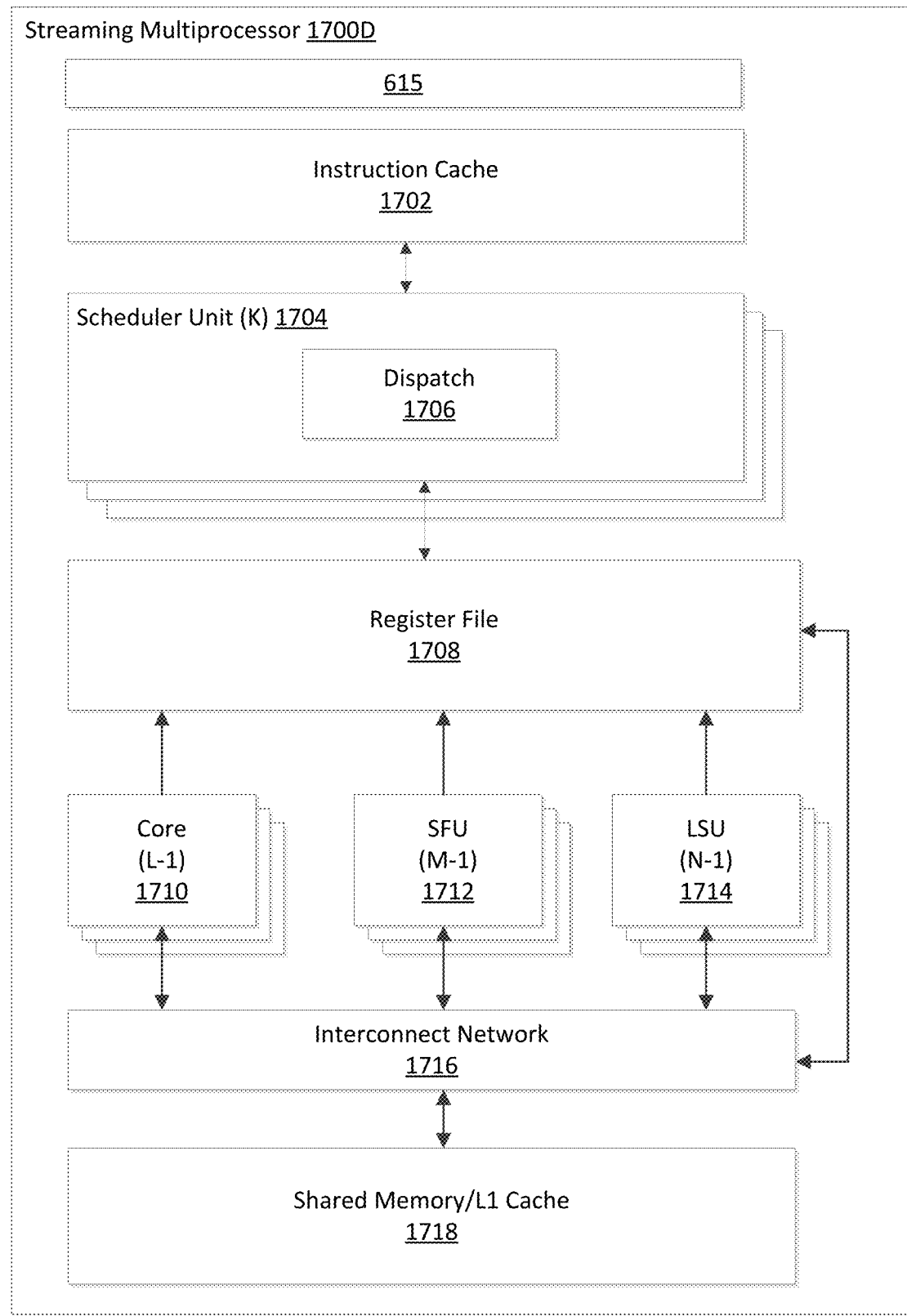
FIG. 17D illustrates a streaming multi-processor, according to at least one embodiment.

FIG. 17D illustrates a streaming multi-processor ("SM") 1700D, according to at least one embodiment. In at least one embodiment, SM 1700D is SM 1714 of FIG. 17B. In at least one embodiment, SM 1700D includes, without limitation, an instruction cache 1702; one or more scheduler units 1704; a register file 1708; one or more processing cores ("cores") 1710; one or more special function units ("SFUs") 1712; one or more load/store units ("LSUs") 1714; an interconnect network 1716; a shared memory/level one ("L1") cache 1718; and any suitable combination thereof. In at least one embodiment, a work distribution unit dispatches tasks for execution on general processing clusters ("GPCs") of parallel processing units ("PPUs") and each task is allocated to a particular Data Processing Cluster ("DPC") within a GPC and, if task is associated with a shader program, task is allocated to one of SMs 1700D. In at least one embodiment, scheduler unit 1704 receives tasks from work distribution unit and manages instruction scheduling for one or more thread blocks assigned to SM 1700D. In at least one embodiment, scheduler unit 1704 schedules thread blocks for execution as warps of parallel threads, wherein each thread block is allocated at least one warp. In at least one embodiment, each warp executes threads. In at least one embodiment, scheduler unit 1704 manages a plurality of different thread blocks, allocating warps to different thread blocks and then dispatching instructions from plurality of different cooperative groups to various functional units (such as processing cores 1710, SFUs 1712, and LSUs 1714) during each clock cycle.

In at least one embodiment, Cooperative Groups may refer to a programming model for organizing groups of communicating threads that allows developers to express granularity at which threads are communicating, enabling expression of richer, more efficient parallel decompositions. In at least one embodiment, cooperative launch APIs support synchronization amongst thread blocks for execution of parallel algorithms. In at least one embodiment, applications of programming models provide a single, simple construct for synchronizing cooperating threads: a barrier across all threads of a thread block (such as syncthreads( ) function). However, in at least one embodiment, programmers may define groups of threads at smaller than thread block granularities and synchronize within defined groups to enable greater performance, design flexibility, and software reuse in form of collective group-wide function interfaces. In at least one embodiment, Cooperative Groups enables programmers to define groups of threads explicitly at sub-block (in at least one embodiment, as small as a single thread) and multi-block granularities, and to perform collective operations such as synchronization on threads in a cooperative group. In at least one embodiment, programming model supports clean composition across software boundaries, so that libraries and utility functions can synchronize safely within their local context without having to make assumptions about convergence. In at least one embodiment, Cooperative Groups primitives enable new patterns of cooperative parallelism, including, without limitation, producer-consumer parallelism, opportunistic parallelism, and global synchronization across an entire grid of thread blocks.

In at least one embodiment, a dispatch unit 1706 is configured to transmit instructions to one or more of functional units and scheduler unit 1704 includes, without limitation, two dispatch units 1706 that enable two different instructions from same warp to be dispatched during each clock cycle. In at least one embodiment, each scheduler unit 1704 includes a single dispatch unit 1706 or additional dispatch units 1706.

In at least one embodiment, each SM 1700D, in at least one embodiment, includes, without limitation, register file 1708 that provides a set of registers for functional units of SM 1700D. In at least one embodiment, register file 1708 is divided between each of functional units such that each functional unit is allocated a dedicated portion of register file 1708. In at least one embodiment, register file 1708 is divided between different warps being executed by SM 1700D and register file 1708 provides temporary storage for operands connected to data paths of functional units. In at least one embodiment, each SM 1700D comprises, without limitation, a plurality of L processing cores 1710. In at least one embodiment, SM 1700D includes, without limitation, a large number (such as 128 or more) of distinct processing cores 1710. In at least one embodiment, each processing core 1710, in at least one embodiment, includes, without limitation, a fully-pipelined, single-precision, double-precision, and/or mixed precision processing unit that includes, without limitation, a floating point arithmetic logic unit and an integer arithmetic logic unit. In at least one embodiment, floating point arithmetic logic units implement IEEE 754-2008 standard for floating point arithmetic. In at least one embodiment, processing cores 1710 include, without limitation, 64 single-precision (32-bit) floating point cores, 64 integer cores, 32 double-precision (64-bit) floating point cores, and 8 tensor cores.

Tensor cores are configured to perform matrix operations in accordance with at least one embodiment. In at least one embodiment, one or more tensor cores are included in processing cores 1710. In at least one embodiment, tensor cores are configured to perform deep learning matrix arithmetic, such as convolution operations for neural network training and inferencing. In at least one embodiment, each tensor core operates on a 4×4 matrix and performs a matrix multiply and accumulate operation $D=A\times B+C$, where A, B, C, and D are 4×4 matrices.

In at least one embodiment, matrix multiply inputs A and B are 16-bit floating point matrices and accumulation matrices C and D are 16-bit floating point or 32-bit floating point matrices. In at least one embodiment, tensor cores operate on 16-bit floating point input data with 32-bit floating point accumulation. In at least one embodiment, 16-bit floating point multiply uses 64 operations and results in a full precision product that is then accumulated using 32-bit floating point addition with other intermediate products for a 4×4×4 matrix multiply. Tensor cores are used to perform much larger two-dimensional or higher dimensional matrix operations, built up from these smaller elements, in at least one embodiment. In at least one embodiment, an API, such as CUDA 9 C++ API, exposes specialized matrix load, matrix multiply and accumulate, and matrix store operations to efficiently use tensor cores from a CUDA-C++ program. In at least one embodiment, at CUDA level, warp-level interface assumes 16×16 size matrices spanning all 32 threads of warp.

In at least one embodiment, each SM 1700D comprises, without limitation, M SFUs 1712 that perform special functions (such as attribute evaluation, reciprocal square root, etc.). In at least one embodiment, SFUs 1712 include, without limitation, a tree traversal unit configured to traverse a hierarchical tree data structure. In at least one embodiment, SFUs 1712 include, without limitation, a texture unit configured to perform texture map filtering operations. In at least one embodiment, texture units are configured to load texture maps (such as a 2D array of texels) from memory and sample texture maps to produce sampled texture values for use in shader programs executed by SM 1700D. In at least one embodiment, texture maps are stored in shared memory/L1 cache 1718. In at least one embodiment, texture units implement texture operations such as filtering operations using mip-maps (such as texture maps of varying levels of detail), in accordance with at least one embodiment. In at least one embodiment, each SM 1700D includes, without limitation, two texture units.

Each SM 1700D comprises, without limitation, N LSUs 1714 that implement load and store operations between shared memory/L1 cache 1718 and register file 1708, in at least one embodiment. Each SM 1700D includes, without limitation, interconnect network 1716 that connects each of functional units to register file 1708 and LSU 1714 to register file 1708 and shared memory/L1 cache 1718 in at least one embodiment. In at least one embodiment, interconnect network 1716 is a crossbar that can be configured to connect any of functional units to any of registers in register file 1708 and connect LSUs 1714 to register file 1708 and memory locations in shared memory/L1 cache 1718.

In at least one embodiment, shared memory/L1 cache 1718 is an array of on-chip memory that allows for data storage and communication between SM 1700D and primitive engine and between threads in SM 1700D, in at least one embodiment. In at least one embodiment, shared memory/L1 cache 1718 comprises, without limitation, 128 KB of storage capacity and is in path from SM 1700D to partition unit. In at least one embodiment, shared memory/L1 cache 1718, in at least one embodiment, is used to cache reads and writes. In at least one embodiment, one or more of shared memory/L1 cache 1718, L2 cache, and memory are backing stores.

Combining data cache and shared memory functionality into a single memory block provides improved performance for both types of memory accesses, in at least one embodiment. In at least one embodiment, capacity is used or is usable as a cache by programs that do not use shared memory, such as if shared memory is configured to use half of capacity, texture and load/store operations can use remaining capacity. Integration within shared memory/L1 cache 1718 enables shared memory/L1 cache 1718 to function as a high-throughput conduit for streaming data while simultaneously providing high-bandwidth and low-latency access to frequently reused data, in accordance with at least one embodiment. In at least one embodiment, when configured for general purpose parallel computation, a simpler configuration can be used compared with graphics processing. In at least one embodiment, fixed function graphics processing units are bypassed, creating a much simpler programming model. In general purpose parallel computation configuration, work distribution unit assigns and distributes blocks of threads directly to DPCs, in at least one embodiment. In at least one embodiment, threads in a block execute same program, using a unique thread ID in calculation to ensure each thread generates unique results, using SM 1700D to execute program and perform calculations, shared memory/L1 cache 1718 to communicate between threads, and LSU 1714 to read and write global memory through shared memory/L1 cache 1718 and memory partition unit. In at least one embodiment, when configured for general purpose parallel computation, SM 1700D writes commands that scheduler unit 1704 can use to launch new work on DPCs.

In at least one embodiment, PPU is included in or coupled to a desktop computer, a laptop computer, a tablet computer, servers, supercomputers, a smart-phone (such as a wireless, hand-held device), personal digital assistant ("PDA"), a digital camera, a vehicle, a head mounted display, a hand-held electronic device, and more. In at least one embodiment, PPU is embodied on a single semiconductor substrate. In at least one embodiment, PPU is included in a system-on-a-chip ("SoC") along with one or more other devices such as additional PPUs, memory, a reduced instruction set computer ("RISC") CPU, a memory management unit ("MMU"), a digital-to-analog converter ("DAC"), and like.

In at least one embodiment, PPU may be included on a graphics card that includes one or more memory devices. A graphics card may be configured to interface with a PCIe slot on a motherboard of a desktop computer. In at least one embodiment, PPU may be an integrated graphics processing unit ("iGPU") included in chipset of motherboard.

Inference and/or training logic 615 are used to perform inferencing and/or training operations associated with one or more embodiments. Details regarding inference and/or training logic 615 are provided below in conjunction with FIGS. 6B and/or 6C. In at least one embodiment, deep learning application processor is used to train a machine learning model, such as a neural network, to predict or infer information provided to SM 1700D. In at least one embodiment, SM 1700D is used to infer or predict information based on a trained machine learning model (such as neural network) that has been trained by another processor or system or by SM 1700D. In at least one embodiment, SM 1700D may be used to perform one or more neural network use cases described herein.

In at least one embodiment, a single semiconductor platform may refer to a sole unitary semiconductor-based integrated circuit or chip. In at least one embodiment, multi-chip modules may be used with increased connectivity which simulate on-chip operation, and make substantial improvements over utilizing a central processing unit ("CPU") and bus implementation. In at least one embodiment, various modules may also be situated separately or in various combinations of semiconductor platforms per desires of user.

In at least one embodiment, computer programs in form of machine-readable executable code or computer control logic algorithms are stored in main memory 804 and/or secondary storage. Computer programs, if executed by one or more processors, enable system 800 to perform various functions in accordance with at least one embodiment. In at least one embodiment, memory 804, storage, and/or any other storage are possible examples of computer-readable media. In at least one embodiment, secondary storage may refer to any suitable storage device or system such as a hard disk drive and/or a removable storage drive, representing a floppy disk drive, a magnetic tape drive, a compact disk drive, digital versatile disk ("DVD") drive, recording device, universal serial bus ("USB") flash memory, etc. In at least one embodiment, architecture and/or functionality of various previous figures are implemented in context of CPU 802; parallel processing system 812; an integrated circuit capable of at least a portion of capabilities of both CPU 802; parallel processing system 812; a chipset (such as a group of integrated circuits designed to work and sold as a unit for performing related functions, etc.); and any suitable combination of integrated circuit(s).

In at least one embodiment, architecture and/or functionality of various previous figures are implemented in context of a general computer system, a circuit board system, a game console system dedicated for entertainment purposes, an application-specific system, and more. In at least one embodiment, computer system 800 may take form of a desktop computer, a laptop computer, a tablet computer, servers, supercomputers, a smart-phone (such as a wireless, hand-held device), personal digital assistant ("PDA"), a digital camera, a vehicle, a head mounted display, a hand-held electronic device, a mobile phone device, a television, workstation, game consoles, embedded system, and/or any other type of logic.

In at least one embodiment, parallel processing system 812 includes, without limitation, a plurality of parallel processing units ("PPUs") 814 and associated memories 816. In at least one embodiment, PPUs 814 are connected to a host processor or other peripheral devices via an interconnect 818 and a switch 820 or multiplexer. In at least one embodiment, parallel processing system 812 distributes computational tasks across PPUs 814 which can be parallelizable—for example, as part of distribution of computational tasks across multiple graphics processing unit ("GPU") thread blocks. In at least one embodiment, memory is shared and accessible (such as for read and/or write access) across some or all of PPUs 814, although such shared memory may incur performance penalties relative to use of local memory and registers resident to a PPU 814. In at least one embodiment, operation of PPUs 814 is synchronized through use of a command such as _syncthreads( ), wherein all threads in a block (such as executed across multiple PPUs 814) to reach a certain point of execution of code before proceeding.

Other variations are within spirit of present disclosure. Thus, while disclosed techniques are susceptible to various modifications and alternative constructions, certain illustrated embodiments thereof are shown in drawings and have been described above in detail. It should be understood, however, that there is no intention to limit disclosure to specific form or forms disclosed, but on contrary, intention is to cover all modifications, alternative constructions, and equivalents falling within spirit and scope of disclosure, as defined in appended claims.

Use of terms "a" and "an" and "the" and similar referents in context of describing disclosed embodiments (especially in context of following claims) are to be construed to cover both singular and plural, unless otherwise indicated herein or clearly contradicted by context, and not as a definition of a term. Terms "including," "having," "including," and "containing" are to be construed as open-ended terms (meaning "including, but not limited to,") unless otherwise noted. Term "connected," when unmodified and referring to physical connections, is to be construed as partly or wholly contained within, attached to, or joined together, even if there is something intervening. Recitation of ranges of values herein are merely intended to serve as a shorthand method of referring individually to each separate value falling within range, unless otherwise indicated herein and each separate value is incorporated into specification as if it were individually recited herein. Use of a set (such as a set of items) or subset, unless otherwise noted or contradicted by context, is to be construed as a nonempty collection including one or more members. Further, unless otherwise noted or contradicted by context, a subset of a corresponding set does not necessarily denote a proper subset of corresponding set, but subset and corresponding set may be equal.

Conjunctive language, such as phrases of form "at least one of A, B, and C," or "at least one of A, B and C," unless specifically stated otherwise or otherwise clearly contradicted by context, is otherwise understood with context as used in general to present that an item, term, etc., may be either A or B or C, or any nonempty subset of set of A and B and C. For instance, in illustrative example of a set having three members, conjunctive phrases "at least one of A, B, and C" and "at least one of A, B and C" refer to any of following sets: {A}, {B}, {C}, {A, B}, {A, C}, {B, C}, {A, B, C}. Thus, such conjunctive language may not be intended to imply that certain embodiments require at least one of A, at least one of B, and at least one of C each to be present. In addition, unless otherwise noted or contradicted by context, a plurality indicates a state of being plural (such as a plurality of items indicates multiple items). A plurality is at least two items, but can be more when so indicated either explicitly or by context. Further, unless stated otherwise or otherwise clear from context, based on means based at least in part on and not based solely on.

Operations of processes described herein can be performed in any suitable order unless otherwise indicated herein or otherwise clearly contradicted by context. In at least one embodiment, a process such as those processes described herein (or variations and/or combinations thereof) is performed under control of one or more computer systems configured with executable instructions and is implemented as code (such as executable instructions, one or more computer programs or one or more applications) executing collectively on one or more processors, by hardware or combinations thereof. In at least one embodiment, code is stored on a computer-readable storage medium, for example, in form of a computer program including a plurality of instructions executable by one or more processors. In at least one embodiment, a computer-readable storage medium is a non-transitory computer-readable storage medium that excludes transitory signals (such as a propagating transient electric or electromagnetic transmission) but includes non-transitory data storage circuitry (such as buffers, cache, and queues) within transceivers of transitory signals. In at least one embodiment, code (such as executable code or source code) is stored on a set of one or more non-transitory computer-readable storage media having stored thereon executable instructions (or other memory to store executable instructions) that, when executed (in at least one embodiment, as a result of being executed) by one or more processors of a computer system, cause computer system to perform operations described herein. A set of non-transitory computer-readable storage media, in at least one embodiment, includes multiple non-transitory computer-readable storage media and one or more of individual non-transitory storage media of multiple non-transitory computer-readable storage media lack all of code while multiple non-transitory computer-readable storage media collectively store all of code. In at least one embodiment, executable instructions are executed such that different instructions are executed by different processors—for example, a non-transitory computer-readable storage medium store instructions and a main central processing unit ("CPU") executes some of instructions while a graphics processing unit ("GPU") executes other instructions. In at least one embodiment, different components of a computer system have separate processors and different processors execute different subsets of instructions.

Accordingly, in at least one embodiment, computer systems are configured to implement one or more services that singly or collectively perform operations of processes described herein and such computer systems are configured with applicable hardware and/or software that enable performance of operations. Further, a computer system that implements at least one embodiment of present disclosure is a single device and, in another embodiment, is a distributed computer system including multiple devices that operate differently such that distributed computer system performs operations described herein and such that a single device does not perform all operations.

Use of any and all examples, or exemplary language (such as "such as") provided herein, is intended merely to better illuminate embodiments of disclosure and does not pose a limitation on scope of disclosure unless otherwise claimed. No language in specification should be construed as indicating any non-claimed element as essential to practice of disclosure.

All references, including publications, patent applications, and patents, cited herein are hereby incorporated by reference to same extent as if each reference were individually and specifically indicated to be incorporated by reference and were set forth in its entirety herein.

In description and claims, terms "coupled" and "connected," along with their derivatives, may be used. It should be understood that these terms may be not intended as synonyms for each other. Rather, in particular examples, "connected" or "coupled" may be used to indicate that two or more elements are in direct or indirect physical or electrical contact with each other. "Coupled" may also mean that two or more elements are not in direct contact with each other, but yet still co-operate or interact with each other.

Unless specifically stated otherwise, it may be appreciated that throughout specification, references to processing, computing, calculating, determining, or the like, refer to action and/or processes of a computer or computing system, or similar electronic computing device, that manipulate and/or transform data represented as physical, such as electronic, quantities within computing system's registers and/or memories into other data similarly represented as physical quantities within computing system's memories, registers or other such information storage, transmission or display devices.

In a similar manner, a processor may refer to any device or portion of a device that processes electronic data from registers and/or memory and transform that electronic data into other electronic data that may be stored in registers and/or memory. As non-limiting examples, "processor" may be a CPU or a GPU. A "computing platform" may include one or more processors. As used herein, "software" processes may include, for example, software and/or hardware entities that perform work over time, such as tasks, threads, and intelligent agents. Also, each process may refer to multiple processes, for carrying out instructions in sequence or in parallel, continuously or intermittently. Terms "system" and "method" are used herein interchangeably insofar as system may embody one or more methods and methods may be considered a system.

In present document, references may be made to obtaining, acquiring, receiving, or inputting analog or digital data into a subsystem, computer system, or computer-implemented machine. Obtaining, acquiring, receiving, or inputting analog and digital data can be accomplished in a variety of ways such as by receiving data as a parameter of a function call or a call to an application programming interface. In some implementations, process of obtaining, acquiring, receiving, or inputting analog or digital data can be accomplished by transferring data via a serial or parallel interface. In another implementation, process of obtaining, acquiring, receiving, or inputting analog or digital data can be accomplished by transferring data via a computer network from providing entity to acquiring entity. References may also be made to providing, outputting, transmitting, sending, or presenting analog or digital data. In various examples, process of providing, outputting, transmitting, sending, or presenting analog or digital data can be accomplished by transferring data as an input or output parameter of a function call, a parameter of an application programming interface or interprocess communication mechanism.

Although discussion above sets forth example implementations of described techniques, other architectures may be used to implement described functionality, and are intended to be within scope of this disclosure. Furthermore, although specific distributions of responsibilities are defined above for purposes of discussion, various functions and responsibilities might be distributed and divided in different ways, depending on circumstances.

Furthermore, although subject matter has been described in language specific to structural features and/or methodological acts, it is to be understood that subject matter claimed in appended claims is not necessarily limited to specific features or acts described. Rather, specific features and acts are disclosed as exemplary forms of implementing the claims.

What is claimed is:

1. At least one processor for a liquid cooling system, comprising:
   at least one logic unit to train one or more neural networks having hidden layers of neurons to evaluate parameter values associated with at least one parameter of the liquid cooling system, the evaluation performed using the parameter values and using prior associated flow rates for a coolant and prior associated power states for at least one computing component, the evaluation to determine a moving range for the at least one parameter that is outside a normal threshold and that is indicative of a threshold leak of the coolant has occurred, the threshold leak associated with the at least one computing component functioning within a normal temperature threshold and receiving the coolant, and the one or more neural network to provide outputs associated with a first change in a power state for the at least one computing component to reduce reliance on the coolant and associated with a second change to a flow of the coolant to the at least one computing component.

2. The at least one processor of claim 1, further comprising:
  a learning subsystem of the at least one logic unit executing a machine learning model to:
  process parameter values associated with the at least one parameter using the prior associated flow rates for the coolant and the prior associated power states for the at least one computing component; and
  provide inputs after an evaluation of the parameter values with the prior associated flow rates for the coolant and the prior associated power states.

3. The at least one processor of claim 1, further comprising:
  the at least one logic unit to output at least one instruction associated with the first change and the second change of the power state and of the flow of the coolant, respectively.

4. The at least one processor of claim 1, further comprising:
  an instruction output to communicate the outputs from a learning subsystem executing the one or more neural networks to cause the first change in the power state for the at least one computing component and to cause the second change to the flow of the coolant to the at least one computing component.

5. The at least one processor of claim 1, further comprising:
  the at least one logic unit adapted to receive a parameter value from a parameter sensor associated with the liquid cooling system and to receive function information from a function sensor of the at least one computing device, and adapted to facilitate the first change and the second change to the power state and the flow of the coolant, respectively.

6. A remediation system for threshold leaks in a liquid cooling system, comprising:
  at least one processor to train one or more neural networks having hidden layers of neurons to evaluate parameter values associated with at least one parameter of the liquid cooling system, the evaluation performed using the parameter values and using prior associated flow rates for a coolant and prior associated power states for at least one computing component, the evaluation to determine a moving range for the at least one parameter that is outside a normal threshold and that is indicative of a threshold leak of the coolant has occurred, the threshold leak associated with the at least one computing component functioning within a normal temperature threshold and receiving the coolant, and the one or more neural networks to provide outputs associated with a first change in a power state for the at least one computing component to reduce reliance on the coolant and associated with a second change to a flow of the coolant to the at least one computing component.

7. The remediation system of claim 6, further comprising:
  a learning subsystem of the at least one processor executing a machine learning model to:
  process parameter values associated with the at least one parameter using the prior associated flow rates for the coolant and the prior associated power states for the at least one computing component; and
  provide inputs after an evaluation of the parameter values with the prior associated flow rates for the coolant and the prior associated power states.

8. The remediation system of claim 6, further comprising:
  at least an instruction to communicate the outputs from a learning subsystem executing the one or more neural networks to cause the first change in the power state for the at least one computing component and to cause the second change to the flow of the coolant to the at least one computing component.

9. The remediation system of claim 6, further comprising:
  the at least one processor to output at least one instruction associated with the first change and the second change of the power state and of the flow of the coolant, respectively.

10. The remediation system of claim 6, further comprising:
  the at least one processor adapted to receive a parameter value from a parameter sensor associated with the liquid cooling system and to receive function information from a function sensor of the at least one computing device, and adapted to facilitate the first change and the second change to the power state and the flow of the coolant, respectively.

* * * * *